(12) United States Patent
Tobitsuka et al.

(10) Patent No.: US 9,515,023 B2
(45) Date of Patent: Dec. 6, 2016

(54) MULTILEVEL CONTACT TO A 3D MEMORY ARRAY AND METHOD OF MAKING THEREOF

(71) Applicant: SANDISK 3D LLC, Milpitas, CA (US)

(72) Inventors: Toshihide Tobitsuka, Yokkaichi (JP); Seje Takaki, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/643,211

(22) Filed: Mar. 10, 2015

(65) Prior Publication Data

US 2015/0179577 A1   Jun. 25, 2015

Related U.S. Application Data

(63) Continuation-in-part of application No. 14/136,103, filed on Dec. 20, 2013.

(51) Int. Cl.
*H01L 23/535* (2006.01)
*H01L 21/768* (2006.01)
(Continued)

(52) U.S. Cl.
CPC ........ *H01L 23/535* (2013.01); *H01L 21/76895* (2013.01); *H01L 27/1157* (2013.01); *H01L 27/11548* (2013.01); *H01L 27/11556* (2013.01);
(Continued)

(58) Field of Classification Search
CPC ............. H01L 2924/0002; H01L 27/11582; H01L 2924/00; H01L 27/11556; H01L 27/11578; H01L 27/0688
USPC .................................. 257/2, 5, 314, E21.209
See application file for complete search history.

(56) References Cited

U.S. PATENT DOCUMENTS

| 5,915,167 A | 6/1999 | Leedy |
| 8,187,932 B2 | 5/2012 | Nguyen et al. |

(Continued)

FOREIGN PATENT DOCUMENTS

| KR | 20100109745 A | 10/2010 |
| KR | 20110021444 A | 3/2011 |

OTHER PUBLICATIONS

Invitation to Pay Additional Fees and Search Report from the European Patent Office received in connection with International Application No. PCT/US2014/071397; dtd Mar. 26, 2015.

(Continued)

*Primary Examiner* — David Vu
*Assistant Examiner* — Jonathan Han
(74) *Attorney, Agent, or Firm* — The Marbury Law Group PLLC

(57) ABSTRACT

A multi-level device includes at least one device region and at least one contact region. The contact region has a stack of alternating plurality of electrically conductive layers and plurality of electrically insulating layers located over a substrate. The plurality of electrically conductive layers form a stepped pattern in the contact region, where each respective electrically insulating layer includes a sidewall and a respective underlying electrically conductive layer in the stack extends laterally beyond the sidewall. Optionally, a plurality of electrically conductive via connections can be formed, which have top surfaces within a same horizontal plane, have bottom surfaces contacting a respective electrically conductive layer located at different levels, and are isolated from one another by at least one trench isolation structure.

35 Claims, 51 Drawing Sheets

(51) Int. Cl.
  *H01L 27/115* (2006.01)
  *H01L 27/24* (2006.01)
(52) U.S. Cl.
  CPC ... *H01L 27/11573* (2013.01); *H01L 27/11575* (2013.01); *H01L 27/11578* (2013.01); *H01L 27/11582* (2013.01); *H01L 27/2481* (2013.01); *H01L 27/249* (2013.01); *H01L 2924/0002* (2013.01)

(56) References Cited

U.S. PATENT DOCUMENTS

| | | | | |
|---|---|---|---|---|
| 8,394,716 | B2* | 3/2013 | Hwang | H01L 27/11551 257/315 |
| 8,520,425 | B2 | 8/2013 | Xiao et al. | |
| 2008/0149913 | A1* | 6/2008 | Tanaka | H01L 27/2454 257/5 |
| 2009/0230449 | A1* | 9/2009 | Sakaguchi | H01L 27/0688 257/298 |
| 2010/0090188 | A1* | 4/2010 | Futatsuyama | H01L 27/0688 257/2 |
| 2010/0254191 | A1 | 10/2010 | Son et al. | |
| 2012/0147648 | A1 | 6/2012 | Scheuerlein | |
| 2012/0195128 | A1 | 8/2012 | Fujiwara et al. | |
| 2012/0256247 | A1* | 10/2012 | Alsmeier | H01L 21/764 257/319 |
| 2013/0270714 | A1* | 10/2013 | Lee | H01L 21/76802 257/774 |

OTHER PUBLICATIONS

Endoh, et al., "Novel Ultra High Density Memory with a Stacked-Surrounding Gate Transistor (S-SGT) Structured Cell," IEDM Proc. (2001) 33-36.

International Search Report for PCT/US2014/071397, dated Mar. 18, 2015 (5 pages).

Written Opinion of the International Searching Authority for PCT/US2014/071397, dated Mar. 18, 2015 (11 pages).

International Preliminary Report on Patentability for International Application No. PCT/US20141071397, 12 pages, dated Jun. 21, 2016.

Communication Pursuant to Rules 161(1) and 162 EPC for European Patent Application No. 14824733.1, dated Jul. 27, 2016, 2 pages.

* cited by examiner

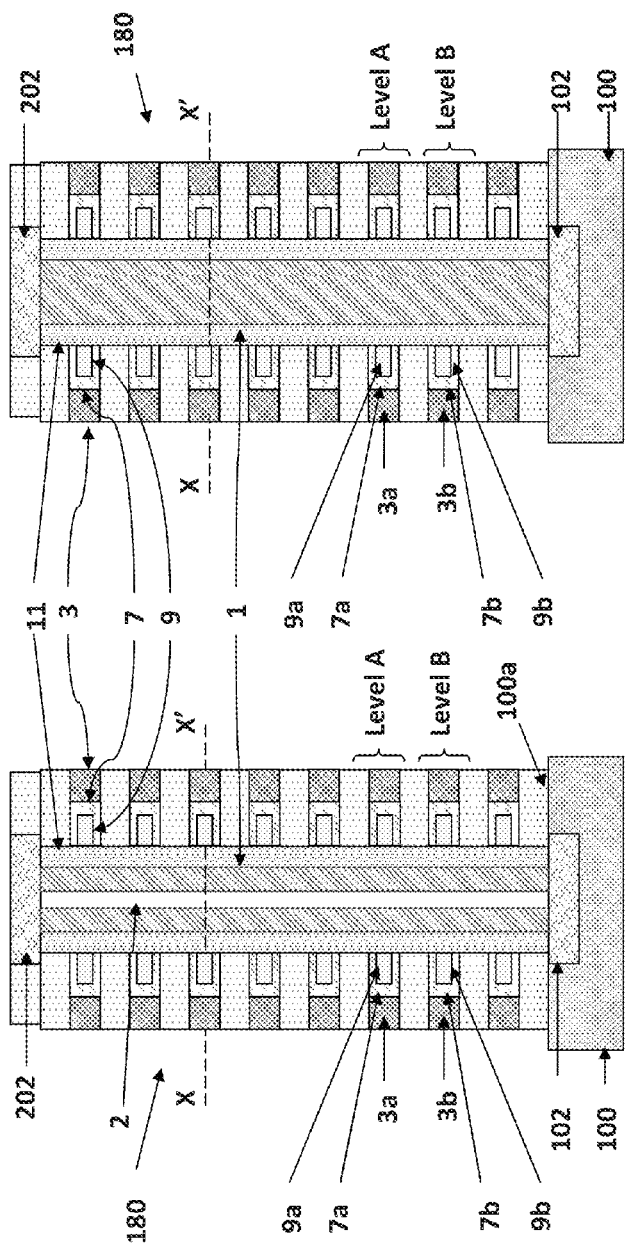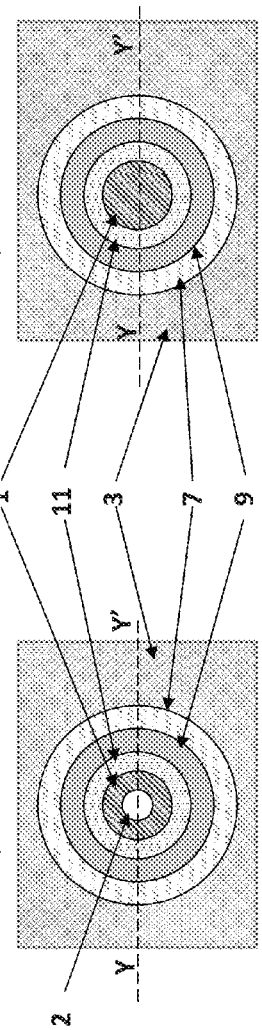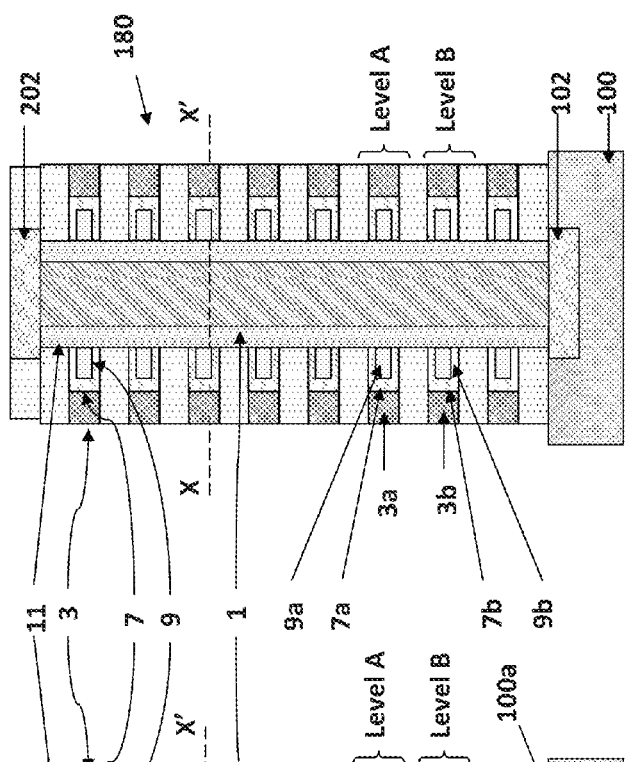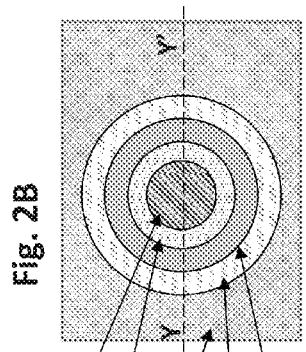

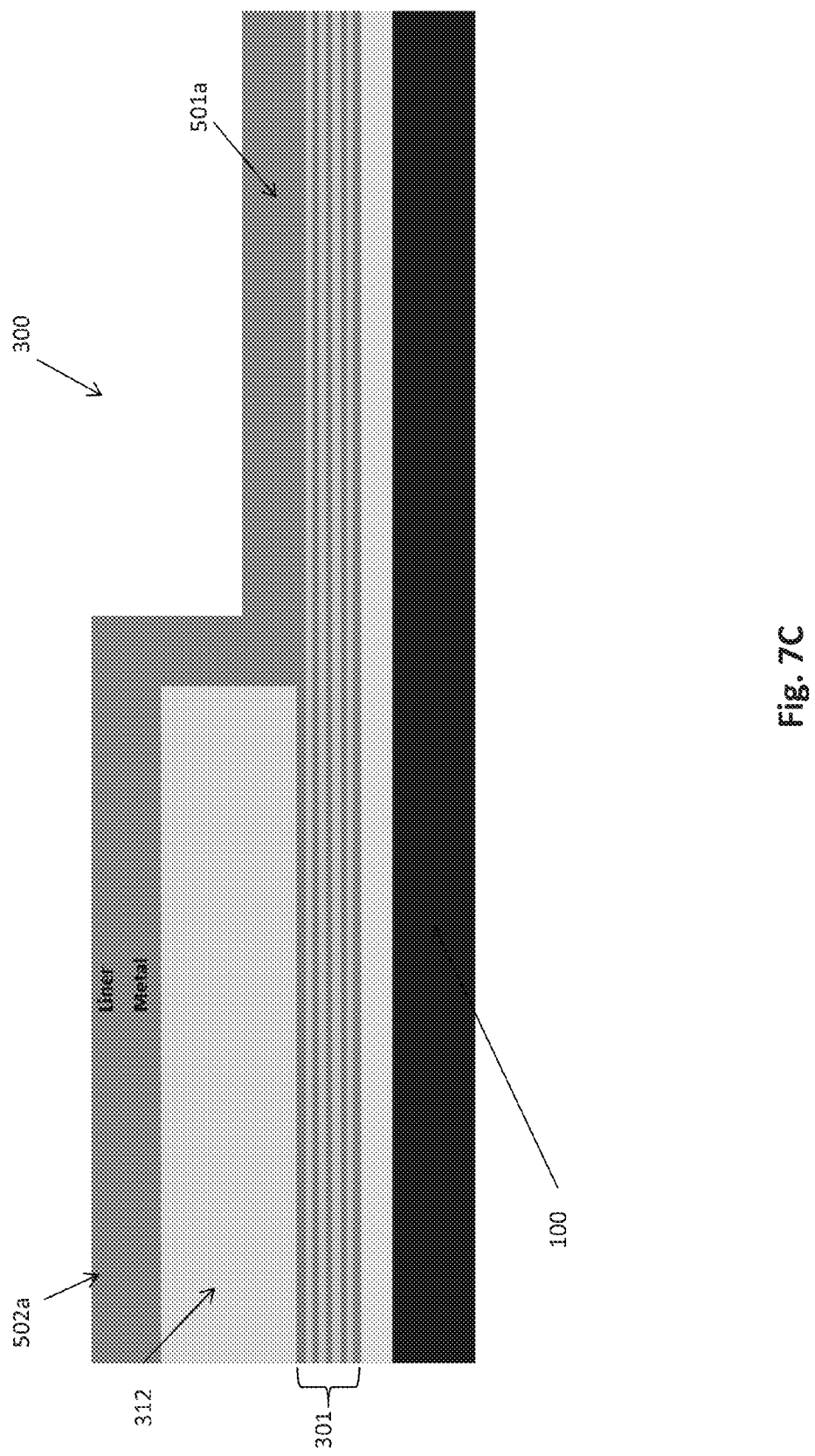

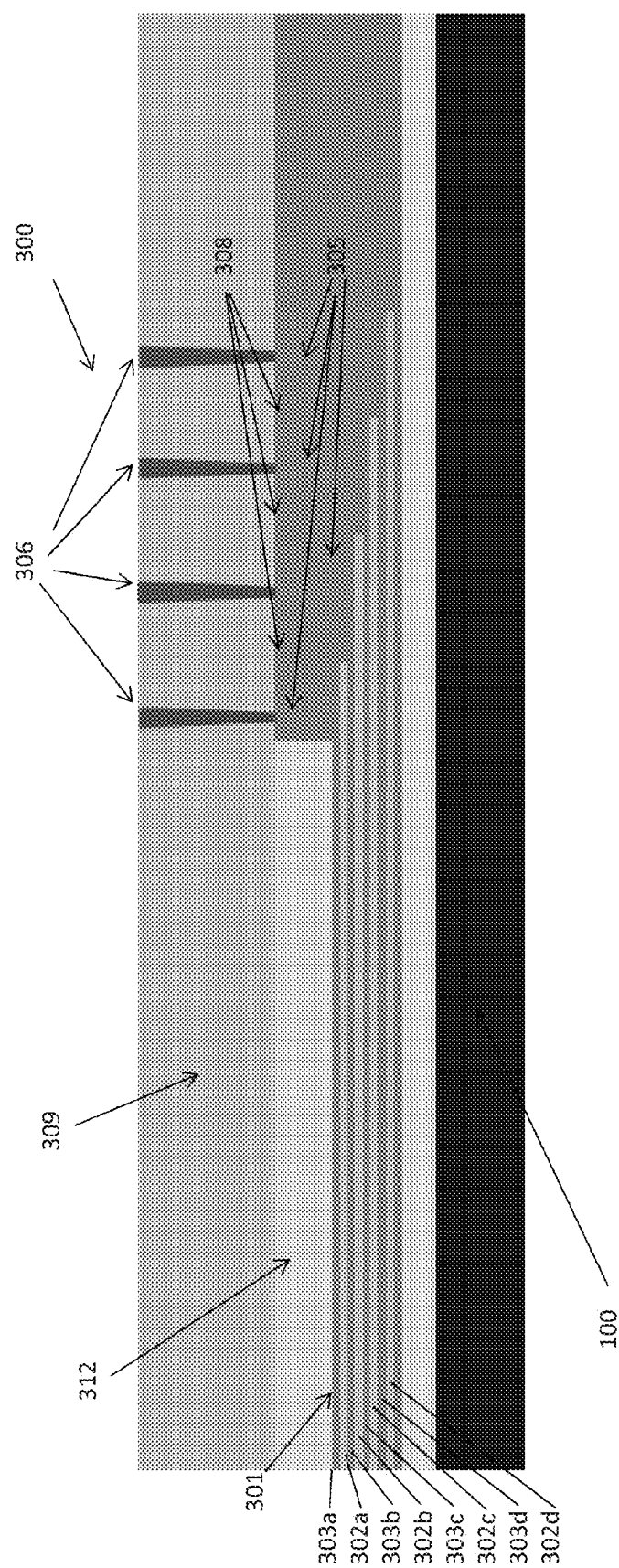

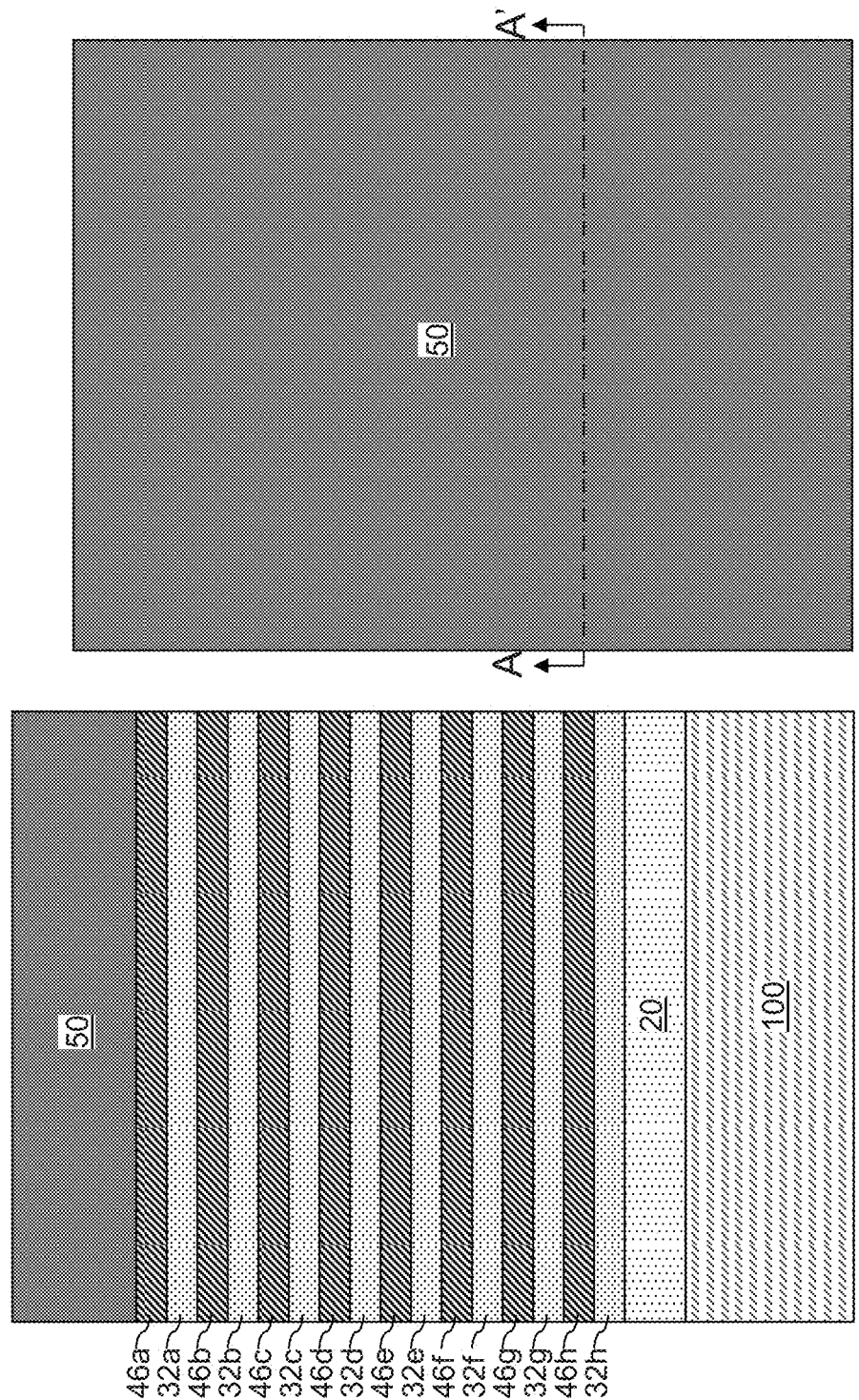

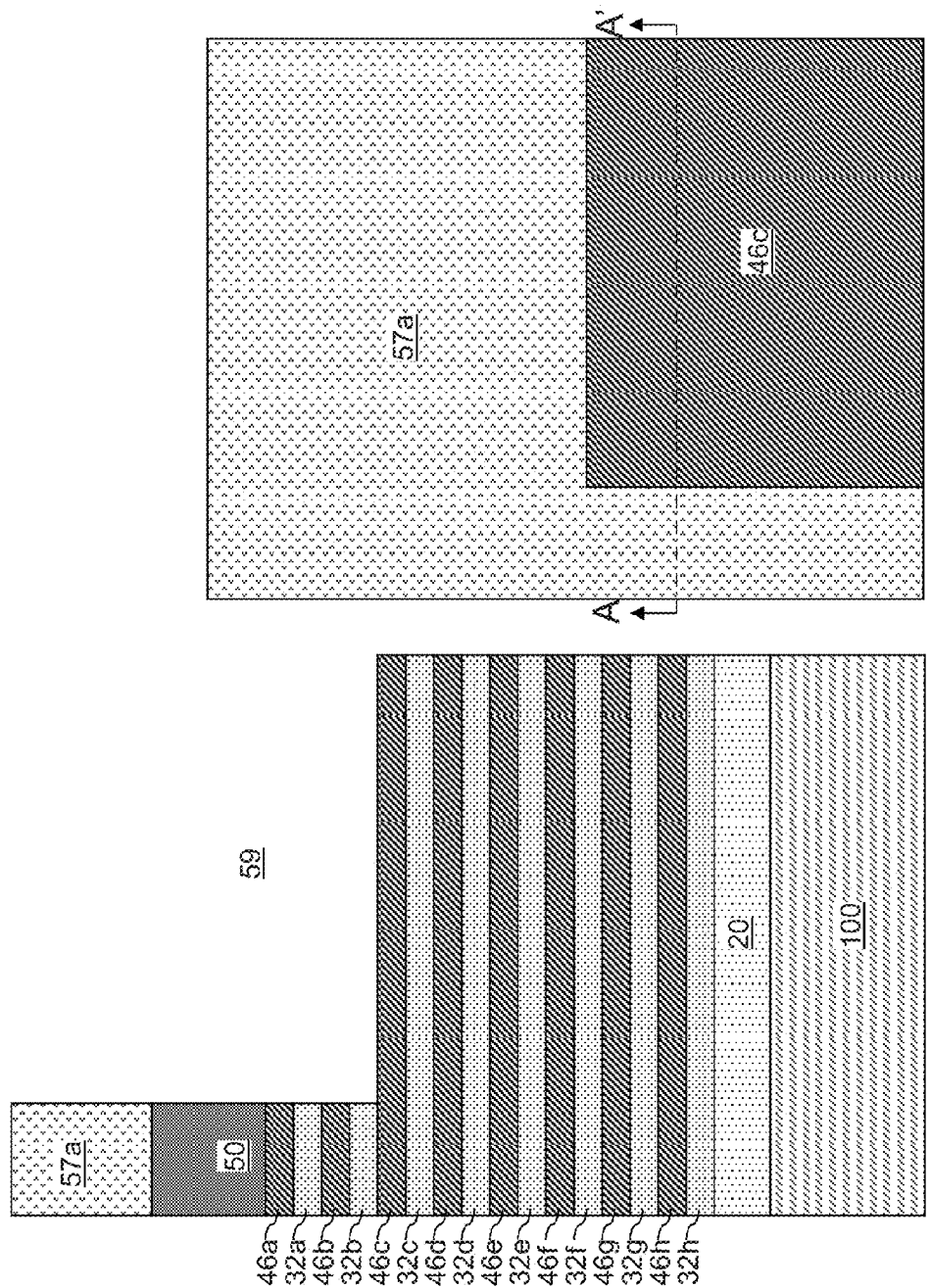

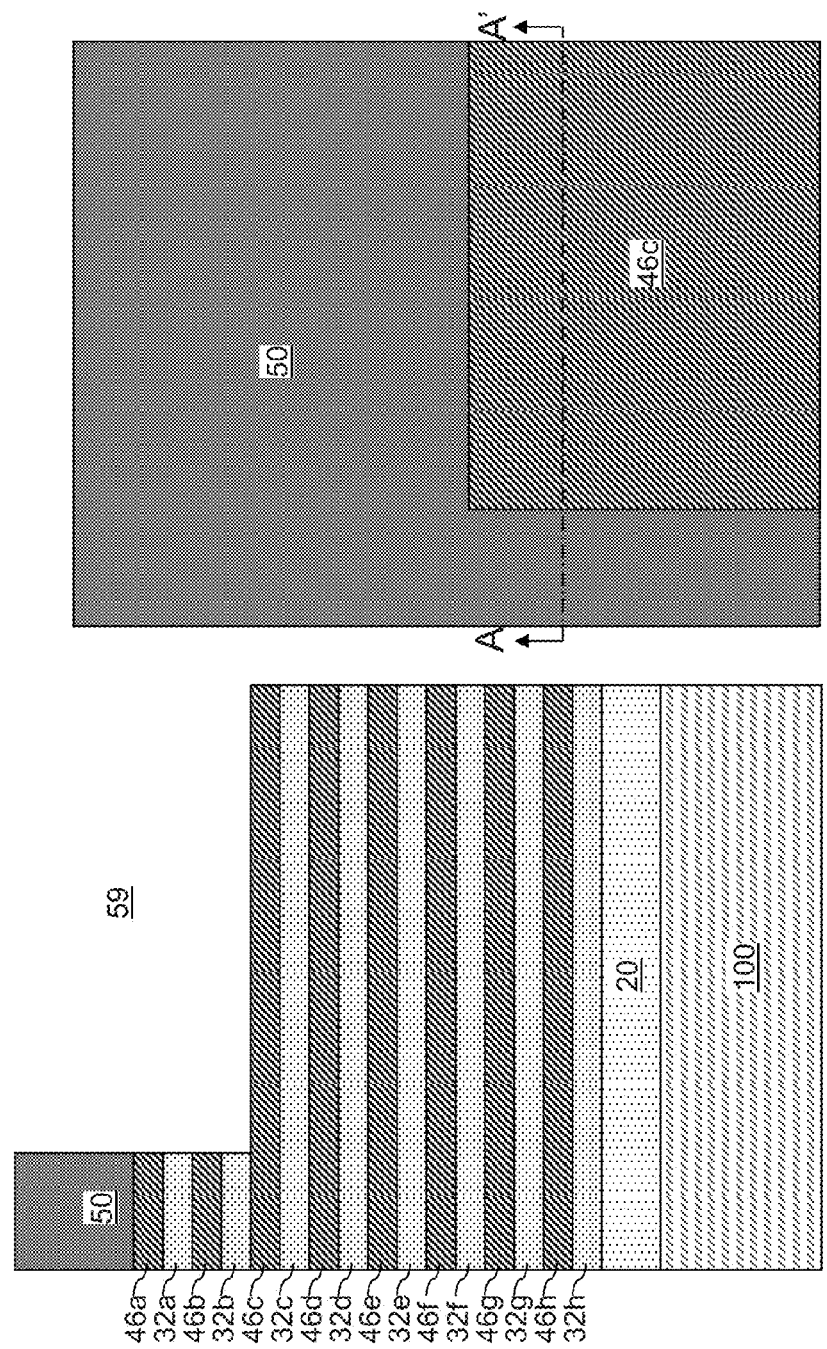

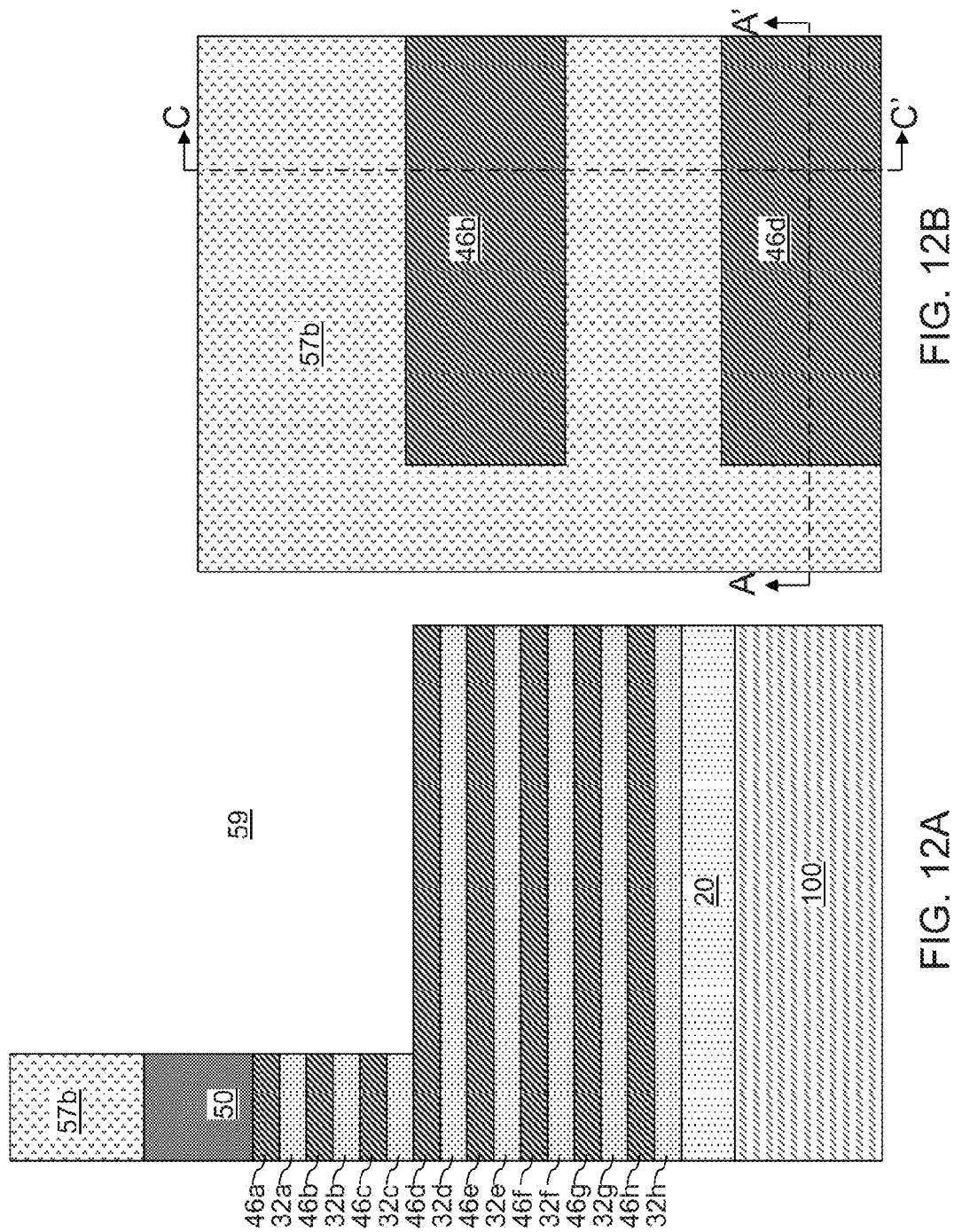

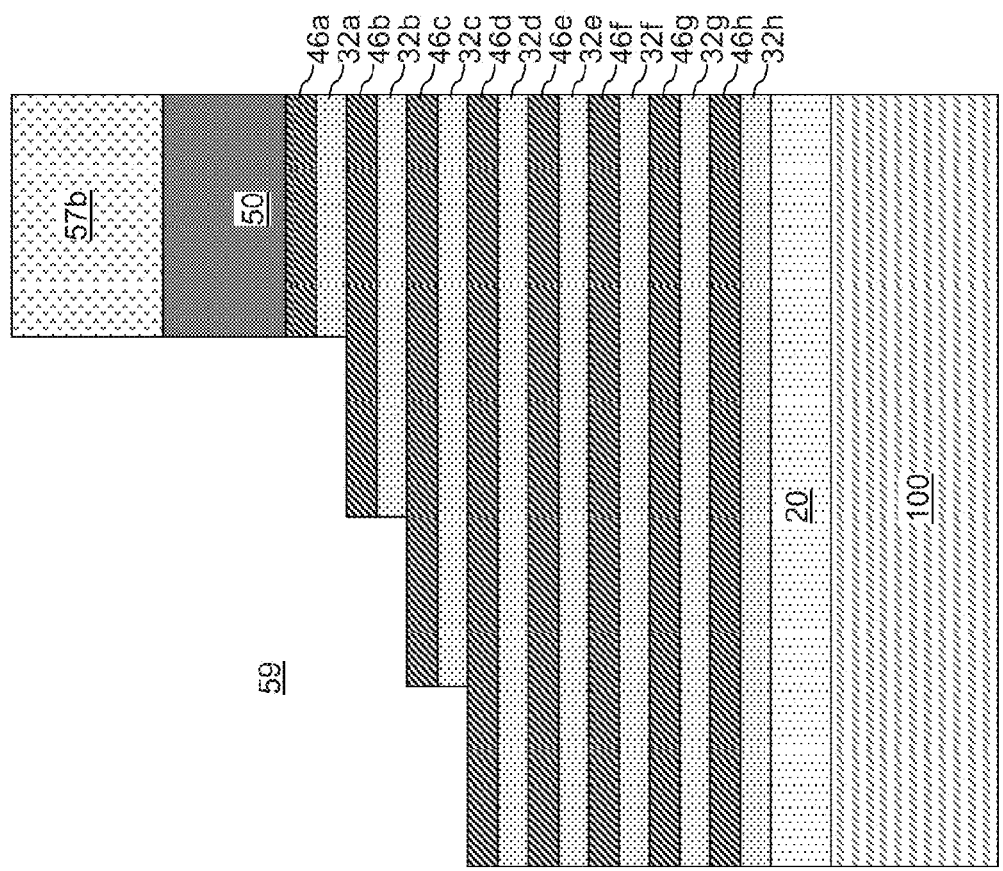

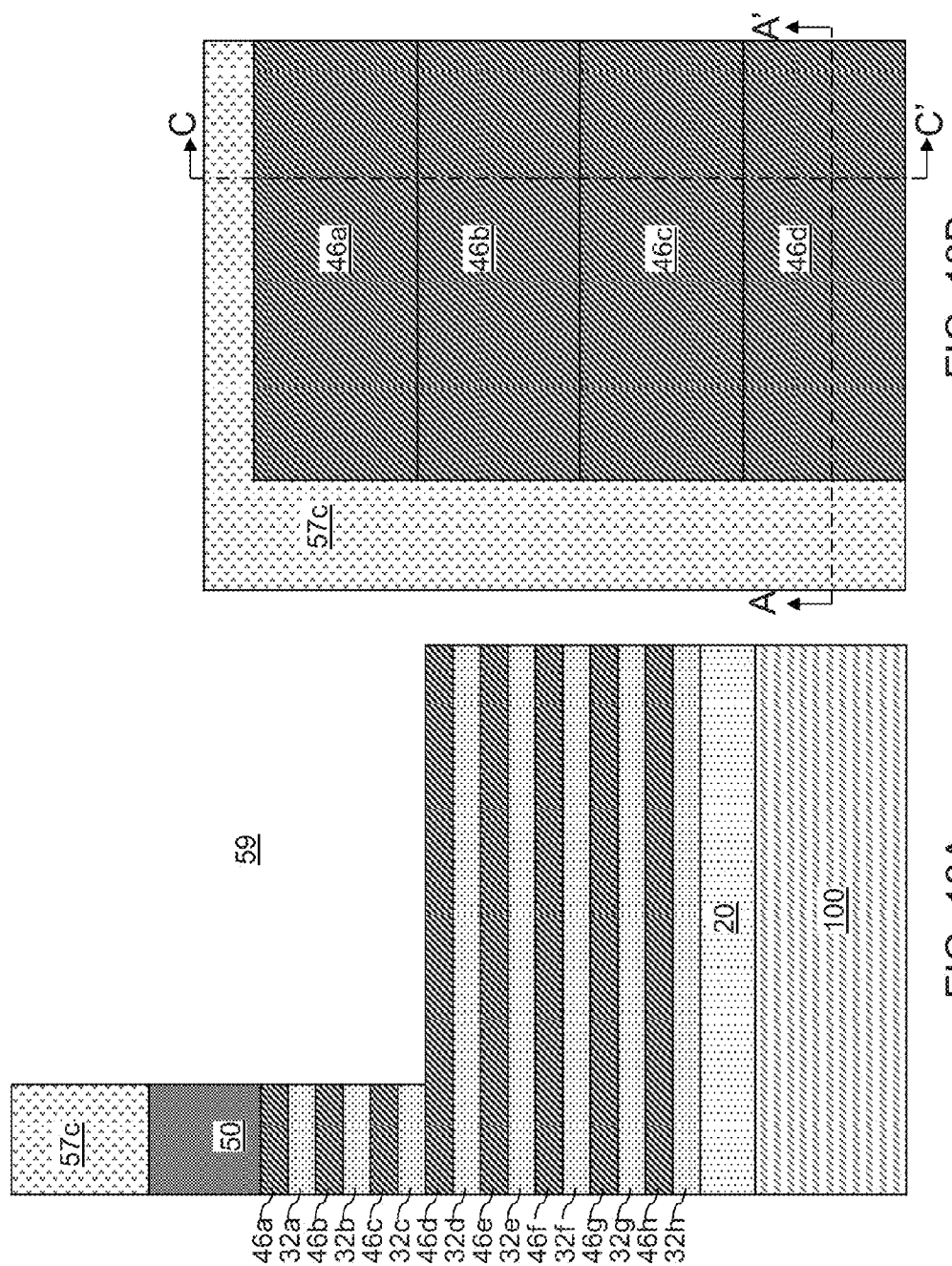

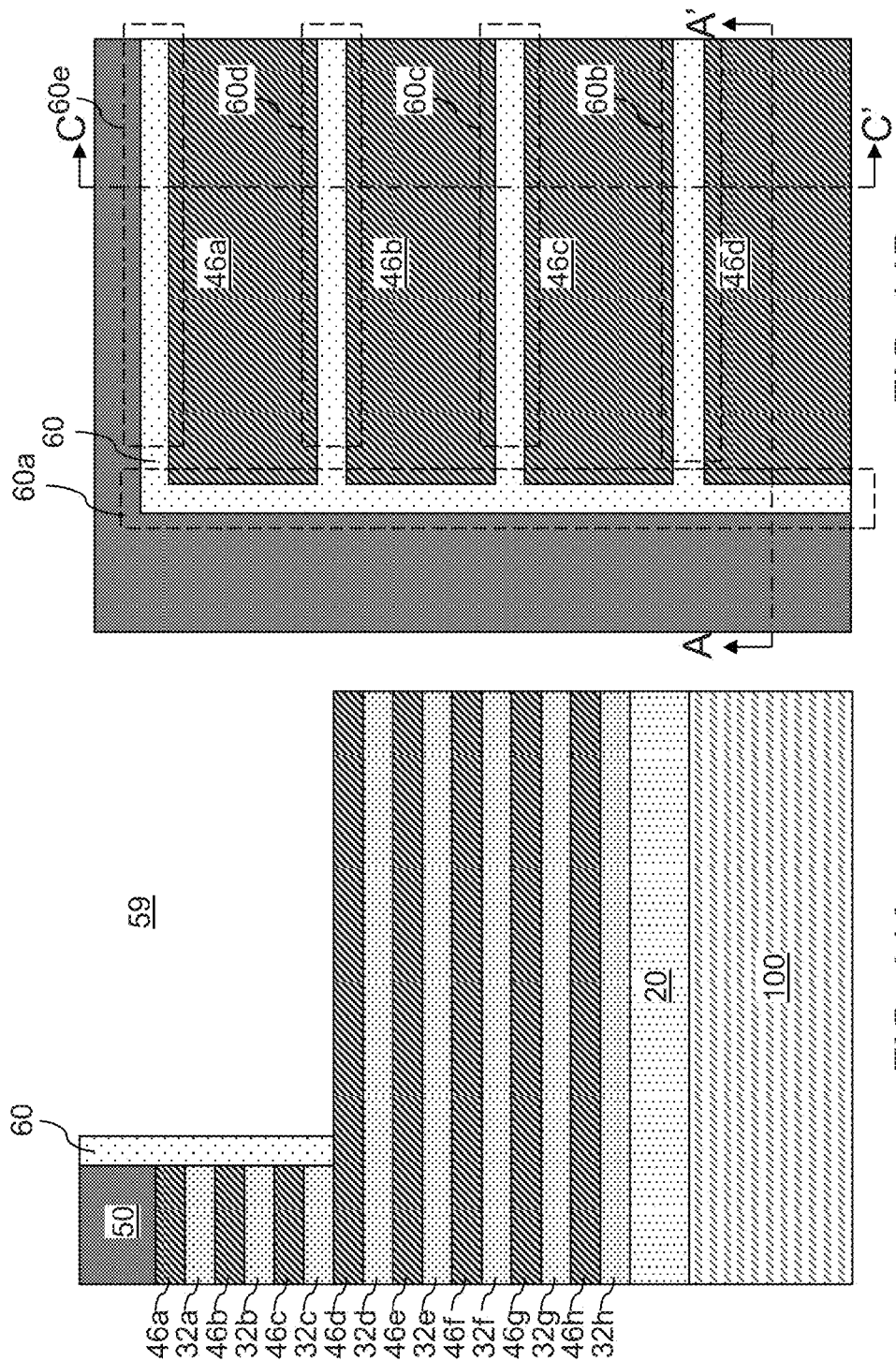

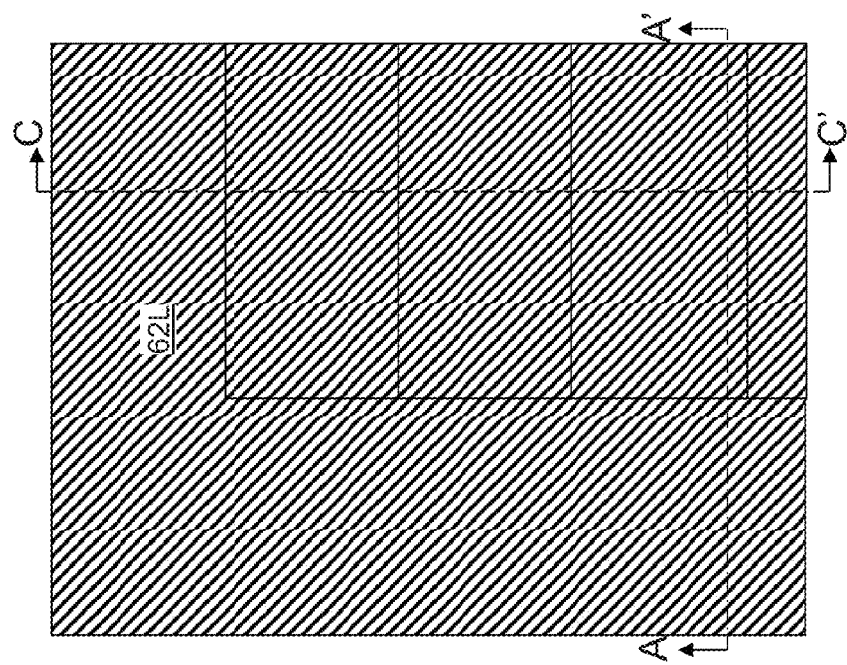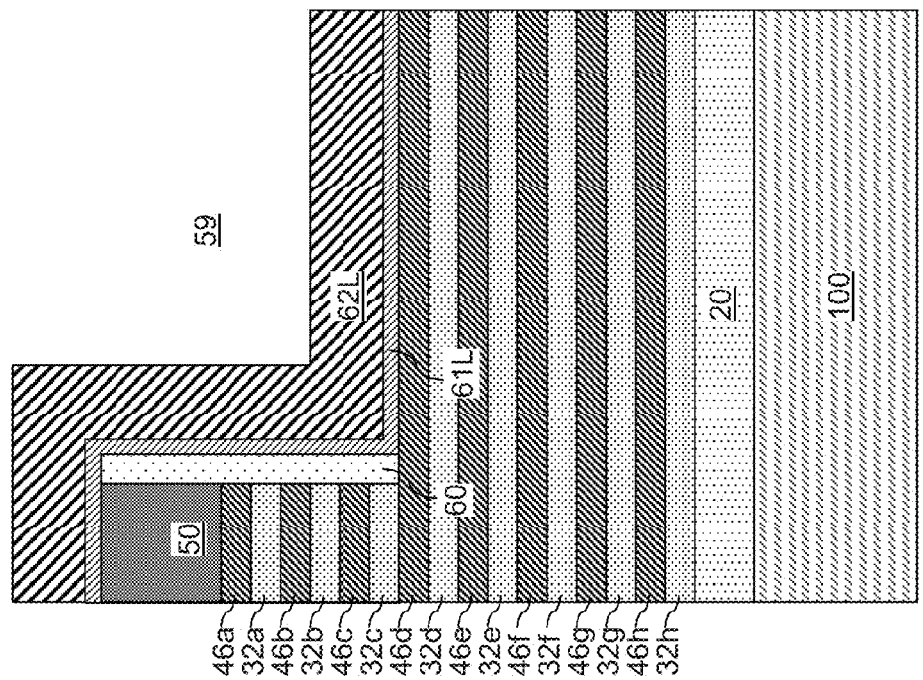

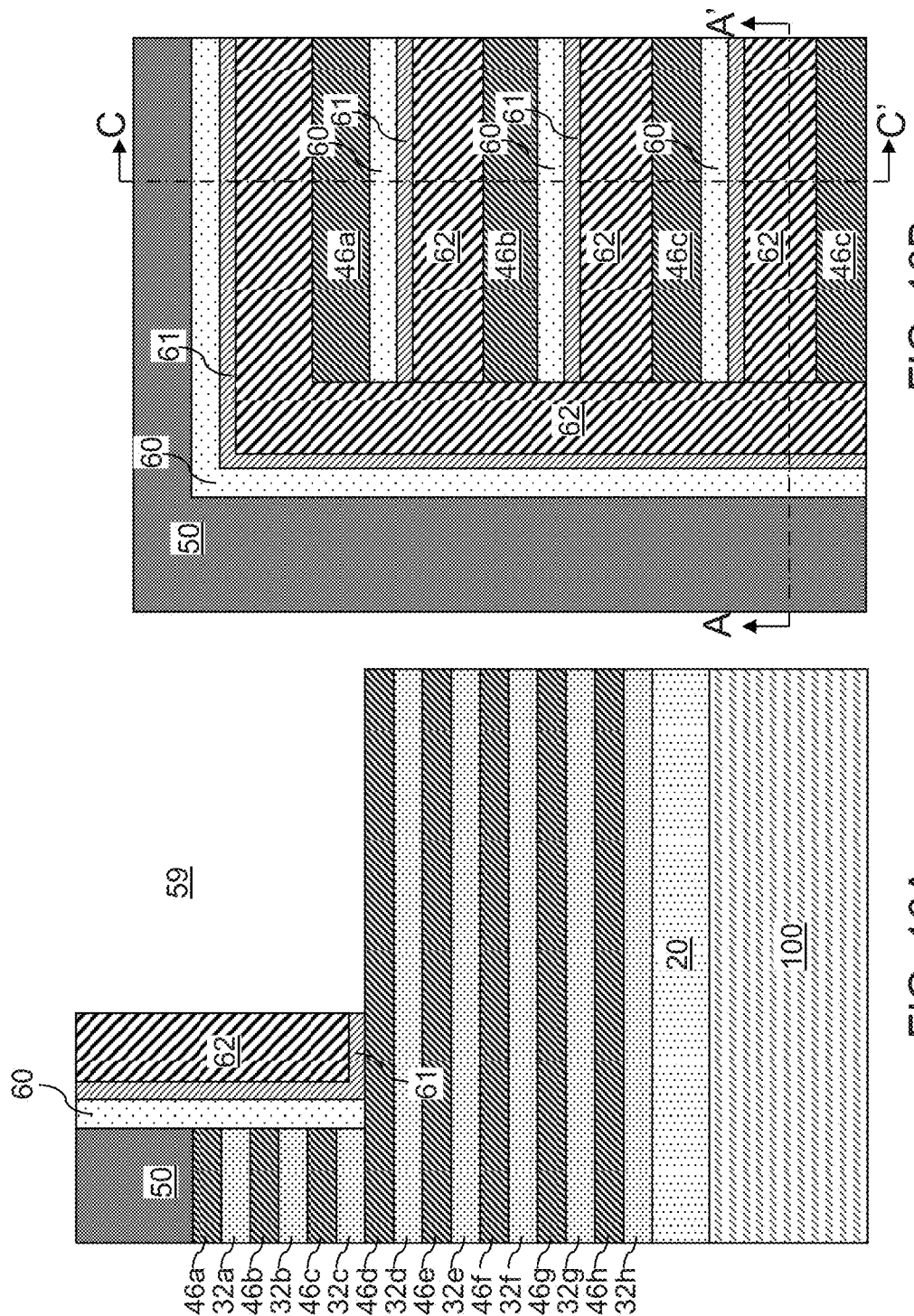

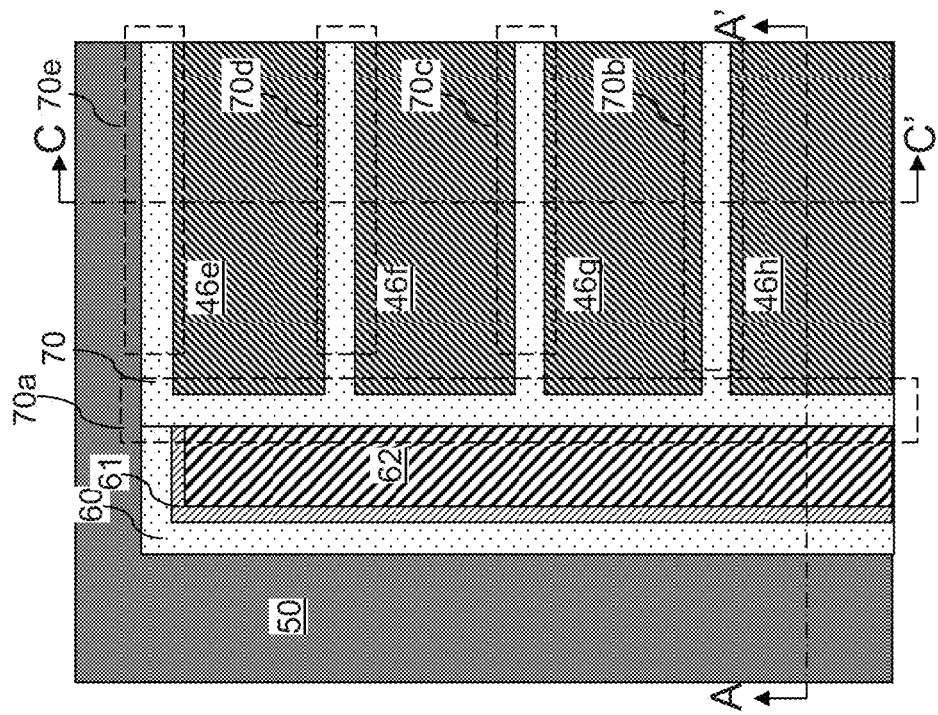
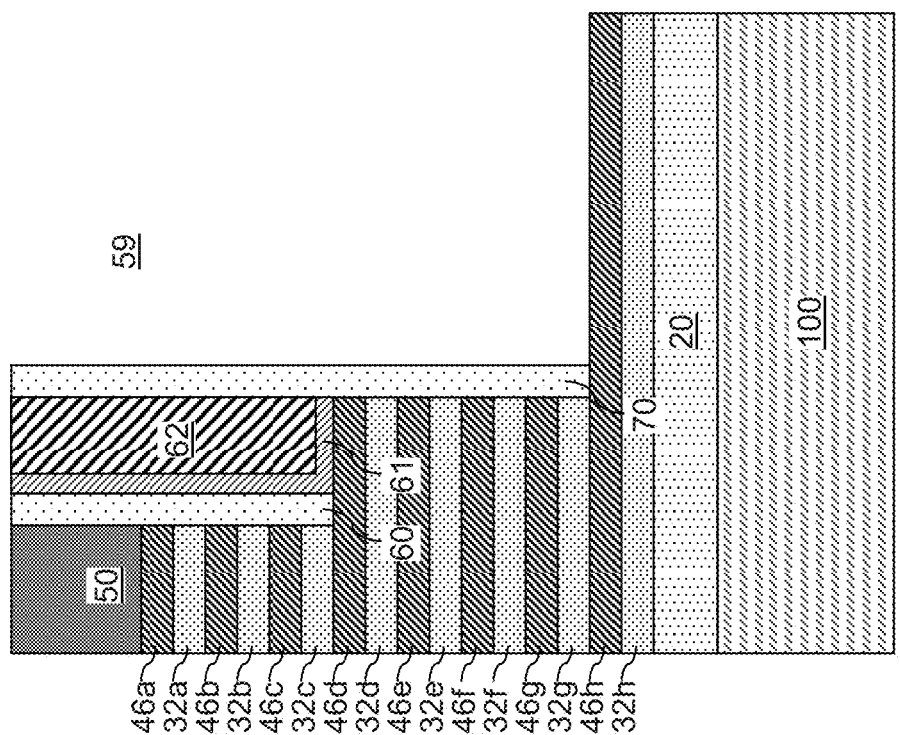

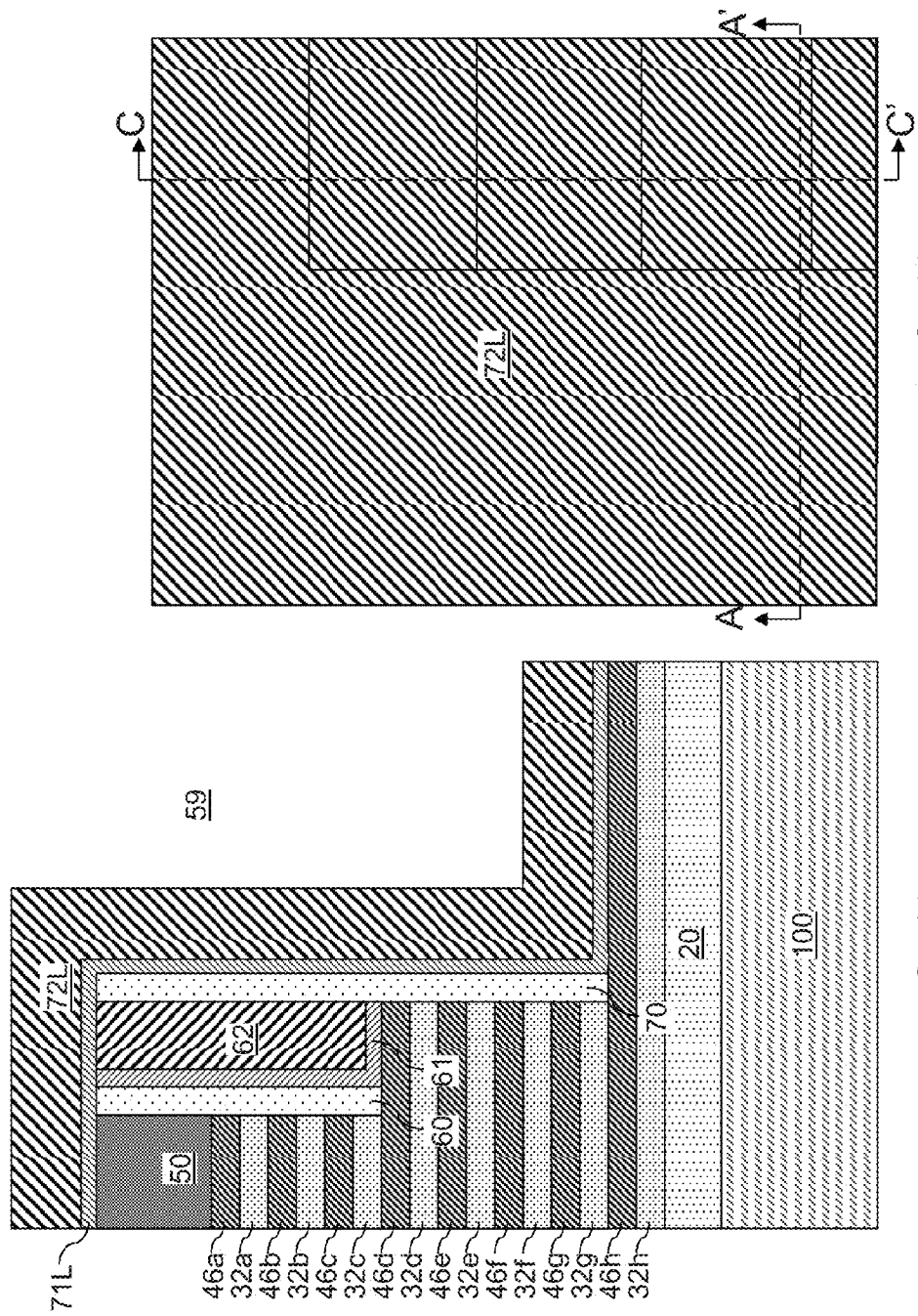

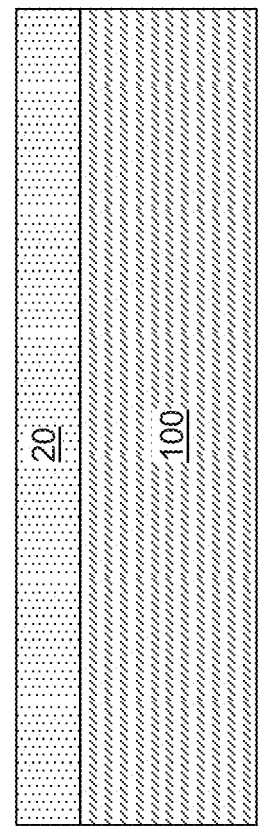

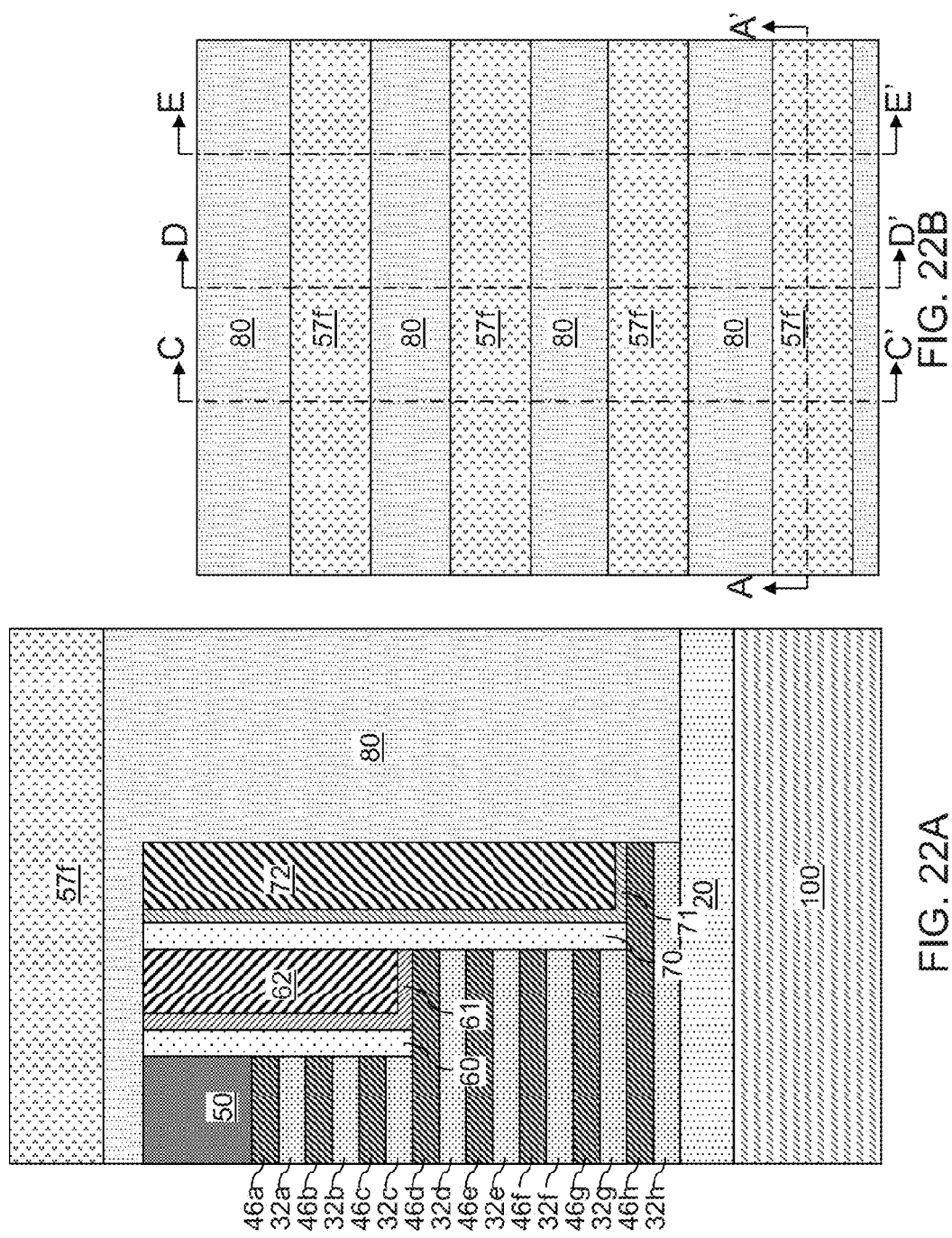

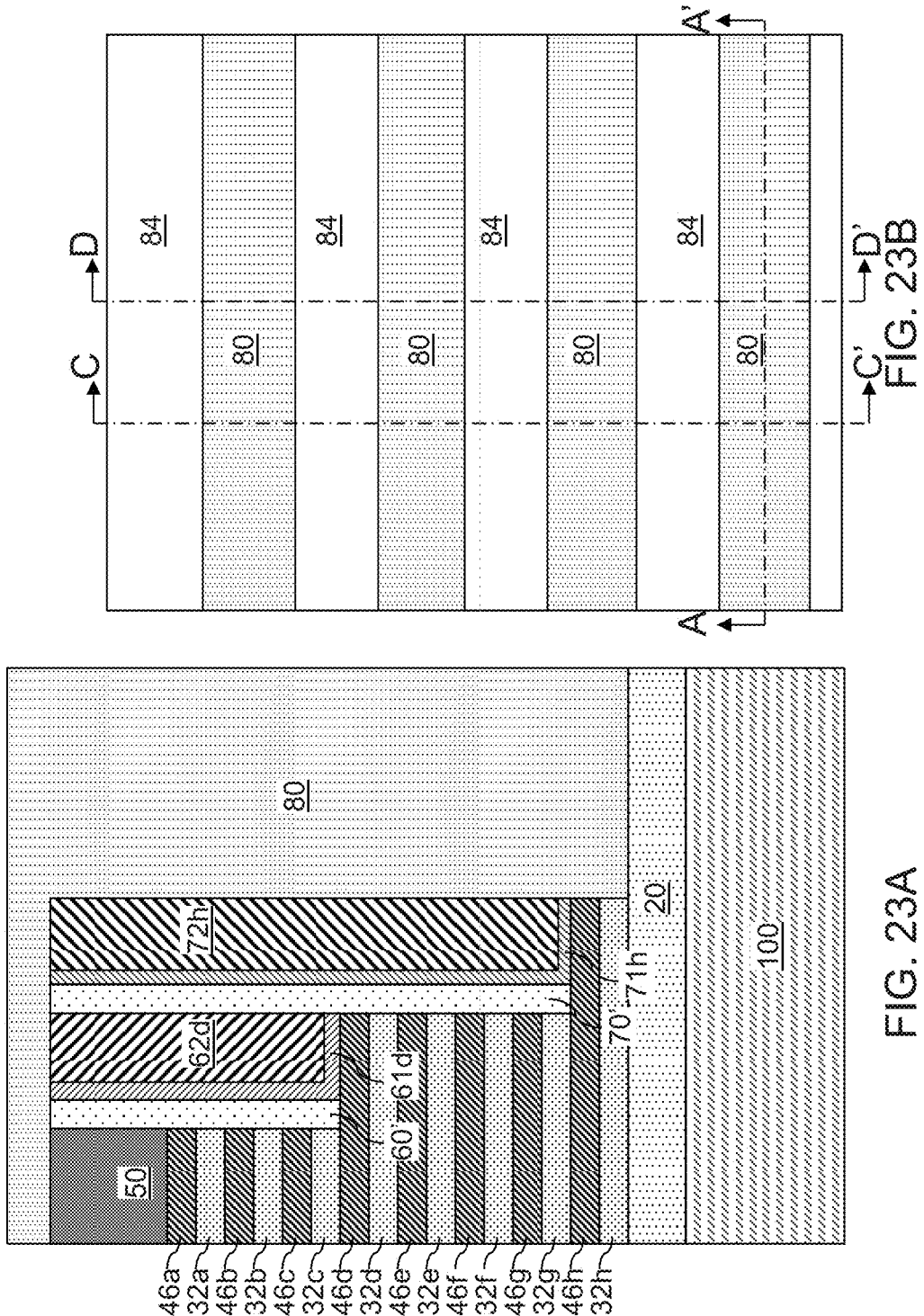

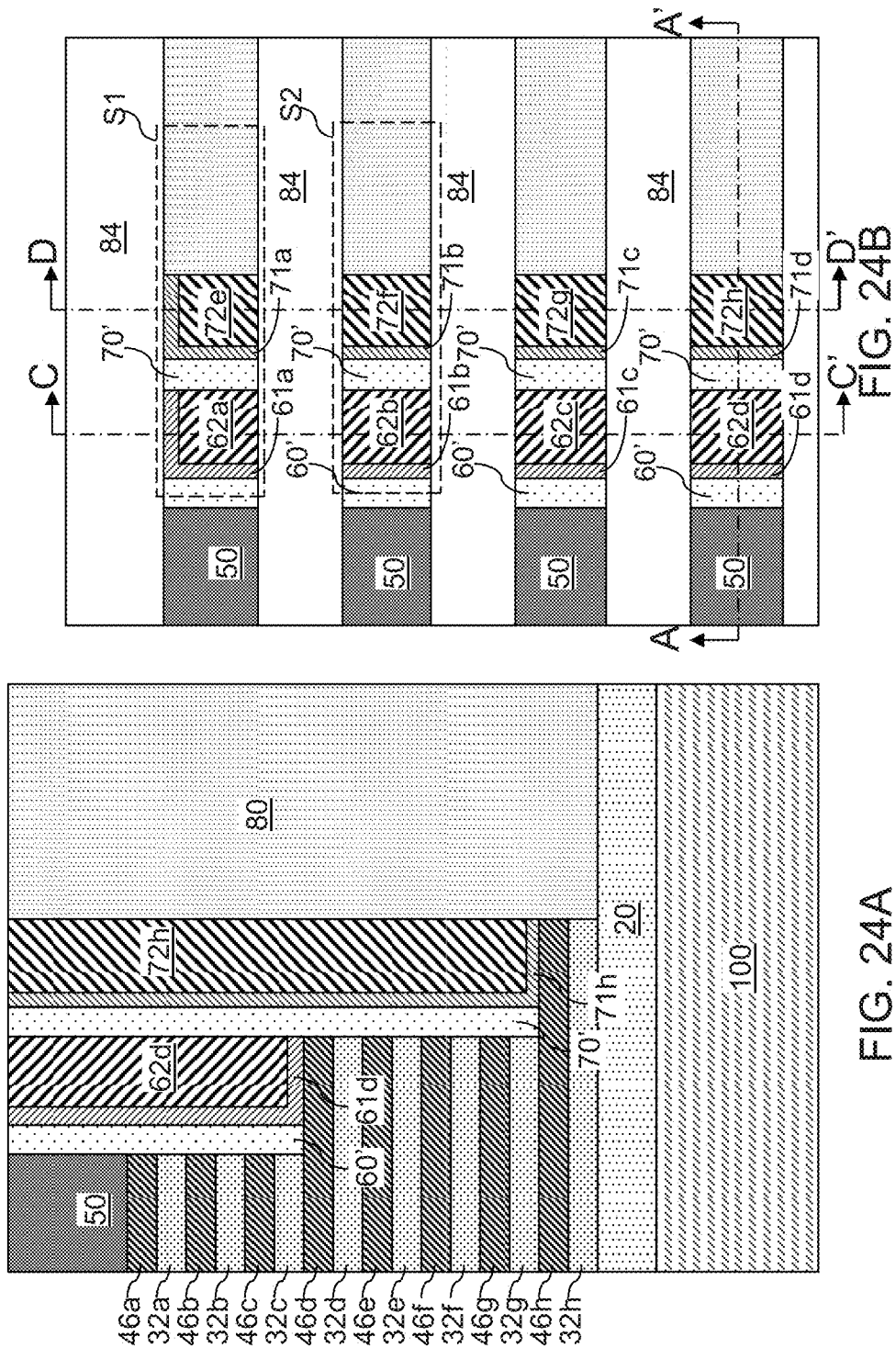

MULTILEVEL CONTACT TO A 3D MEMORY ARRAY AND METHOD OF MAKING THEREOF

FIELD

The present disclosure relates generally to the field of semiconductor devices and specifically to three-dimensional vertical NAND strings, other three-dimensional devices, and metal interconnect structures for three-dimensional devices, and methods of making thereof.

BACKGROUND

Three-dimensional ("3D") vertical NAND strings are disclosed in an article by T. Endoh, et. al., titled "Novel Ultra High Density Memory With A Stacked—Surrounding Gate Transistor (S-SGT) Structured Cell", IEDM Proc. (2001) 33-36.

SUMMARY

One embodiment relates to a multilevel device. The device includes at least one device region and at least one contact region. The contact region has a stack of alternating plurality of electrically conductive layers and plurality of electrically insulating layers located over a substrate. The plurality of electrically conductive layers form a stepped pattern in the contact region, where each respective electrically insulating layer includes a sidewall and a respective underlying electrically conductive layer in the stack extends laterally beyond the sidewall. A respective electrically conductive sidewall spacer of a plurality of electrically conductive sidewall spacers is located adjacent to the sidewall of each electrically insulating layer, where the sidewall spacer is in electrical contact with the electrically conductive layer underlying the respective electrically insulating layer and is substantially electrically isolated from the other electrically conductive layers in the plurality of electrically conductive layers in the stack.

Another embodiment relates to a method of making multi-level contacts, including the following steps. Step (a) includes providing an in-process multilevel device comprising at least one device region and at least one contact region located over a substrate, the contact region including a stack of a plurality of alternating electrically insulating layers and electrically conductive layers, each respective electrically insulating layer located on the respective electrically conductive layer to isolate the respective electrically conductive layer from any overlaying electrically conductive layers in the stack. Step (b) includes forming a mask over a portion of the stack in the contact region. Step (c) includes removing a portion of an upper most first electrically insulating later in the stack that is not covered by the mask layer to expose a portion of an underlying first electrically conductive layer in such that the exposed portion of the underlying first electrically conductive layer extends laterally past a first sidewall formed in the uppermost first electrically insulating layer. Step (d) includes forming a first conformal layer of electrically conductive material on the first sidewall and on the exposed portion of underlying first electrically conductive layer in the stack. Step (e) includes etching the device to form a first electrically conductive sidewall spacer adjacent to the first sidewall and to expose a portion of a second electrically insulating layer under the first electrically conductive layer, wherein the exposed portion extends laterally past the first electrically conductive sidewall spacer.

Yet another embodiment relates to a multilevel structure. The multilevel structure includes a stack of an alternating plurality of electrically conductive layers and electrically insulating layers located over a substrate, a plurality of electrically conductive via connections having top surfaces within a same horizontal plane and having bottom surfaces contacting a respective electrically conductive layer located at different levels, and a trench isolation structure extending through the stack and including first and second sidewalls located on opposite sides. The first sidewall of the trench isolation structure contacts a first subset of at least two electrically conductive via connections, and the second sidewall of the trench isolation structure contact a second subset of at least two electrically conductive via connections that is different from the first subset.

Still another embodiment relates to a method of fabricating a multilevel structure. A stack is formed, which includes an alternating plurality of electrically conductive layers and electrically insulating layers over a substrate. A recessed region is formed through the stack. Top surfaces of a first set of electrically conductive layers located at different levels are physically exposed within the recessed region. A first electrically conductive spacer is formed on the top surfaces of the first set of electrically conductive layers within the recessed region. At least one trench isolation structure extending through the stack is formed. The at least one trench isolation structure divides the first electrically conductive spacer into a plurality of electrically conductive via connections.

One embodiment relates to a multilevel structure, which includes a stack of an alternating plurality of electrically conductive layers and electrically insulating layers located over a substrate, and a plurality of electrically conductive via connections having top surfaces within a same horizontal plane and having bottom surfaces contacting a respective electrically conductive layer located at different levels. A trench isolation structure extends through the stack and including first and second sidewalls located on opposite sides. The first sidewall of the trench isolation structure contacts a first subset of at least two electrically conductive via connections, and the second sidewall of the trench isolation structure contact a second subset of at least two electrically conductive via connections that is different from the first subset.

Another embodiment relates to a method of fabricating a multilevel structure. A stack including an alternating plurality of electrically conductive layers and electrically insulating layers is formed over a substrate. A recessed region is formed through the stack. Top surfaces of a first set of electrically conductive layers located at different levels are physically exposed within the recessed region. A first electrically conductive spacer is formed on the top surfaces of the first set of electrically conductive layers within the recessed region. At least one trench isolation structure extends through the stack. The at least one trench isolation structure divides the first electrically conductive spacer into a plurality of electrically conductive via connections.

In various embodiments, the device region may include any suitable multilayer device including, for example, a non-volatile memory device such as a vertical NAND memory device or a vertical restive random access memory (ReRAM) device.

BRIEF DESCRIPTION OF THE DRAWINGS

FIGS. 1A-1B are respectively side cross sectional and top cross sectional views of a NAND string of one embodiment.

FIG. 1A is a side cross sectional view of the device along line Y-Y' in FIG. 1B, while FIG. 1B is a side cross sectional view of the device along line X-X' in FIG. 1A.

FIG. 2A-2B are respectively side cross sectional and top cross sectional views of a NAND string of another embodiment. FIG. 2A is a side cross sectional view of the device along line Y-Y' in FIG. 2B, while FIG. 2B is a side cross sectional view of the device along line X-X' in FIG. 2A.

FIGS. 7A-7K are side cross sectional views of steps in the method making a multi-level contacts. For conciseness and clarity, the layers of layer stack 301 are explicitly labeled in FIG. 7A only.

FIG. 8 is a schematic illustration of a method of making a multi-level contact according to an embodiment.

FIG. 9A is a vertical cross-sectional view of an exemplary structure that can be incorporated to a multilevel device including an alternating plurality of electrically insulating layers an electrically conductive layers according to an embodiment of the present disclosure.

FIG. 9B is a top-down view of the exemplar structure of FIG. 9A. The vertical plane A-A' corresponds to the plane of the vertical cross-sectional view of FIG. 9A.

FIG. 10A is a vertical cross-sectional view of the exemplary structure after application and patterning of a first photoresist layer, and etching $2^{N1}$ number of electrically conductive layers and $2^{N1}$ number of electrically insulating layer in regions not covered by the first photoresist layer according to an embodiment of the present disclosure.

FIG. 10B is a top-down view of the exemplar structure of FIG. 10A. The vertical plane A-A' corresponds to the plane of the vertical cross-sectional view of FIG. 10A.

FIG. 11A is a vertical cross-sectional view of the exemplary structure after removal of a first photoresist layer according to an embodiment of the present disclosure.

FIG. 11B is a top-down view of the exemplar structure of FIG. 11A. The vertical plane A-A' corresponds to the plane of the vertical cross-sectional view of FIG. 1A.

FIG. 12A is a vertical cross-sectional view of the exemplary structure after application and patterning of a second photoresist layer, and etching $2^{N2}$ number of electrically conductive layers and $2^{N2}$ number of electrically insulating layer in regions not covered by the second photoresist layer according to an embodiment of the present disclosure.

FIG. 12B is a top-down view of the exemplar structure of FIG. 12A. The vertical plane A-A' corresponds to the plane of the vertical cross-sectional view of FIG. 12A.

FIG. 12C is a vertical cross-sectional view of the exemplary structure along the vertical plane C-C' of FIG. 12B.

FIG. 13A is a vertical cross-sectional view of the exemplary structure after application and patterning of a third photoresist layer, and recessing the stack by one electrically conductive layer and by one electrically insulating layer in regions not covered by the third photoresist layer according to an embodiment of the present disclosure.

FIG. 13B is a top-down view of the exemplar structure of FIG. 13A. The vertical plane A-A' corresponds to the plane of the vertical cross-sectional view of FIG. 13A.

FIG. 14A is a vertical cross-sectional view of the exemplary structure after formation of an upper level dielectric spacer according to an embodiment of the present disclosure.

FIG. 14B is a top-down view of the exemplar structure of FIG. 14A. The vertical plane A-A' corresponds to the plane of the vertical cross-sectional view of FIG. 14A.

FIG. 15A is a vertical cross-sectional view of the exemplary structure after formation of at least one first conductive material layer according to an embodiment of the present disclosure.

FIG. 15B is a top-down view of the exemplar structure of FIG. 15A. The vertical plane A-A' corresponds to the plane of the vertical cross-sectional view of FIG. 15A.

FIG. 16A is a vertical cross-sectional view of the exemplary structure after formation of a first electrically conductive spacer according to an embodiment of the present disclosure.

FIG. 16B is a top-down view of the exemplar structure of FIG. 16A. The vertical plane A-A' corresponds to the plane of the vertical cross-sectional view of FIG. 16A.

FIG. 18A is a vertical cross-sectional view of the exemplary structure after formation of a lower level dielectric spacer according to an embodiment of the present disclosure.

FIG. 18B is a top-down view of the exemplar structure of FIG. 18A. The vertical plane A-A' corresponds to the plane of the vertical cross-sectional view of FIG. 18A.

FIG. 19A is a vertical cross-sectional view of the exemplary structure after formation of at least one second conductive material layer according to an embodiment of the present disclosure.

FIG. 19B is a top-down view of the exemplar structure of FIG. 19A. The vertical plane A-A' corresponds to the plane of the vertical cross-sectional view of FIG. 19A.

FIG. 21C is a vertical cross-sectional view of the exemplary structure along the vertical plane C-C' of FIG. 21B.

FIG. 22A is a vertical cross-sectional view of the exemplary structure after formation of a dielectric material portion and a patterned sixth photoresist layer according to an embodiment of the present disclosure.

FIG. 22B is a top-down view of the exemplar structure of FIG. 22A. The vertical plane A-A' corresponds to the plane of the vertical cross-sectional view of FIG. 22A.

FIG. 23A is a vertical cross-sectional view of the exemplary structure after formation of trench isolation structures according to an embodiment of the present disclosure.

FIG. 23B is a top-down view of the exemplar structure of FIG. 23A. The vertical plane A-A' corresponds to the plane of the vertical cross-sectional view of FIG. 23A.

FIG. 24A is a vertical cross-sectional view of the exemplary structure after planarization of the dielectric fill material portion and the trench isolation structures according to an embodiment of the present disclosure.

FIG. 24B is a top-down view of the exemplar structure of FIG. 24A. The vertical plane A-A' corresponds to the plane of the vertical cross-sectional view of FIG. 24A.

DETAILED DESCRIPTION

Embodiments of the present disclosure will be described below with reference to the accompanying drawings. It should be understood that the following description is intended to describe exemplary embodiments of the disclosure, and not to limit the disclosure.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three-dimensional Structure Memory." The substrates may be thinned or removed from the memory levels before bonding, but as the memory levels are initially formed over separate substrates, such memories are not true monolithic three-dimensional memory arrays.

Embodiments of the disclosure relate to methods of making contacts to a multilevel memory array, such as a monolithic 3D array. In an embodiment, the multi-level memory device includes at least one device region in which the memory cells (e.g., vertical NAND strings 180 or ReRAM memory cells) are located and at least one contact region in which the multi-level contacts are located. As illustrated in FIGS. 5A and 5B and discussed in more detail below, the distal ends of the electrodes of a ReRAM memory array (e.g., the word lines WL of the ReRAM device of FIG. 4) or control gates of a multi-level vertical NAND memory array are arranged in a step-by-step configuration (stepped pattern). In this manner, electrical contact to the individual control gates or electrodes can be achieved by etching an array of openings 130A-130E in the surrounding dielectric layer(s) from the top surface of the memory array down to the steps 120 and depositing contact metal 132 in the openings 130A-130E to contact the steps 120. In conventional methods of fabricating the contacts, the more shallow steps may be heavily over-etched before the deepest steps are exposed.

Other embodiments of the disclosure provide a monolithic, three-dimensional array of memory devices, such as an array of vertical NAND strings or ReRAM devices. The memory cells of such devices may be vertically oriented, such that at least one memory cell is located over another memory cell. The array allows vertical scaling of the devices to provide a higher density of memory cells per unit area of silicon or other semiconductor material.

Figure 4:
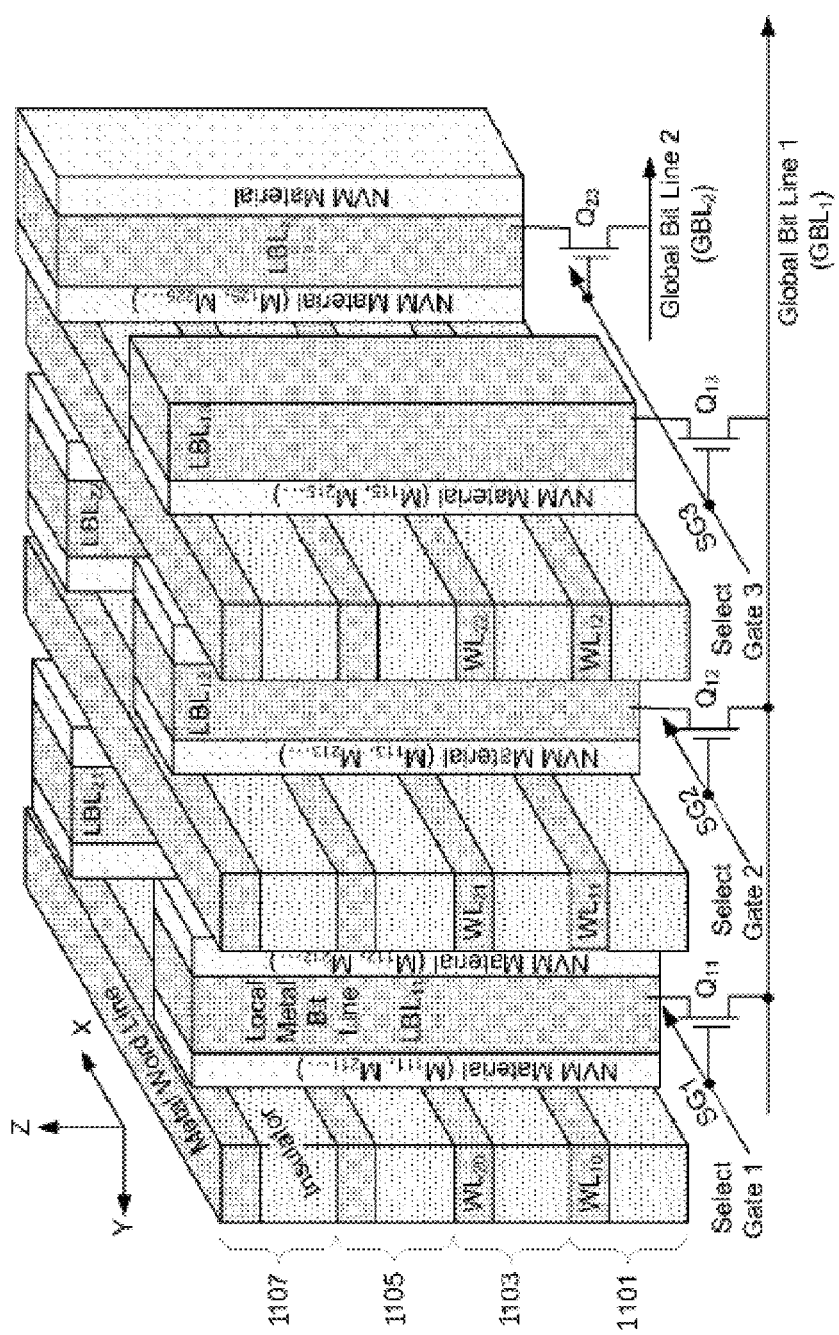
FIG. 4 is a schematic illustration of a vertical bit line ReRAM memory device of another embodiment.
Figure 5A:
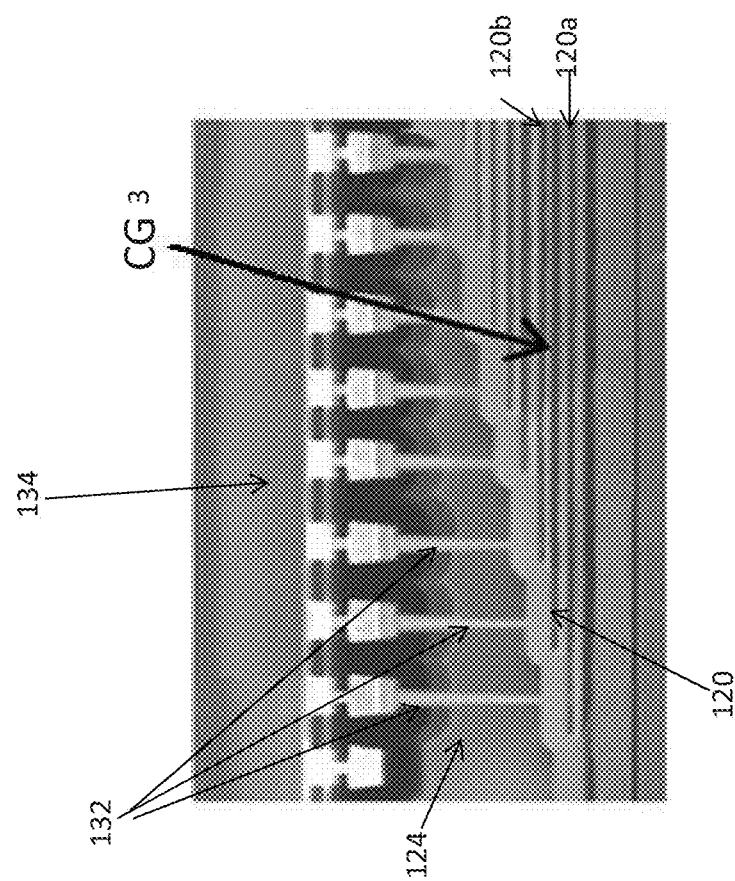
FIG. 5A is a scanning electron microscope (SEM) image of a cross-section of a conventional NAND string memory device showing the contacts to the control gate electrodes (e.g., word lines).
Figure 5B:
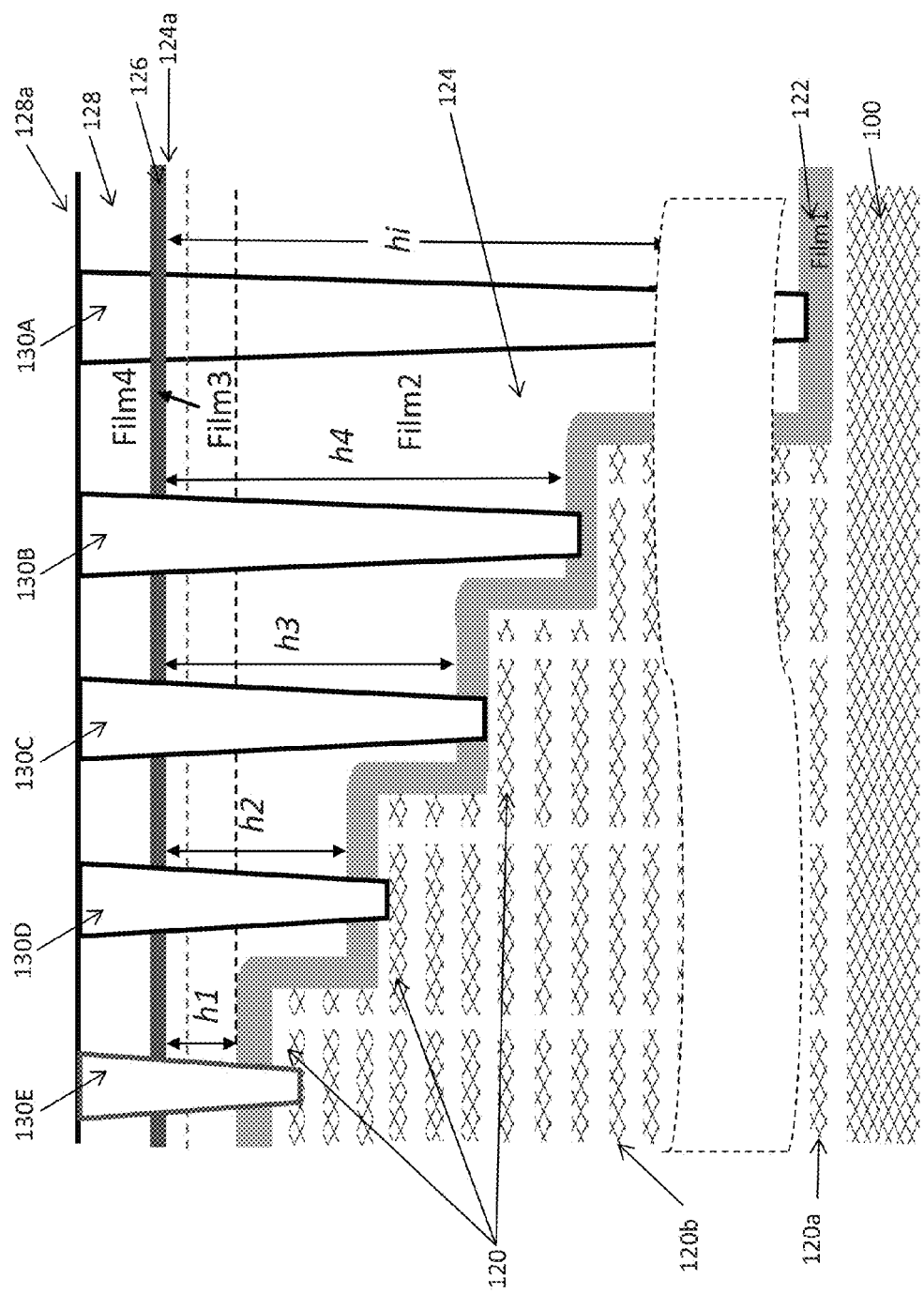
FIG. 5B is a schematic illustration of a conventional method of making a multi-level contact.

Referring to FIG. 4, one example semiconductor structure for implementing a vertically oriented 3D ReRAM memory element array is illustrated, of the type described in U.S. Pat. Pub. No. 2012/0147648, published Jun. 14, 2012. The ReRAM device is configured for use of non-volatile memory element (NVM) material that is non-conductive when first deposited. Since the material is initially non-conductive, there is no necessity to isolate the memory elements at the cross-points of the word and bit lines from each other. Several memory elements may be implemented by a single continuous layer of material, which in the case of FIG. 4 are strips of NVM material oriented vertically along opposite sides of the vertical bit lines in the y-direction and extending upwards through all the planes. A significant advantage of the structure of FIG. 4 is that all word lines and strips of insulation under them in a group of planes may be defined simultaneously by use of a single mask, thus greatly simplifying the manufacturing process.

Referring to FIG. 4, a small part of four planes 1101, 1103, 1105 and 1107 of the three-dimensional array are shown. All of the planes have the same horizontal pattern of conductor, dielectric and NVM material. In each plane, electrically conductive (e.g., metal) word lines ($WL_{zy}$) are elongated in the x-direction and spaced apart in the y-direction. Each plane includes a layer of insulating material (e.g., a dielectric) that isolates its word lines from the word lines of the plane below it or, in the case of plane 1101, of the substrate circuit components below it. In some embodiments, the word lines $WL_{zy}$ for a fixed value of y form a stack of alternating layers that may extend beyond the memory device into a contact area. For example, in some embodiments, a portion of such a stack of extended word lines and alternating dielectric layers may form layer stack 301 in the in the contact area 300 as shown in FIGS. 6, 7A-7K, and 8 (discussed in greater detail below).

Extending through each plane is a collection of electrically conductive (e.g., metal) local bit line (LBL) "pillars" elongated in the vertical z-direction and forming a regular array in the x-y direction.

Each bit line pillar is connected to one of a set of underlying global bit lines (GBL) (e.g., located in the silicon substrate) running in the y-direction at the same pitch as the pillar spacing through the select devices ($Q_{xy}$) formed in the substrate whose gates are driven by the row select lines (SG) elongated in the x-direction, which are also formed in the substrate. The select devices $Q_{xy}$ may be conventional CMOS transistors (or vertical MOSFET thin film transistors, or Junction FET, or npn transistors) and fabricated using the same process as used to form the other conventional circuitry. In the case of using npn transistors instead of MOS transistors, the row select line (SG) lines are replaced with the base contact electrode lines elongated in the x-direction. Also fabricated in the substrate but not shown in FIG. 4 are sense amplifiers, input-output (I/O) circuitry, control circuitry, and any other necessary peripheral circuitry. There is one row select line (SG) for each row of local bit line pillars in the x-direction and one select device (Q) for each individual local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines.

Figure 3:
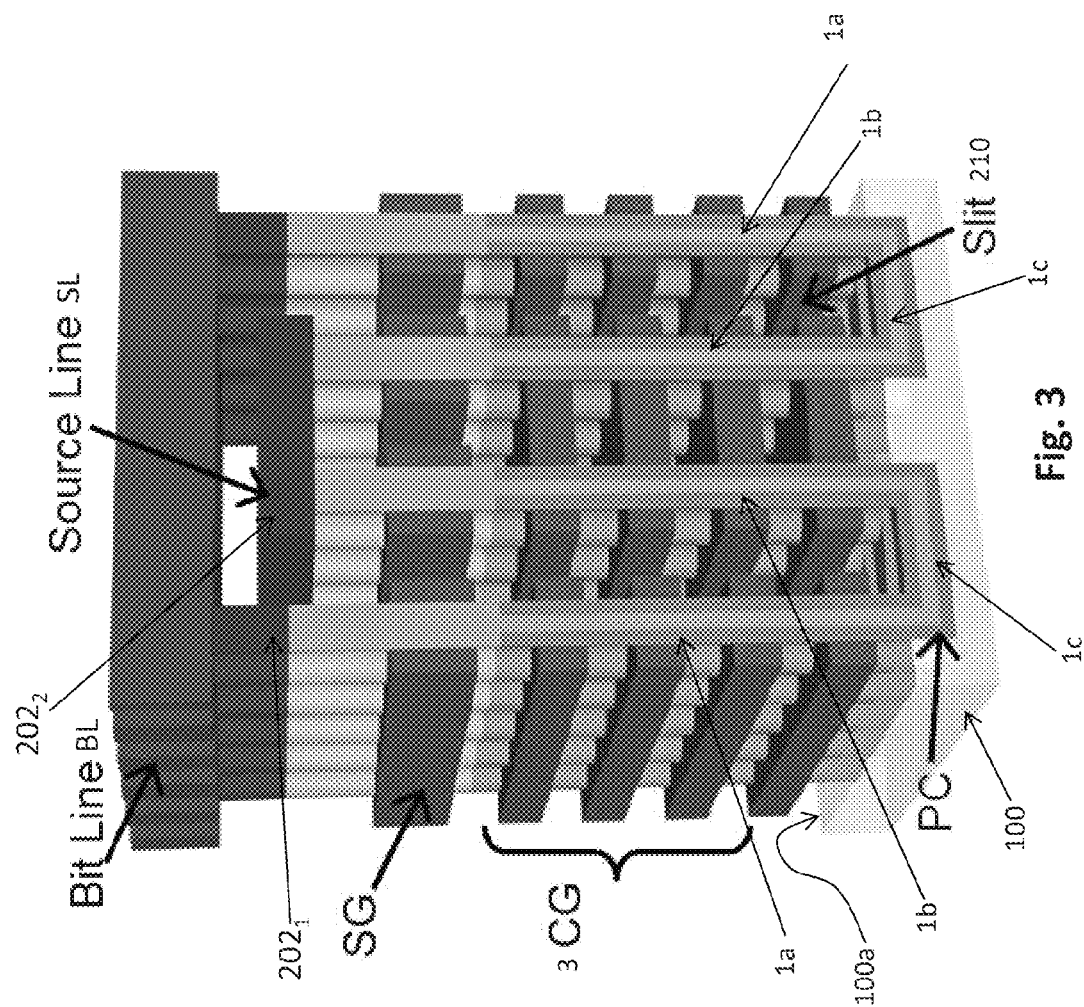
FIG. 3 is a schematic illustration of a NAND string memory device of another embodiment.

Referring back to FIGS. 1A-2B, in some embodiments, the monolithic three-dimensional NAND string 180 comprises a semiconductor channel 1 having at least one end portion extending substantially perpendicular to a major surface 100a of a substrate 100, as shown in FIGS. 1A, 2A, and 3. For example, the semiconductor channel 1 may have a pillar shape and the entire pillar-shaped semiconductor channel extends substantially perpendicularly to the major surface 100a of the substrate 100, as shown in FIGS. 1A and 2A. In these embodiments, the source/drain electrodes of the device can include a lower electrode 102 provided below the semiconductor channel 1 and an upper electrode 202 formed over the semiconductor channel 1, as shown in FIGS. 1A and 2A. Alternatively, the semiconductor channel 1 may have a U-shaped pipe shape, as shown in FIG. 3. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain regions $202_1$ contacts the first wing portion of the semiconductor channel from above, and another one of a source or drain regions $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select gate (SG) or access transistors are shown in FIG. 3. In an embodiment as illustrated in FIG. 3, the source regions $202_2$ of adjacent NAND strings may be connect via a source line SL, while the drain regions $202_1$ of adjacent NAND strings may be connect via a bit line BL. In the U-shaped embodiment, a slit 210 separates the two wing portions 1a and 1b of the U-shaped pipe shape. The slit 210 maybe filled with a dielectric material.

In some embodiments, the semiconductor channel 1 may be a filled feature, as shown in FIGS. 2A-2B. In some other embodiments, the semiconductor channel 1 may be hollow, for example a hollow cylinder filled with an insulating fill material 2, as shown in FIGS. 1A-1B. In these embodiments, and an insulating fill material 2 may be formed to fill the hollow part surrounded by the semiconductor channel 1.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. materials. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three-dimensional NAND string further comprise a plurality of control gate electrodes 3, as shown in FIGS. 1A-1B, 2A-2B, and 3. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, copper, aluminum, tantalum, titanium, cobalt, titanium nitride or alloys thereof. For example, in some embodiments, polysilicon is preferred to allow easy processing.

A blocking dielectric 7 is located adjacent to and may be surrounded by the control gate(s) 3. The blocking dielectric 7 may comprise a plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIGS. 1A-1B and 2A-2B. Alternatively, the blocking dielectric 7 may be continuous as shown in FIG. 3.

The monolithic three-dimensional NAND string may also comprise a plurality of discrete charge storage segments 9, each of which is located between the blocking dielectric segments 7 and the channel 1. Similarly, the plurality of discrete charge storage segments 9 comprise at least a first discrete charge storage segment 9a located in the device level A and a second discrete charge storage segment 9b located in the device level B. Alternatively, the charge storage segment(s) 9 may be continuous as shown in FIG. 3. That is, the charge storage segments may comprise localized regions in a continuous charge storage layer.

The tunneling dielectric 11 of the monolithic three-dimensional NAND string is located between each one of the plurality of the discrete charge storage segments 9 and the semiconductor channel 1. The tunneling dielectric 11 may comprise a plurality of blocking dielectric segments 11 or a continuous layer of dielectric material.

The blocking dielectric 7 and the tunneling dielectric 11 may be independently selected from any one or more same or different electrically insulating materials, such as silicon oxide, silicon nitride, silicon oxynitride, or other high-k insulating materials.

The charge storage segment(s) 9 may comprise a discrete or continuous conductive (e.g., metal or metal alloy such as titanium, platinum, ruthenium, titanium nitride, hafnium nitride, tantalum nitride, zirconium nitride, or a metal silicide such as titanium silicide, nickel silicide, cobalt silicide, or a combination thereof) or semiconductor (e.g., polysilicon) floating gate, conductive nanoparticles, or a discrete or continuous charge storage dielectric (e.g., silicon nitride or another dielectric) feature. For example, in some embodiments, the discrete charge storage segments 9 are discrete charge storage dielectric features, each of which comprises a nitride feature located in the respective clam-shaped blocking dielectric segment 7, where the silicon oxide blocking dielectric segment 7, the nitride feature 9 and the silicon oxide tunneling dielectric 11 form oxide-nitride-oxide discrete charge storage structures of the NAND string. Alternatively, a polysilicon floating gate may be used.

FIG. 5A is a scanning electron microscope (SEM) image that illustrates a cross-section of a vertical NAND memory device. As illustrated in FIG. 5A, the contacts 132 extend from a top surface of a contact region 134 to the gate electrode steps 120 (e.g., a stepped word line pattern) of the control gates 3. As discussed in more detail below, the contacts 132 are made by filling vias formed in an electrically insulating (dielectric) material 124 with an electrically conducting material, such as tungsten, TiN, copper or aluminum or their alloys or silicides. To form the stepped pattern illustrated in FIG. 5A, the control gate electrodes 3 are configured such that a first conductive layer (e.g., a lower layer in the stack of layers) includes a portion that laterally extends past a second conductive layer (e.g., a higher layer in the stack). The contact openings include a first contact opening (e.g., 130A, in FIG. 5B) that extends to the first portion of the first conductive layer (e.g., 120a) and a second contact opening (e.g., 130B in FIG. 5B) extends to an upper surface of the second conductive layer (e.g., 120b). For example, the first conductive layer (e.g., 120a) may be a portion of a first control gate electrode 3 which extends from the device region to the contact region 134 and the second conductive layer (e.g., 120b) may be a portion of a second control gate electrode 3 which extends from the device region to the contact region 134.

FIG. 5B illustrates the problem of shallow side over etching with the conventional method of making the multi-level contact of FIG. 5A discussed above. In the conventional method, the control gate steps 120 are covered with a stack of layers of dielectric (electrically insulating) materials. The first dielectric layer is a conformal etch stop layer 122. The conformal etch stop layer 122 may be made of any suitable material, such as silicon nitride. The conformal etch stop layer 122 is covered with a second dielectric layer 124, made of a different material than layer 122. The second dielectric material may be made of any suitable material including oxides, such as silicon oxide (e.g., $SiO_2$). The second dielectric layer 124 is not conformal. That is, the thickness (h1, h2, h3, h4 . . . hi) of the dielectric layer 124 varies over each step 120 such the upper surface 124a of the second dielectric layer 124 is the same distance from the substrate 100 over all of the steps 120. A third dielectric layer, sacrificial barrier layer 126, is deposited over the second dielectric layer 124. The sacrificial barrier layer 126 may be made of any suitable material, such as silicon nitride (e.g., preferably the same material as conformal etch stop layer 122 but a different from material the second dielectric layer 124). A fourth dielectric layer 128 is then deposited over the sacrificial barrier layer 126. The fourth dielectric layer 128 may be made of any suitable material including oxides, such as silicon oxide, (e.g., $SiO_2$).

To make the contacts to the control gate steps 120, openings 130A-130E are etched from the top surface 128a of the fourth dielectric layer 128 through the fourth dielectric layer 128, the sacrificial barrier layer 126 and the second dielectric layer 124. Typically, the fourth dielectric layer 128 and the sacrificial barrier layer 126 are non-selectively etched (i.e., etched with an etchant that etches all materials at essentially the same rate) in a first etching step. Then the second dielectric layer 124 is selectively etched (i.e., etched with an etchant that etches one material (e.g. the second dielectric material 124) substantially faster (e.g., 2-10× or more faster) than the underlying material (e.g., etch stop layer 122)) so that the openings stop on the etch stop layer 122.

However, when etching the openings 130A-130E, it is not uncommon that the shallower openings (e.g., 130E, 130D, 130C) will penetrate the etch stop layer 122 prior to the longer openings (e.g. 130A) reaching the etch stop layer 122. This especially problematic as the number of levels (steps) increases. The number of levels in a multilevel memory device, such as a multi-level NAND device, is unlimited and may include, for example, 2-256 levels, such as 4-128 levels such as, 8-64 levels, such as 16-32 levels. The contacts are completed by depositing an electrically conducting material, such as Cu, Al, their alloys or a silicide (e.g., Ti, Ni or Co silicide) into the openings 130A-130E.

Figure 6:
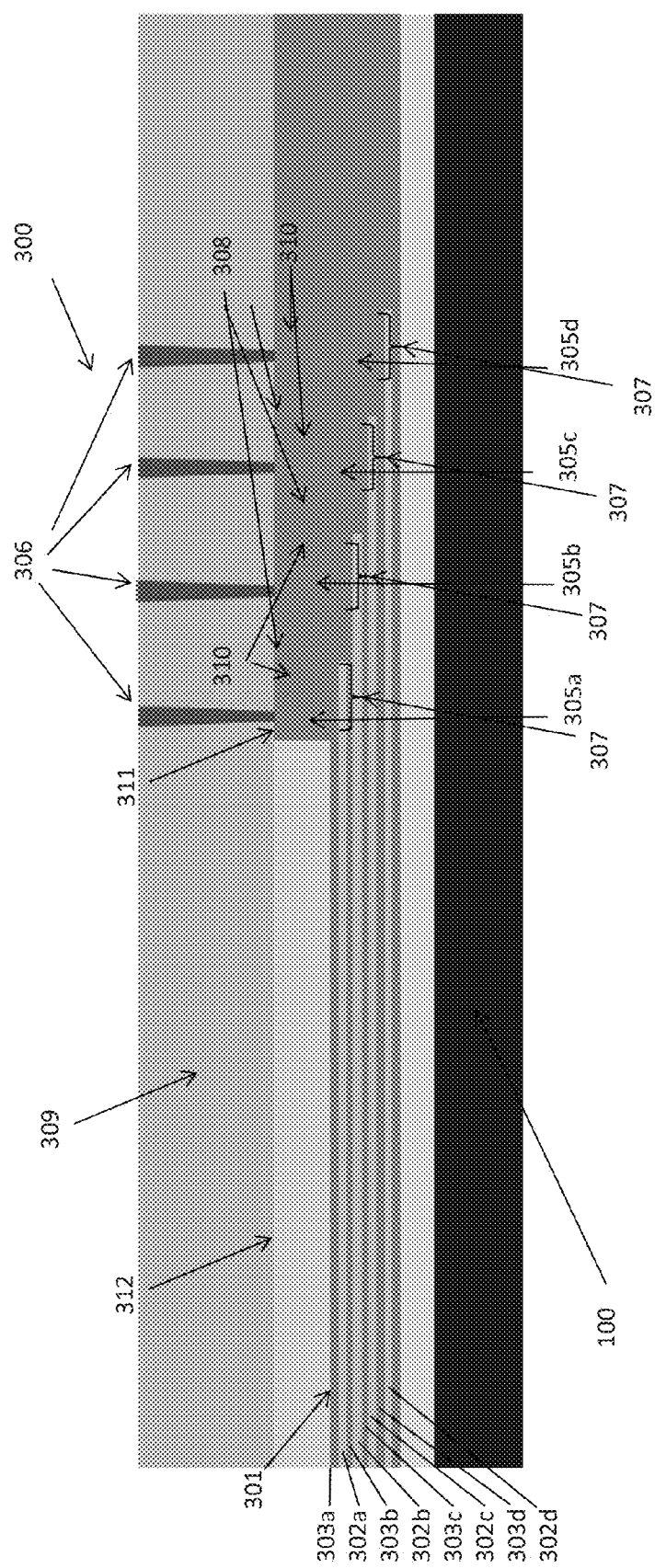
FIG. 6 is a schematic illustration of a multi-level contact according to an embodiment.

FIG. 6 is a schematic illustration of a first embodiment of a multi-level contact in a device. In some embodiments, the multi-level contact advantageously avoids some or all of the difficulties described above with respect to conventional contact techniques.

The device includes at least one device region (not shown) and at least one contact region 300. The contact region 300 has a stack 301 of an alternating plurality of electrically conductive layers 302a, 302b, 302c and 302d and plurality of electrically insulating layers 303a, 303b, 303c, and 303d located over a substrate 100. Although a stack 301 having four conductive layers is shown, in other embodiments any suitable number of conductive layers may be used, e.g., 2, 3, 4, 5, 6, 7, 8, or more layers. Some embodiments may include 2-256 layers, such as 4-128 layers, such as, 8-64 layers, such as 16-32 layers, In some embodiments, the conductive layers 302a, 302b, 302c and 302d extend past the left side of the illustration, to provide electrical connections to respective levels in a multi-level device in the device region (e.g., underlying insulating layer 312 outside of the contact region 300). For example, in some embodiments the conductive layers 302a-302d may comprise or be in electrical contact with word lines (e.g., control gates) of a NAND device or the electrodes (e.g., word lines) of a ReRAM device.

The plurality of electrically conductive layers 302a-302d form a stepped pattern in the contact region. Each respective electrically insulating layer of the layers 303a-303d includes a sidewall. For each insulating layer 303a-303d, a respective underlying electrically conductive layer 302a-302d in the stack 301 extends laterally beyond the sidewall. A respective electrically conductive sidewall spacer 305 is located adjacent to the sidewall of each electrically insulating layer 303a-303d. Each sidewall spacer 305a-305d is in electrical contact with the electrically conductive layer underlying the respective electrically insulating layer and is substantially electrically isolated from the other electrically conductive layers in the plurality of electrically conductive layers in the stack. For example, as show, the leftmost sidewall spacer 305a is in electrical contact only with the electrically conductive layer 302a, the second leftmost sidewall spacer 305b is in electrical contact with only electrically conductive layer 302b, and so forth.

In some embodiments, each of the sidewall spacers 305a-305d extends vertically past a set of the electrically conductive layers 302a-302d in the stack 301 which overlay the respective electrically insulating layer. In some embodiments, e.g., as shown, each of the plurality of sidewall spacers 305a-305d contacts a contact portion 307 of a respective one of the electrically conductive layers 302a-302d corresponding to the stepped pattern. The contact portion 307 extends laterally past any overlaying electrically conductive layers in the stack 301. This ensures that the top of each sidewall spacer 305 is clear of the stack 301 and available for contact with via connections 306, as described in detail below.

In some embodiments, an electrically insulating fill material 308 substantially fills a lateral space between each pair of laterally adjacent sidewall spacers (e.g., spacers 305a and 305b, spacers 305b and 305c, etc.). As shown, the electrically insulating fill material 308 in the contact region may have a flat top exposing tops of the sidewall spacers 305.

In some embodiments, an overlaying insulating layer 309 is formed over the contact region 300. Electrically conductive via connections 306 extend vertically through the overlaying insulating layer 309 to make electrical contact with the plurality of sidewall spacers 305a-305b. In some embodiments, each of the plurality of sidewall spacers 305a-305b extends laterally past the via connection 306 at a location where the via connection contacts the sidewall spacer 305a-305b. In some embodiments, each of the plurality of sidewall spacers 305 has a lateral cross sectional area that is greater than a lateral cross sectional area of the via connection 306 at the location 311 where the via connection 306 contacts the sidewall spacer 305. In some embodiments, each of the sidewall spacers 305a-305d has a lateral cross sectional area that is at least 1.5 times, such as at least 2 times, such as at least 3 times, such as at least 5 times the lateral cross sectional area of the via connection 306 at the location 311 where the via connection 306 contacts the sidewall spacer 305. In some embodiments, each of the sidewall spacers 305 has a lateral cross sectional area that is in the range of greater than 1 to 100 times the lateral cross sectional area of the via connection 306 at the location 311 where the via connection 306 contacts the sidewall spacer 305, or any sub-range thereof.

This configuration may be advantageous, as it may prevent loss of contact even in cases where the via connection 306 is misaligned with sidewall spacer 305 (e.g., due to errors during fabrication). That is, in some embodiments, the relatively wide top of the sidewall spacer presents a relatively large lateral target for the via connection. Similarly, because the sidewall spacers 305a-305d may be vertically thicker than the conductive layers 302a-302d, the risk of via over penetration through the sidewall spacer to an underlying conductive layer is reduced. For example, in some embodiments, each sidewall spacer 305 has a vertical thickness of at least 1.5 times, such as at least 2.0 times, such as at least 5.0 times, such as at least 10 times the thickness of the conductive layer it contacts. In some embodiments, each sidewall spacer 305 has a vertical thickness in the range of greater than 1 to 100 times the thickness of the respective conductive layer 302 it contacts, or any sub-range thereof.

In the embodiments shown, each of the sidewall spacers 305 has a substantially L-shaped vertical cross section including an upper arm extending substantially vertically from a side of a substantially horizontal lower base arm. In some embodiments, a filler material 310 fills a space defined by the L-shaped vertical cross section between and adjacent to the upper arm and the lower base arm. This filler material may be of the same type or a different type from fill material 308. However, in some embodiments, this particular L-shape may be omitted for some or all of the sidewall spacers (e.g., as shown in FIG. 8 below).

As previously mentioned, the conductive layers 302a, 302b, 302c and 302d extend past the left side of the illustration, to provide electrical connections to respective levels in a multi-level device in the device region. In some embodiments the multi-level device is a memory device, such as a vertical NAND device or a ReRAM device.

For example, the multi-level device may be a NAND device such as the monolithic three-dimensional NAND string 180 shown in FIGS. 1A-3B. Electrically conductive layers 302a-302d in the stack 301 may each include or are electrically connected to, e.g., a word line of the NAND device.

For example, in some embodiments, the NAND device may include a plurality of semiconductor channels (e.g., semiconductor channel 1 of NAND string 180), where at least one end portion of each of the plurality of semiconductor channels extends substantially perpendicular to a major surface of the substrate 100. The NAND device may include a plurality of charge storage regions, each charge storage region located adjacent to a respective one of the plurality of semiconductor channels (e.g., discrete charge storage segments 9 of the NAND string 180). The NAND device may also include a plurality of control gate electrodes (e.g., electrodes 3/302) having a strip shape extending substantially parallel to the major surface of the substrate, where the plurality of control gate electrodes include at least a first control gate electrode located in the first device level and a second control gate electrode located in the second device level (e.g., control gate electrodes 3a and 3b of the NAND string 180 shown in FIGS. 1B and 2B). In some embodiments, a first one (e.g., conductive layer 302a) of the plurality of electrically conductive layers 302a-302d in the stack 301 is in electrical contact with the first control gate electrode 3a and extends from the device region to the contact region 300 and a second one (e.g., conductive layer 302b) of the plurality of electrically conductive layers 302a-302d in the stack 301 is in electrical contact the second control gate electrode 3b and extends from the device region to the contact region 300.

As discussed above with reference to FIG. 4, in some embodiments, a ReRAM device may include one or more vertical stacks of word line electrodes $WL_{zy}$. In some embodiments, a first one (e.g., conductive layer 302a) of the plurality of electrically conductive layers 302a-302d in the stack 301 is in electrical contact with a world line electrode (e.g., $WL_{11}$) and extends from the device region to the contact region 300 and a second one (e.g., conductive layer 302b) of the plurality of electrically conductive layers 302a-302d in the stack 301 is in electrical contact the a second word line electrode (e.g., $WL_{21}$) and extends from the device region to the contact region 300.

FIGS. 7A-7K illustrate a method of making a multi-level contact in a device shown in FIG. 6.

Figure 7A:
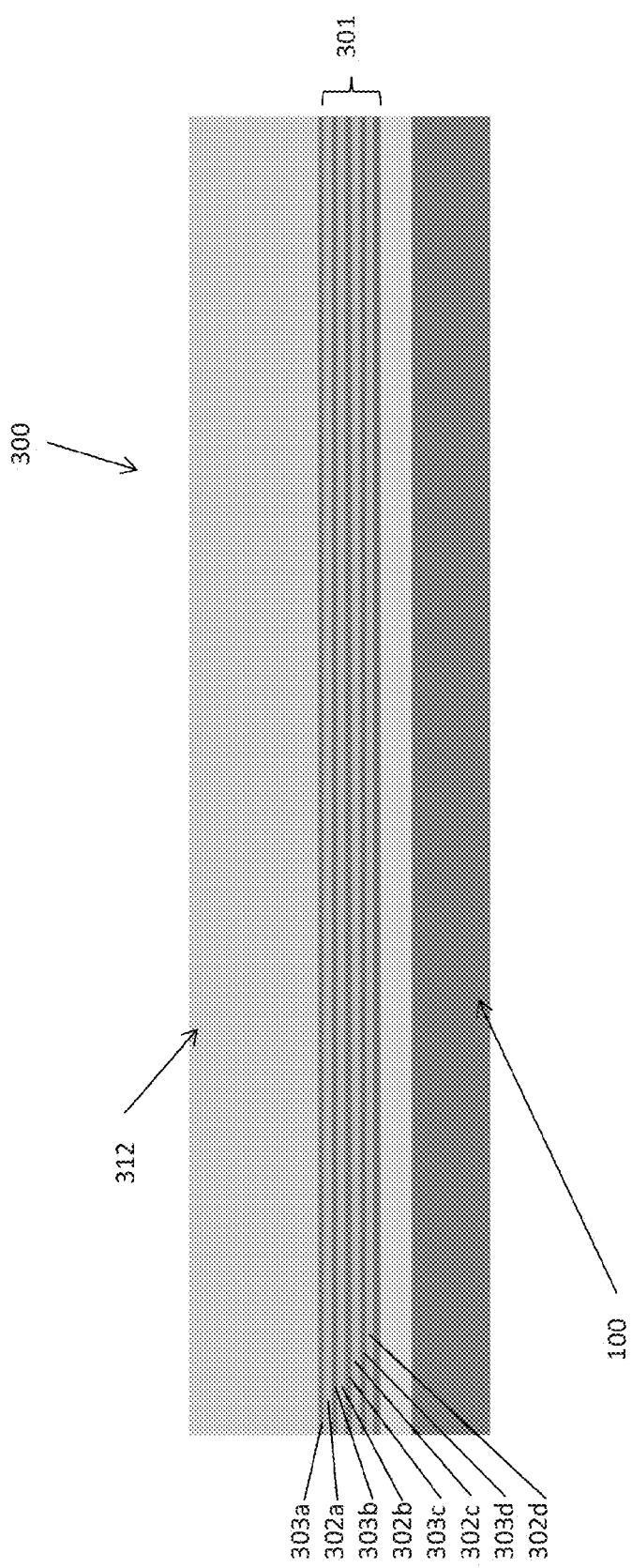

As shown in FIG. 7A, an in-process multilevel device is provided including at least one device region (not shown) and at least one contact region 300 located over a substrate 100. The contact region includes a stack 301 of a plurality of alternating electrically insulating layers 303a-303d and electrically conductive layers 302a-302d. Each respective electrically insulating layer (e.g., 303d) is located on a respective electrically conductive layer (e.g., 302d) to isolate the respective electrically conductive layer from any overlaying electrically conductive layers in the stack (e.g., layers 302a-302d).

The conductive layers 302a-302d may be made from any suitable conductive material including a metal, a metal alloy, a metal silicide, or a highly doped semiconductor (e.g., W, $WSi_x$, WN, Ti, TiN, doped polysilicon, etc.). The insulating layers 303a-303d may be made from any suitable insulating material including, for example, an oxide (e.g., silicon oxide, $Al_2O_3$, $HfO_2$, etc.). Although four alternating layers are shown in stack 301, as noted above, any other suitable number may be used.

Figure 7B:
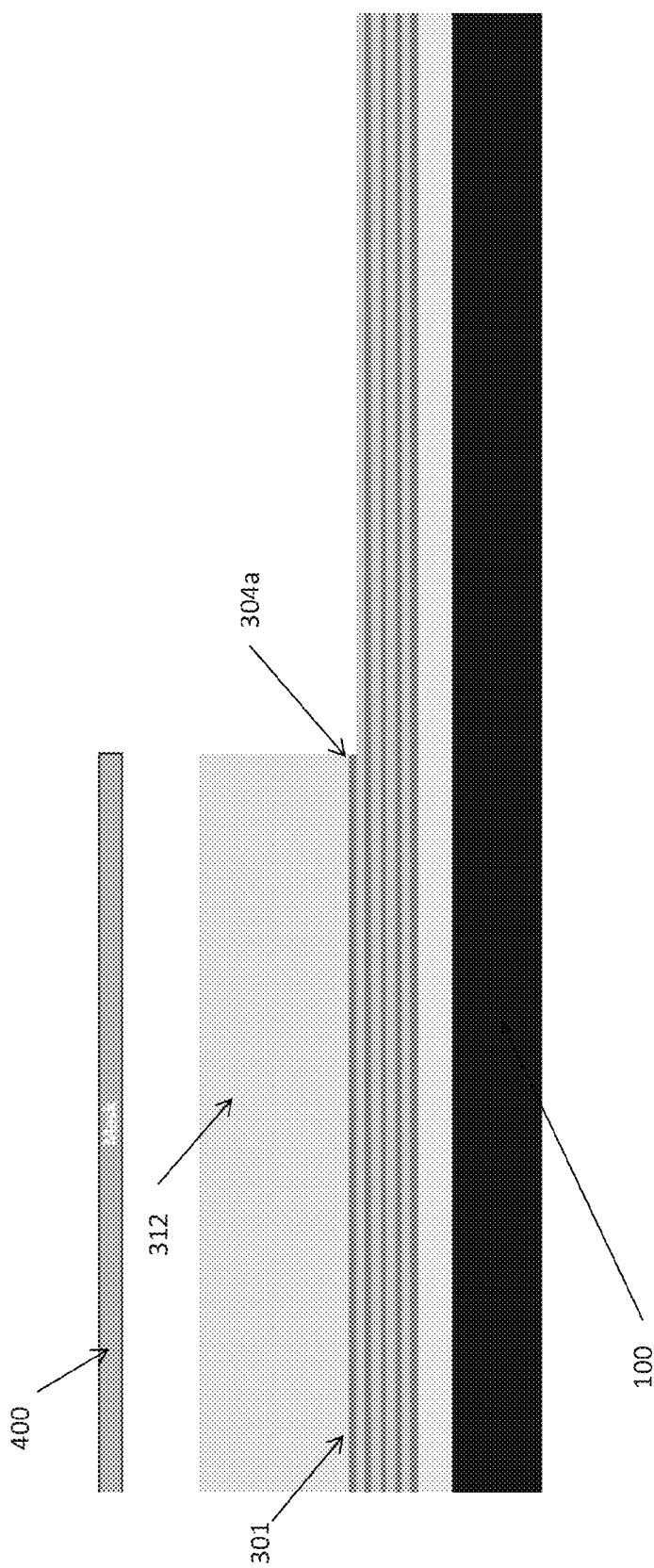

Referring to FIG. 7B, layer 312 (e.g., an insulating layer) may be optionally formed over the stack 301. A mask 400 is formed over a portion of layer 312 and over the stack 301 in the contact region 300. A portion layer 312 and of an upper most first electrically insulating layer 303a in the stack that is not covered by the mask layer 400 is removed (e.g., using any suitable etching process) to expose a portion of an underlying first electrically conductive layer 302a such that the exposed portion of the underlying first electrically conductive layer extends laterally past a first sidewall 304 formed in the uppermost first electrically insulating layer 303a.

In various embodiments, any suitable technique may be used to form the mask 400 including, e.g., photolithographic techniques. The mask 400 may include a photoresist material or a hard mask (e.g., C, SiN, $SiO_2$, a metal, etc).

Referring to FIG. 7C a first conformal layer of electrically conductive material 501a on the first sidewall 304a and on the exposed portion of the underlying first electrically conductive layer 302a in the stack 301. The layer 501a may also be formed on the sidewall of the optional layer 312. Optionally, a first electrically insulating conformal liner layer may 502a be formed over the first conformal layer of electrically conductive material 501a. The liner layer 502a may be made from, for example, any suitable insulating material including, for example, an oxide (e.g., silicon oxide, $Al_2O_3$, $HfO_2$, etc.) or nitride (e.g., silicon nitride). As described below, use of the liner layer 502a will result in a finished structure of the type shown in FIG. 6 featuring sidewall spacers 305 having an L-shape. In contrast, omitting the liner layer 502a will result in a finished structure of the type shown in FIG. 8 featuring sidewall spacers 305 lacking an L-shape.

In various embodiments the layers 501a and or 502a may be formed using any suitable conformal deposition process including plating, chemical vapor deposition, physical vapor deposition, or atomic layer deposition.

Figure 7D:
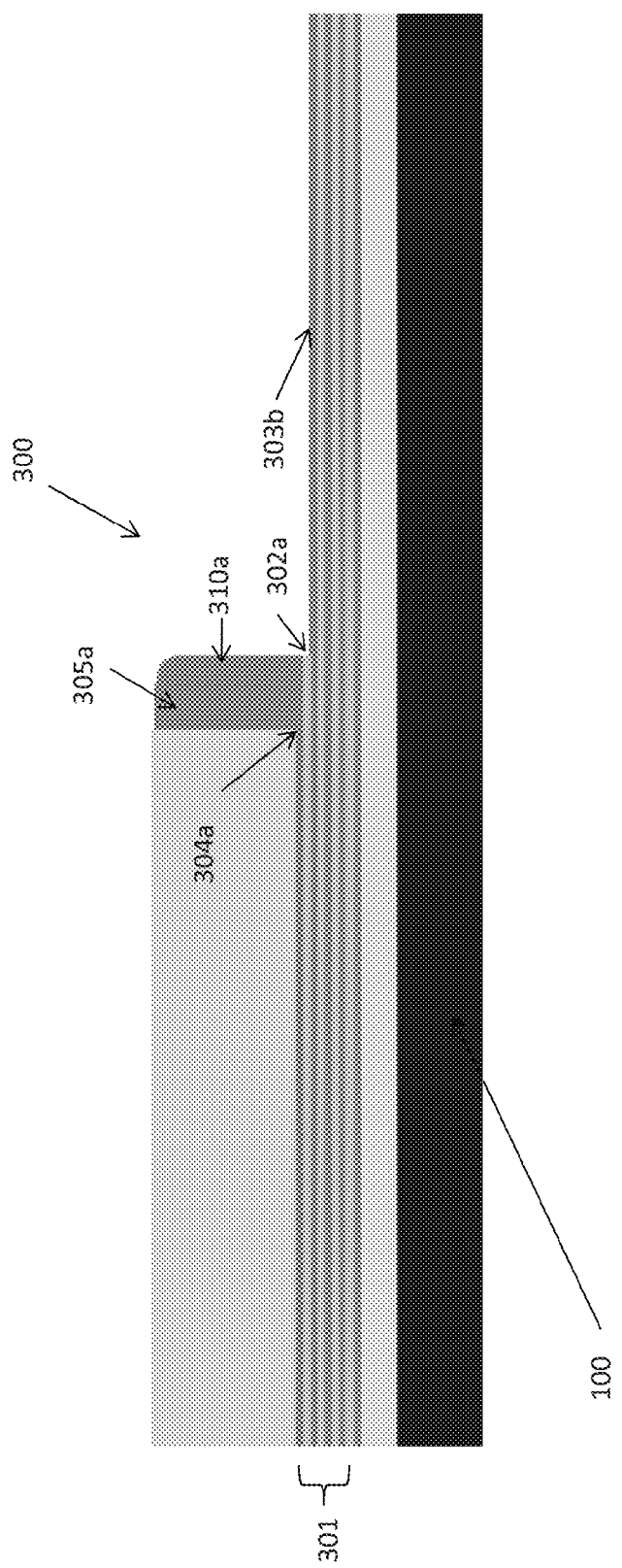

Referring to FIG. 7D, the device is etched to form a first electrically conductive sidewall spacer 305a adjacent to the first sidewall 304a and to expose a portion of a second electrically insulating layer 303b under the first electrically conductive layer 302a. The exposed portion extends laterally past the first electrically conductive sidewall spacer 305. Accordingly a step pattern begins to form in the contact region 300. In some embodiments, the first liner layer 502a may be etched to remove substantially all of the layer except for a first vertical spacer portion 310a in contact with the first electrically conductive sidewall spacer 305a.

Figure 7E:
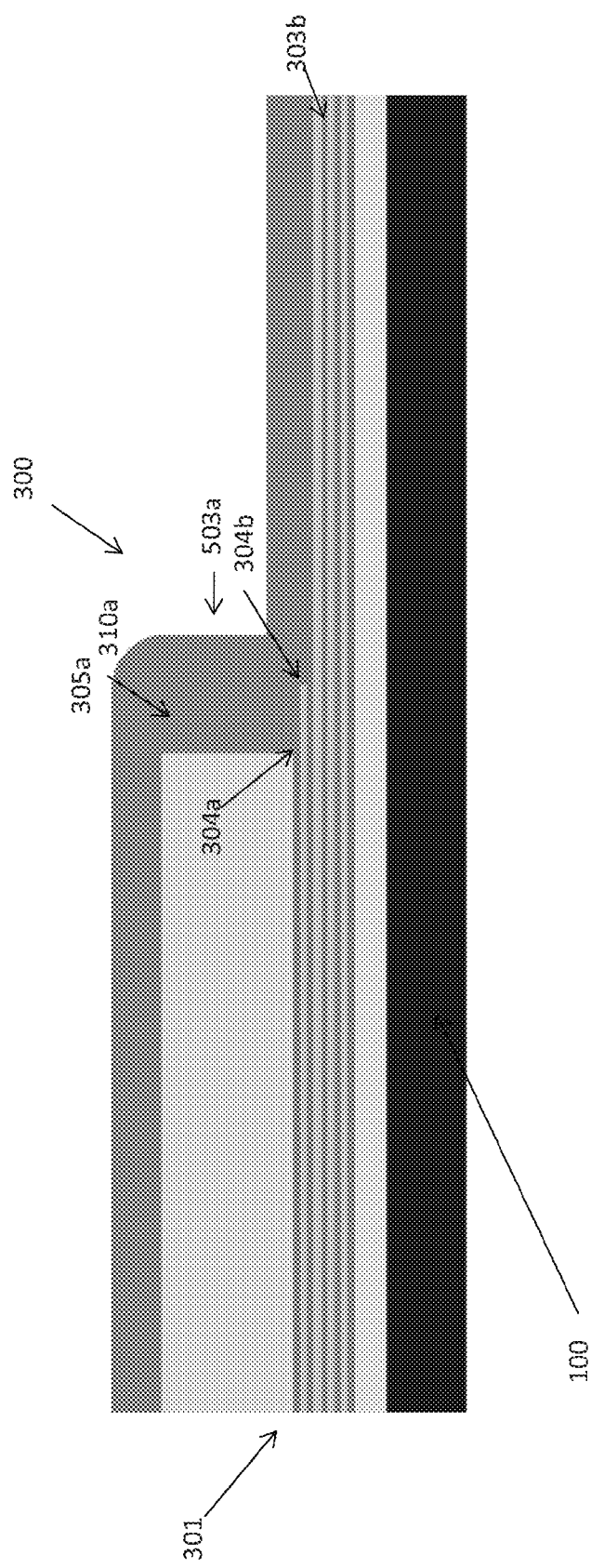

Referring to FIG. 7E, a first conformal insulating layer 503a of electrically insulating material over the first electrically conductive sidewall spacer 305a and the exposed portion (e.g., sidewall 304b) of the second electrically insulating layer 303b. In various embodiments the layer 503a may be formed using any suitable conformal deposition process including chemical vapor deposition, physical vapor deposition, or atomic layer deposition.

Figure 7F:
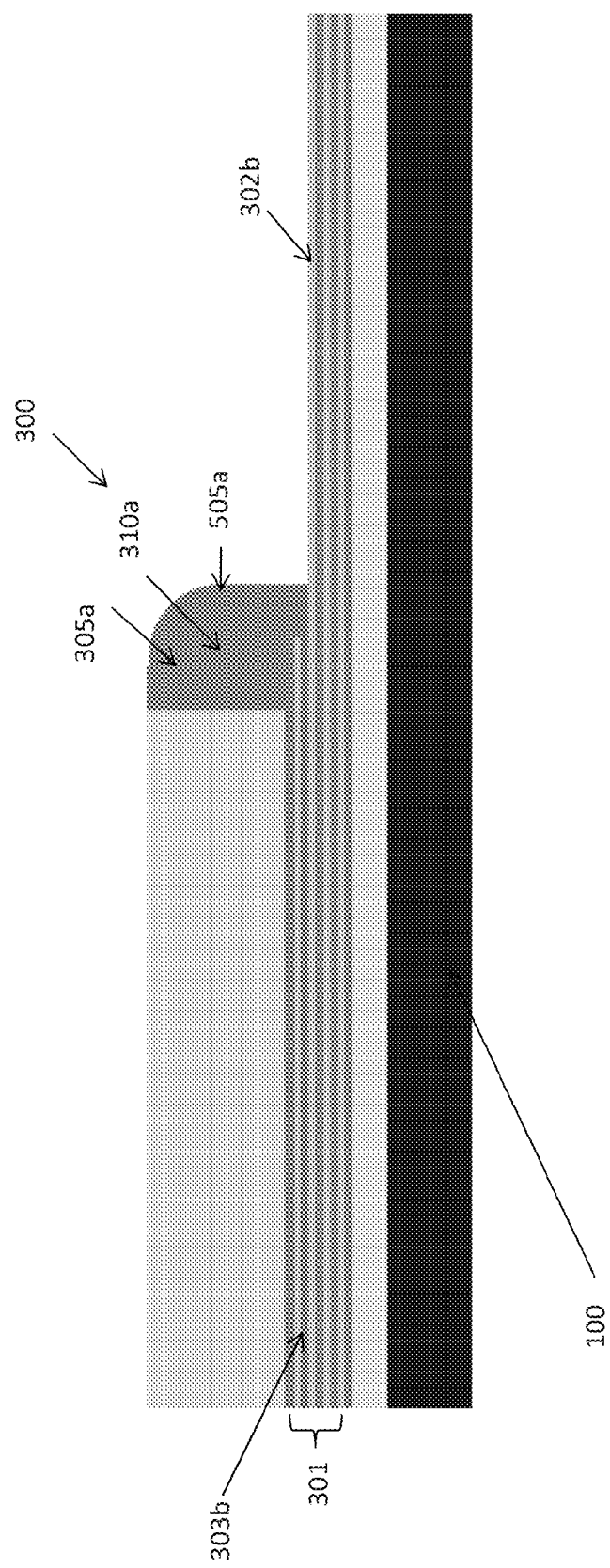

Referring to FIG. 7F, the device is etched to form a first electrically insulating sidewall spacer 505a adjacent to the first electrically conductive sidewall spacer 305a, and to expose a portion of a second electrically conductive layer 302b underlying the second electrically insulating layer 303b. In embodiments where a first liner layer 502a is used, the conductive sidewall spacer 305a and the removing substantially all of the first liner layer except for a first vertical spacer portion 310a are formed in the same step and the insulating sidewall spacer 510a is formed in a separate step.

Figure 7G:
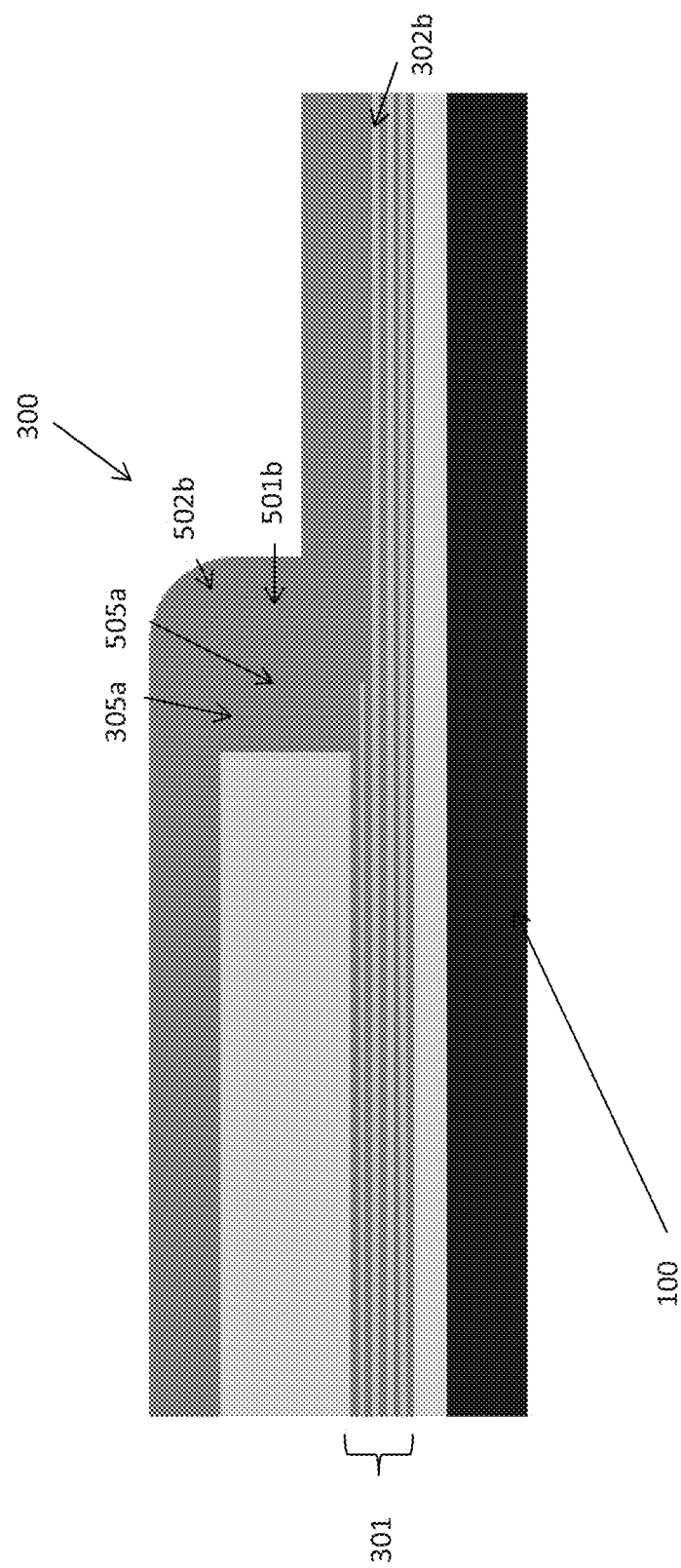

Referring to FIG. 7G, a second conformal layer of electrically conductive material 501b is formed over the electrically conductive sidewall spacer 305a, the electrically insulating sidewall spacer 505a, and the exposed portion of second electrically conductive layer 302b. Optionally, a second electrically insulating conformal liner 502b may be formed over the second conformal layer of electrically conductive material 501b.

Figure 7H:
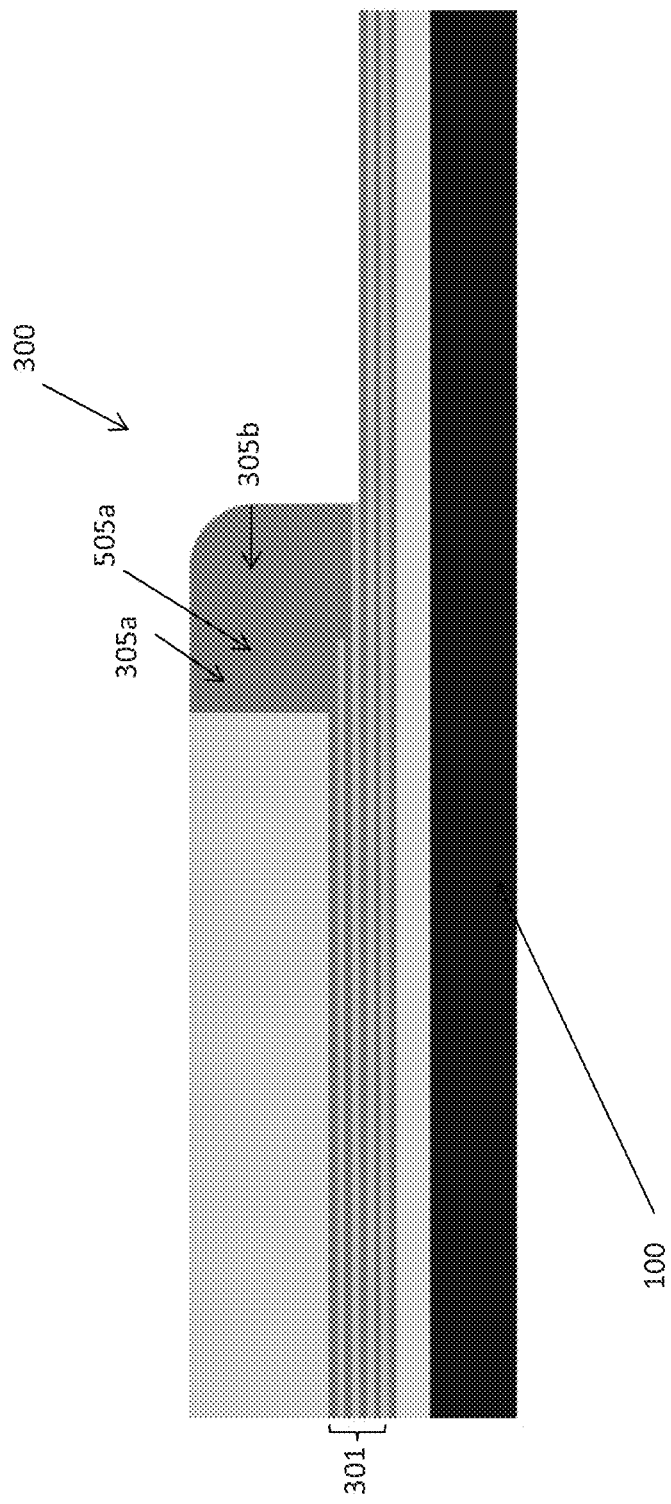

Referring to FIG. 7H, the device is etched to form another electrically conductive sidewall spacer 305b (and optional vertical filler 310b) adjacent to the electrically insulating sidewall spacer 505a. In the resulting structure, each electrically conductive sidewall spacer 305 is in electrical contact with only a respective one of the electrically conductive layers 302a-30d in the stack 301. As shown, the leftmost electrically conductive sidewall spacer 305a is in electrical contact with only electrically conductive layers 302a, while the rightmost electrically conductive sidewall spacer 305b is in electrical contact with only electrically conductive layers 302b.

Figure 7I:
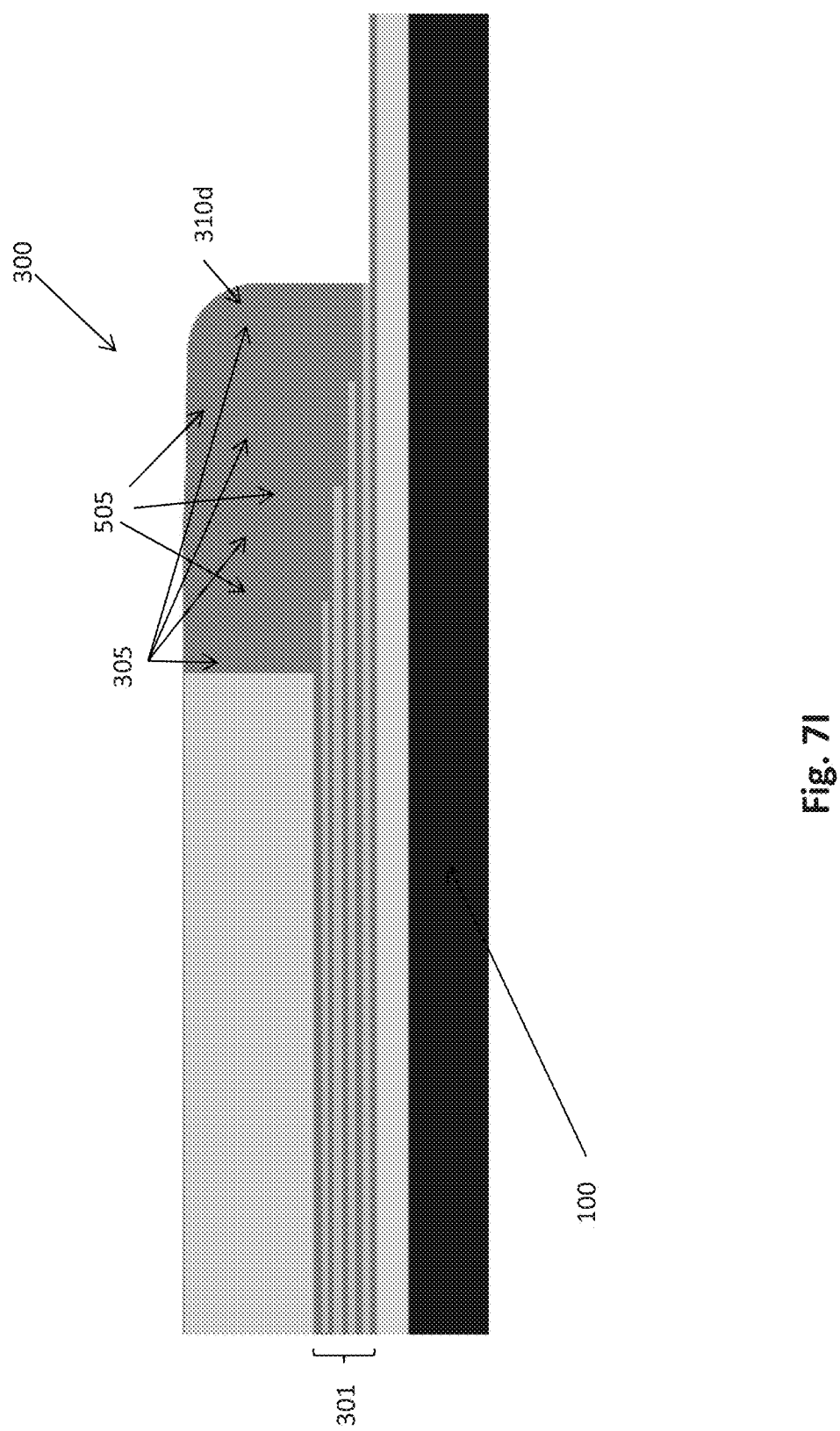

Referring to FIG. 7I, the process shown in FIGS. 7C-7G can be iteratively repeated to produce additional electrically conductive sidewall spacers 305c and 305d each in electrical contact with only a respective one of the electrically conductive layers 302a-302d in the stack 301. As shown, four electrically conductive sidewall spacers 305 are formed, corresponding to the four conductive layers 302a-302d in the stack 301. However, in other embodiments, any suitable number may be used. As shown four insulating spacers 505 and four optional vertical filler portions 310 are provided. However, in other embodiments, any suitable number may be used. Advantageously, in some embodiments, no additional masking steps (e.g., photolithographic masking) are required during this iterative process.

Figure 7J:
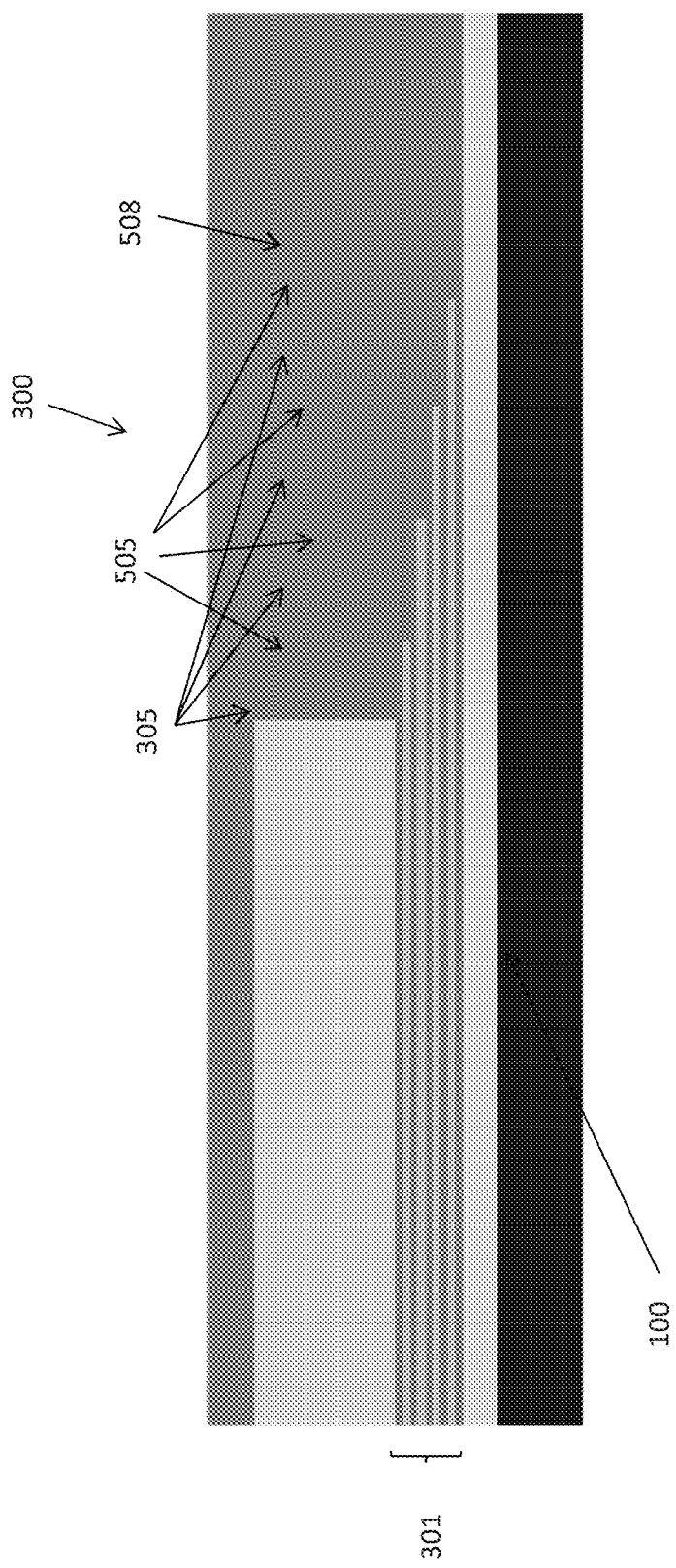

Referring to FIG. 7J, an electrically insulating fill layer 508 is formed over the device, and the fill layer 508 is polished (e.g., using chemical mechanical polishing) to expose an upper surface of each of the electrically conductive sidewall spacers 305. This step may form layer 308 from the planarized fill layer 508 and the insulating sidewall spacers 505 (and optional vertical fill portions 310). In various embodiments the fill layer 508 may include the same material as spacers 505 and 310, or different material.

Figure 7K:
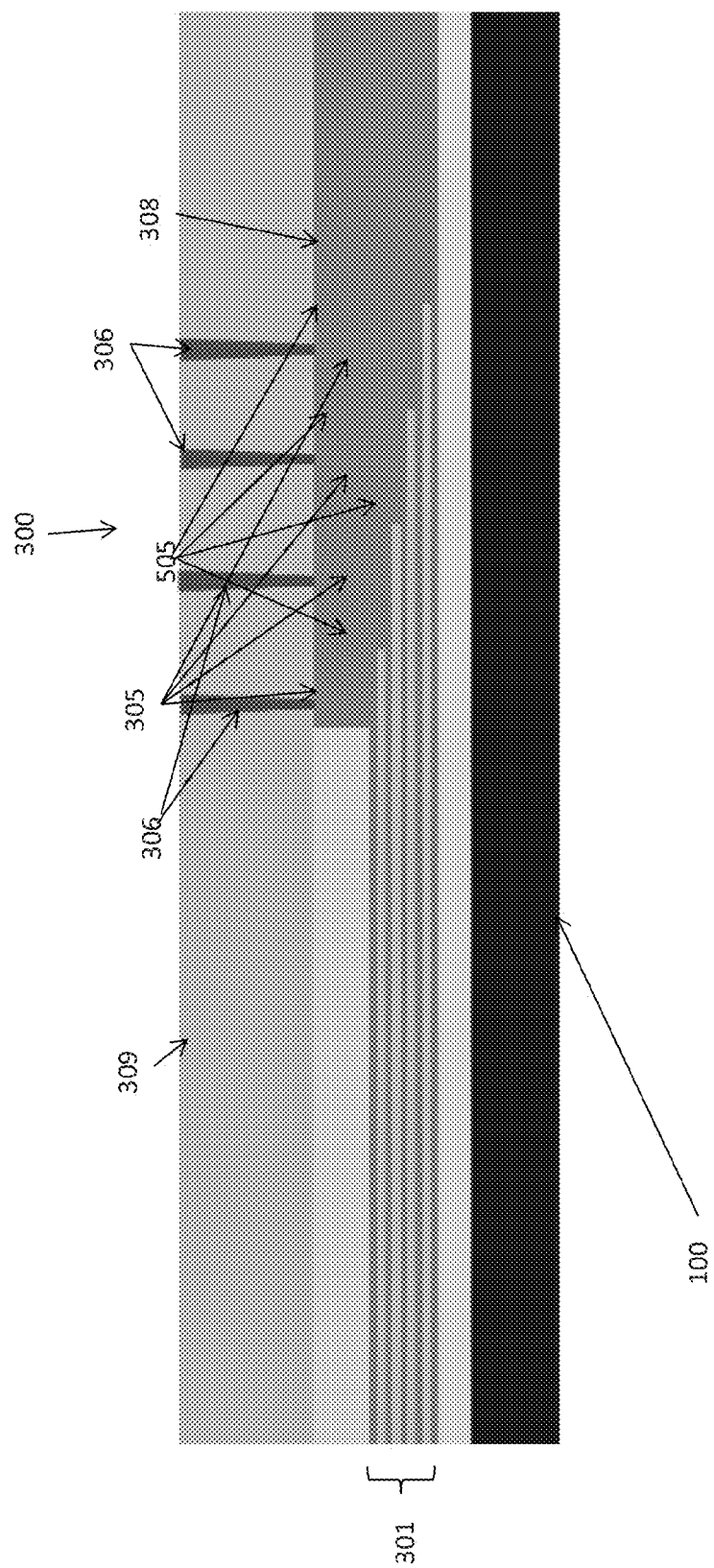

Referring to FIG. 7K, an overlaying insulating layer 309 is formed over the fill layer 308, and via connections 306 are formed extending vertically through the overlaying insulating layer 309 to make electrical contact with at least one of the electrically conductive sidewall spacers 305. The via connections 306 may be formed using any suitable technique, e.g., using lithographic patterning and etching to create holes in layer 309 which are then filled with electrically conductive material. The resulting structure is equivalent to that shown in FIG. 6.

FIG. 8 shows an alternate embodiment of a multi-level contact. The multi-level contact is nearly identical to the structure shown in FIG. 6. However, the conductive sidewall spacers 305 do not have an L-shape. As described above, this may be the result of omitting the use of a liner layers 502 and resulting vertical fill portions 310 during the fabrication of each spacer 305. As will be apparent to one skilled in the art in view of this disclosure, various embodiments may use any combination of L-shaped and non-L-shaped conductive sidewall spacers 305.

Referring to FIGS. 9A and 9B, an exemplary structure according to an embodiment of the present disclosure is shown. A stack including an alternating plurality of electrically conductive layers (46a-46h) and electrically insulating layers (32a-32h) is formed over a substrate 100. Optionally, an intermediate layer 20 can be formed on the top surface of the substrate 100 prior to formation of the stack including an alternating plurality of electrically conductive layers (46a-46h) and electrically insulating layers (32a-32h). The intermediate layer 20 can be a dielectric material layer, and/or can include at least one semiconductor device such as select gate transistors. In an illustrative example, the electrically conductive layers (46a-46h) can be the same as the electrically conductive electrodes 3 illustrated in FIGS. 1A, 1B, 2A, 2B, and 3, or can be the same as the electrically conductive layers 302a, 302b, 302c and 302d illustrated in FIG. 6. The electrically insulating layers (32a-32h) can be the same as the electrically insulating layers that are located between the electrically conductive electrodes 3 illustrated in FIGS. 1A, 1B, 2A, 2B, and 3, or can be the same as the plurality of electrically insulating layers 303a, 303b, 303c, and 303d illustrated in FIG. 6. A plurality of memory stack structures (not shown) can be present through the alternating plurality of electrically conductive layers (46a-46h) and electrically insulating layers (32a-32h).

As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of electrically insulating layers and electrically conductive layers may begin with an instance of the electrically insulating layers or with an instance of the electrically conductive layers, and may end with an instance of the electrically insulating layers or with an instance of the electrically conductive layers. In one embodiment, an instance of the first elements and an instance of the second elements may form a unit that is repeated with periodicity within the alternating plurality.

A hard mask layer 50 can be formed over the top surface of the alternating plurality of electrically conductive layers (46a-46h) and electrically insulating layers (32a-32h). The hard mask layer 50 can include a dielectric material or a metallic material. In one embodiment, the material of the hard mask layer 50 can be different from the materials of the electrically conductive layers (46a-46h) and electrically insulating layers (32a-32h). In an illustrative example, the electrically conductive layers (46a-46h) can include a metallic material, the electrically insulating layers (32a-32h) can include silicon oxide, and the hard mask layer 50 can include silicon nitride or a dielectric metal oxide. The thickness of the hard mask layer 50 can be in a range from 30 nm to 1,000 nm, although lesser and greater thicknesses can also be employed.

During subsequent processing steps, a recessed region can be formed through portions of the hard mask layer 50 and the alternating plurality of electrically conductive layers (46a-46h) and electrically insulating layers (32a-32h) by sequentially performing multiple combinations of a lithographic patterning process and an etch process. Different patterns are employed for opening in each respective photoresist layer so that the depth of recess in the recessed region differs depending on different overlap patterns among the openings of different photoresist layers.

Referring to FIGS. 10A and 10B, a first photoresist layer 57a can be applied and lithographically patterned over the hard mask layer 50. The pattern of the first photoresist layer 57a is herein referred to as a first pattern. The first pattern includes an opening within a first area. The shape of the first area can have two liner edges that are adjoined to each other. In one embodiment, the shape of the first area can be a rectangle. An anisotropic etch employing the first photoresist layer 57a as an etch mask layer can be performed to form a recessed region 59 extending through the portions of the hard mask layer 40 and M1 number of electrically conductive layer(s) (e.g., 46a, 46b) and M1 number of electrically insulating layer(s) (e.g., 32a, 32b) in regions not covered by the first photoresist layer 57a. M1 is a positive integer. In one embodiment, M1 can be $2^{N1}$, in which N1 is a non-negative integer. In one embodiment, N1 can be a positive integer. While FIGS. 10A and 10B illustrate an embodiment in which N1 is 1, embodiments in which N1 is a different non-negative integer are expressly contemplated herein. The recessed region 59 can be a cavity laterally surrounded by the remaining portions of the alternating plurality of electrically conductive layers (46a-46h) and electrically insulating layers (32a-32h). Top surfaces of an electrically conductive layer 46c can be physically exposed within the recessed region 59.

Referring to FIGS. 11A and 11B, the first photoresist layer 57a can be subsequently removed, for example, by ashing.

Referring to FIGS. 12A-12C, a second photoresist layer 57b can be applied and lithographically patterned over the hard mask layer 50. The pattern of the second photoresist layer 57b is herein referred to as a second pattern. The second pattern includes openings, of which the area is herein collectively referred to as a second area. The second area partially overlaps with the first area and partially overlaps with the complement of the first area. In other words, a first subset of the second area overlaps with the first area, and a second subset of the second area overlaps with a complement of the first area. In one embodiment, the first subset of the second area and the second subset of the second area can be two disjoined areas that are laterally spaced from each other by an area of the second photoresist layer 57b. In one embodiment, each opening in the second photoresist layer 57b can have a shape of a rectangle.

An anisotropic etch employing the second photoresist layer 57b as an etch mask layer can be performed to further recess a portion of the recessed region 59 and to form another recessed region 59 that adjoined a portion of the second photoresist layer 57b that is present within a volume of the recessed region 59 as formed at the processing steps of FIGS. 10A and 10B. The anisotropic etch can etch through a physically exposed portion of the hard mask layer 50 selective to the material of the electrically conductive layers (46a-46h) so that the physically exposed portions of an electrically conductive layer 46c is not completely etched. Subsequently, the anisotropic etch can extend the recessed regions 59 through M2 number of electrically conductive layer(s) (e.g., 46c or 46a) and M2 number of electrically insulating layer(s) (e.g., 32c or 32a) in regions not covered by the second photoresist layer 57b. M2 is a positive integer.

In one embodiment, M2 can be $2^{N2}$, in which N2 is a non-negative integer that is different from N1. In this case, $2^{N2}$ number of electrically conductive layer(s) and $2^{N2}$ number of electrically insulating layer(s) can be etched in regions not covered by the second photoresist layer 57b. In one embodiment, N2 can be a positive integer that is different from N1. In one embodiment, N1 is non-zero and N2 is zero. While FIGS. 12A and 12B illustrate an embodiment in which N2 is 0, embodiments in which N2 is a positive integer are expressly contemplated herein. Each recessed region 59 can be a cavity within the remaining portions of the alternating plurality of electrically conductive layers (46a-46h) and electrically insulating layers (32a-32h). Top surfaces of electrically conductive layers (46c, 46a) located at different levels can be physically exposed within the recessed regions 59. A top surface of an electrically conductive layer (46c, 46a) located at different levels can be physically exposed within each of the recessed regions 59. The second photoresist layer 57b can be subsequently removed, for example, by ashing.

The processes corresponding to FIGS. 12A-12C can be repeated with additional photoresist layers and different numbers (e.g., M3, M4, etc.) of pairs of an electrically insulating layer and an electrically conductive layer, i.e., different numbers (e.g., M3, M4, etc.) of bilayers. Each bilayer includes a vertically adjoining pair of an electrically insulating layer and an electrically conductive layer. In one embodiment, the different numbers of pairs of an electrically insulating layer and an electrically conductive layer can be a non-zero integer power of 2, such as $2^{N3}$, $2^{N4}$, etc. In one embodiment, a multiple combinations of a photolithographic patterning process and an etch process can be employed such that different numbers of pairs of an electrically insulating layer and an electrically conductive layer can be etched within each etch process. In other words, each etch process within the multiple combinations can etch through a different number of electrically insulating layers and a different number of electrically conductive layers. In one embodiment, the number of etched electrically insulating layers can be the same as the number of etched electrically conductive layers at each etch process at any physically exposed portion of the recessed regions 59. In one embodiment, the numbers of electrically insulating layers that that are etched through per etch process within the multiple combinations include at least 1, 2, and 4. The numbers of electrically conductive layers that that are etched through per etch process within the multiple combinations include at least 1, 2, and 4

Figure 13C:
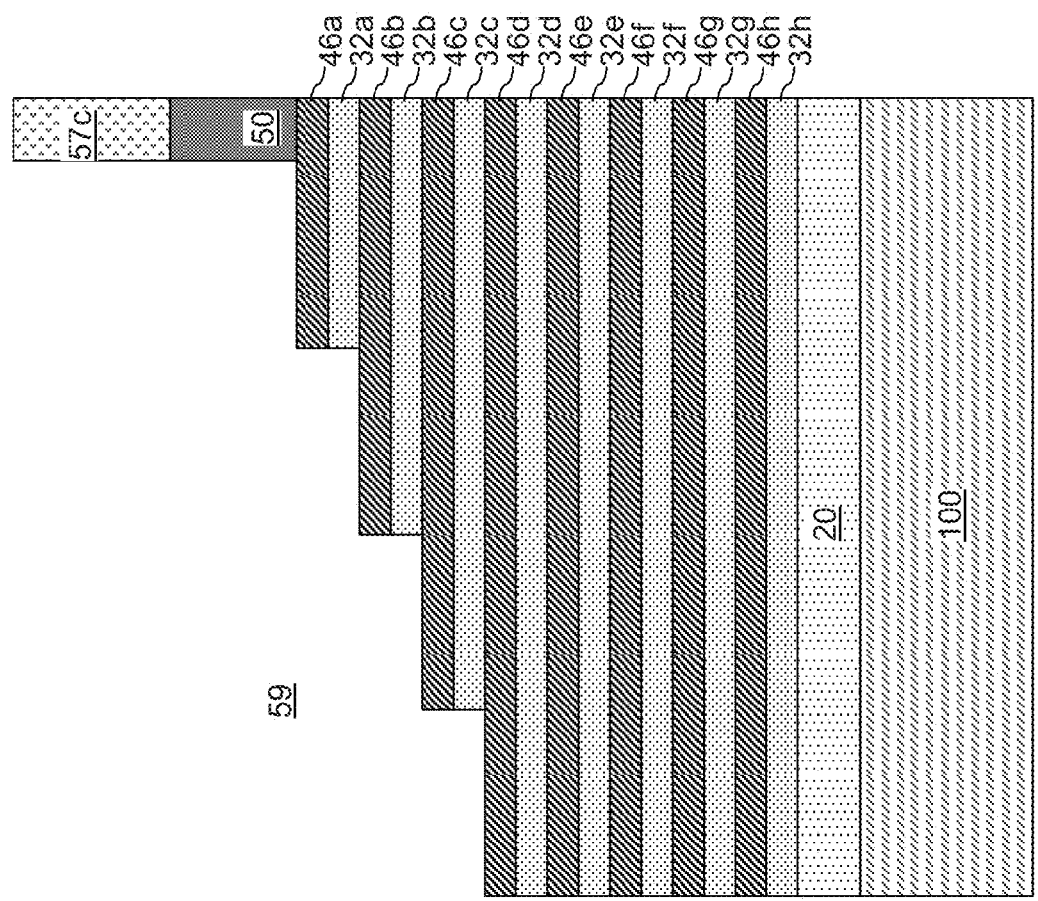
FIG. 13C is a vertical cross-sectional view of the exemplary structure along the vertical plane C-C' of FIG. 13B.

Referring to FIGS. 13A-13C, a photoresist layer, which is herein referred to as a third photoresist layer 57c, can be applied and lithographically patterned over the hard mask layer 50. The pattern of the third photoresist layer 57c is herein referred to as a third pattern. In one embodiment, the third pattern can include an opening, of which the area can include all of the areas of openings in the photoresist layers that are previously applied and patterned over the hard mask layer. Specifically, the area of the opening in the third photoresist layer 57c can include the union of the first area, the second area, and any other area in which a top surface of an electrically conductive layer (46a-46h) is physically exposed previously. Further, the area of the opening in the third photoresist layer 57c includes an additional area that adjoins the union of the various areas.

An anisotropic etch employing the third photoresist layer 57c as an etch mask layer can be performed to etch through a single electrically conductive layer (e.g., 46c, 46a, or 46a) and a single electrically insulating layer (e.g., 32c, 32b, or 32a) in regions not covered by the third photoresist layer 57c. Subsequently, a physically exposed portion of the hard mask layer 50 can be removed selective to the material of the electrically conductive layers (46a-46h) so that a top surface of the topmost electrically conductive layer 46a is physically exposed. The third photoresist layer 57c can be subsequently removed, for example, by ashing. In one embodiment, the various recessed regions 59 can be merged into a single recessed region 59.

The set of electrically conductive layers (46a-46d) having top surfaces that are physically exposed to the recessed region 59 is herein referred to as a first set of electrically conductive layers (46a-46d). The first set of electrically conductive layers (46a-46d) forms a first set of stepped surfaces. As used herein, a "set of stepped surfaces" refers to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. In one embodiment the height of the physically exposed surfaces of the first set of electrically conductive layers (46a-46d) can increase along one lateral direction, e.g., along the direction from a region that overlies a physically exposed surface of the bottommost electrically conductive layer 46d within the first set to a region that overlies a physically exposed surface of the topmost electrically conductive layer 46a within the first set. Top surfaces of electrically conductive layers (46a-46d) located at different levels can be physically exposed within the recessed regions 59.

Figure 14C:
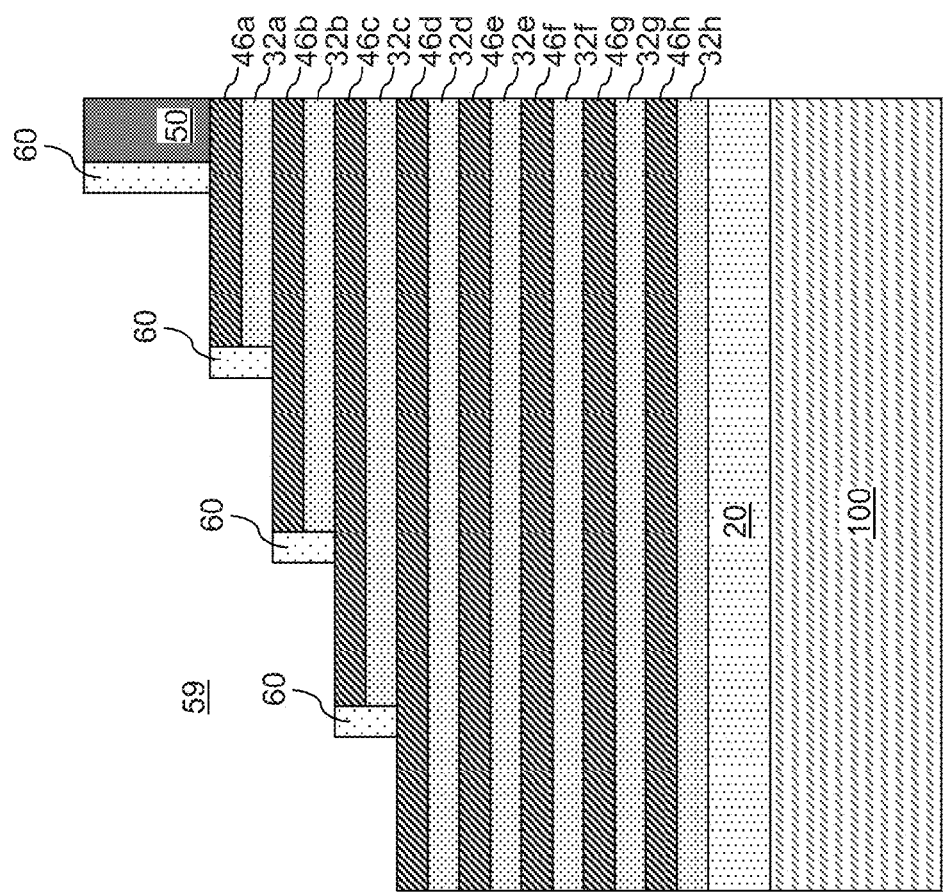
FIG. 14C is a vertical cross-sectional view of the exemplary structure along the vertical plane C-C' of FIG. 14B.

Referring to FIGS. 14A-14C, a first dielectric material layer can be conformally deposited on the physically exposed surfaces of the first set of electrically conductive layers (46a-46d), on physically exposed sidewalls of electrically insulating layers (32a, 32b, 32c), and on surfaces of the hard mask layer 50. The first dielectric material layer includes a dielectric material, which can be silicon oxide, silicon nitride, organosilicate glass, or a dielectric metal oxide. Subsequently, the first dielectric material layer can be anisotropically etched to remove horizontal portions. The anisotropic etch can be selective to the material of the electrically conductive layers (46a-46h). The remaining vertical portions of the first dielectric material layer can form a single contiguous structure, which is herein referred to as a first stepped dielectric spacer 60. The first stepped dielectric spacer 60 includes a plurality of stepped surfaces that are vertically offset among one another. The first stepped dielectric spacer 60 is formed on the top surfaces of the first set of electrically conductive layers (46a-46d) and on a sidewall of the recessed region 59. The first stepped dielectric spacer has a plurality of top surfaces that are vertically offset among one another. The lateral thickness of the first stepped dielectric spacer 60 can be in a range from 2 nm to 60 nm, although lesser and greater thicknesses can also be employed.

Various portions of the first stepped dielectric spacer 60 can have different vertical extents. For example, a first portion 60a of the first stepped dielectric spacer 60 contacts a sidewall of the hard mask layer 50, and includes a first bottom surface contacting a top surface of the bottommost electrically conductive layer 46d among the first set of electrically conductive layers (46a-46d), a second bottom surface contacting a top surface of another electrically conductive layer 46c, a third bottom surface contacting a top surface of yet another electrically conductive layer 46b, and a fourth bottom surface contacting a top surface of a topmost electrically conductive layer 46a among the first set of electrically conductive layers (46a-46d). A second portion 60b of the first stepped dielectric spacer 60 contacts a sidewall of an electrically conductive layer 46c and a top surface of the bottommost electrically conductive layer 46d among the first set of electrically conductive layers (46a-46d). A third portion 60c of the first stepped dielectric spacer 60 contacts a sidewall of an electrically conductive layer 46b and a top surface of another electrically conductive layer 46c. A fourth portion 60d of the first stepped dielectric spacer 60 contacts a sidewall of an electrically conductive layer 46a and a top surface of another electrically conductive layer 46b. A fifth portion 60e of the first stepped dielectric spacer 60 contacts a sidewall of the hard mask layer 50 and a top surface of the topmost electrically conductive layer 46a among the first set of electrically conductive layers (46a-46d).

Figure 15C:
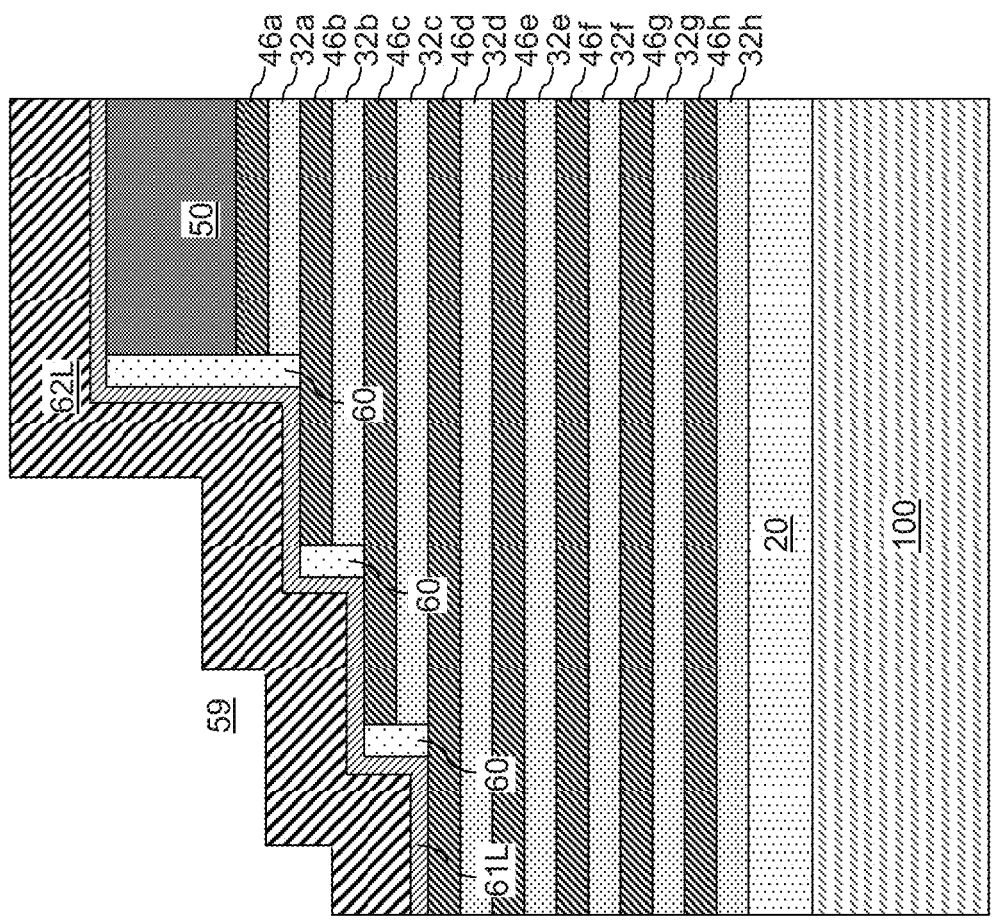
FIG. 15C is a vertical cross-sectional view of the exemplary structure along the vertical plane C-C' of FIG. 15B.

Referring to FIGS. 15A-15C, at least one first conductive material layer (61L, 62L) can be deposited in the recessed region 59 and over the hard mask layer 50. The at least one first conductive material layer (61L, 62L) can be deposited directly on the surfaces of the first stepped dielectric spacer 60. In one embodiment, each of the at least one first conductive material layer (61L, 62L) can be deposited by a conformal deposition process and/or a non-conformal deposition process.

In one embodiment, the at least one first conductive material layer (61L, 62L) can include a first conductive liner 61L and a first metallic material layer 62L. The first conductive liner 61L can comprise a conductive metallic nitride such as TiN, TaN, WN, or a combination thereof. The first metallic material layer 62L can comprise W, Al, Cu, or a combination thereof. Each of the at least one first conductive material layer (61L, 62L) can be deposited by chemical vapor deposition (CVD), physical vapor deposition (PVD), electroplating, electroless plating, or a combination thereof. The thickness of the first conductive liner 61L can be in a range from 1 nm to 15 nm, and the thickness of the first metallic material layer 62L can be in a range from 3 nm to 300 nm, although lesser and greater thicknesses can also be employed. In one embodiment, the first metallic material layer 62L can be deposited by a conformal deposition method such as chemical vapor deposition, electroplating, or electroless plating.

Figure 16C:
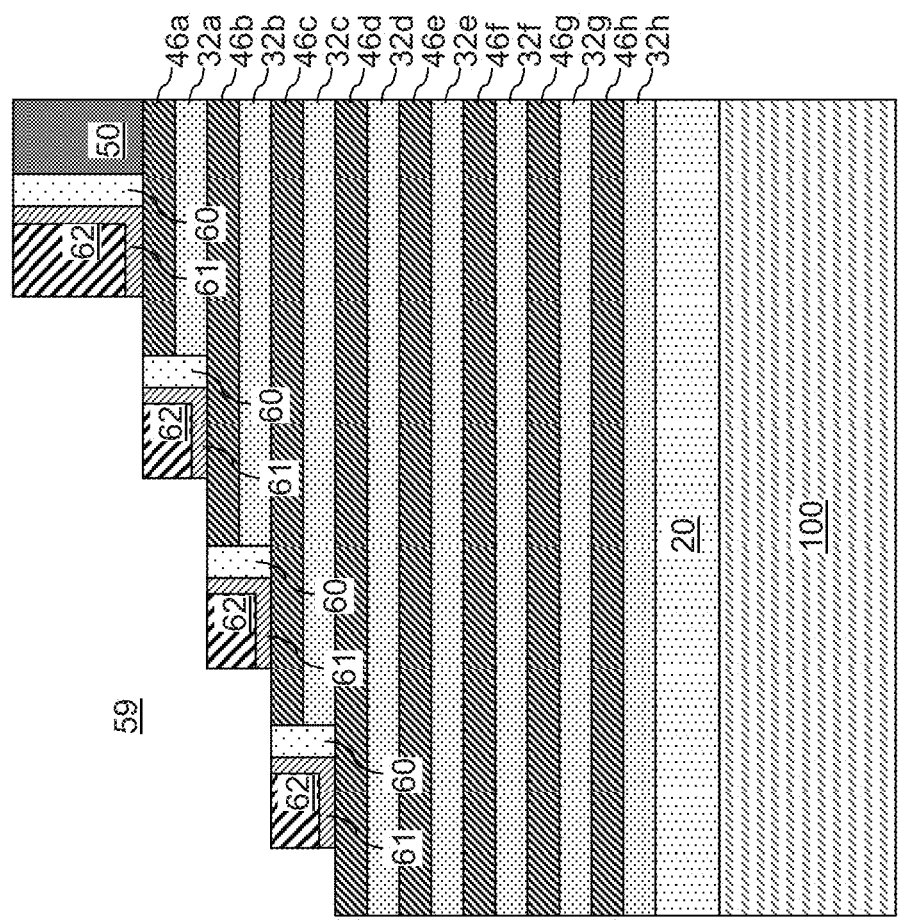
FIG. 16C is a vertical cross-sectional view of the exemplary structure along the vertical plane C-C' of FIG. 16B.

Referring to FIGS. 16A-16C, horizontal portions of the at least one first conductive material layer (61L, 62L) can be removed by an anisotropic etch process. A first step of the anisotropic etch process can etch the material of the first metallic material layer 62L, and a second step of the anisotropic etch can etch the material of the first conductive liner 61L. In one embodiment, the etch chemistry for the second step of the anisotropic etch process can be selective to the material of the electrically conductive layers (46a-46h). The remaining portions of the at least one first conductive material layer (61L, 62L) constitute a first electrically conductive spacer (61, 62). The first electrically conductive spacer (61, 62) can be formed on an outer sidewall of the first stepped dielectric spacer 60. In one embodiment, the first electrically conductive spacer (61, 62) can include a first conductive liner spacer portion 61 and a first metallic material spacer portion 62. The first conductive liner spacer portion 61 is a remaining portion of the first conductive liner 61L, and the first metallic material spacer portion 62 is a remaining portion of the first metallic material layer 62L. The first conductive liner spacer portion 61 can be an L-shaped structure including a vertical portion and a horizontal portion that is adjoined to the vertical portion. The first metallic material spacer portion 62 can be laterally spaced from the first stepped dielectric spacer 60 by a vertical portion of the first conductive liner spacer portion 61. The first electrically conductive spacer (61, 62) can be formed on the top surfaces of the first set of electrically conductive layers (46a-46d) within the recessed region 59.

Figures 17A, 17B:
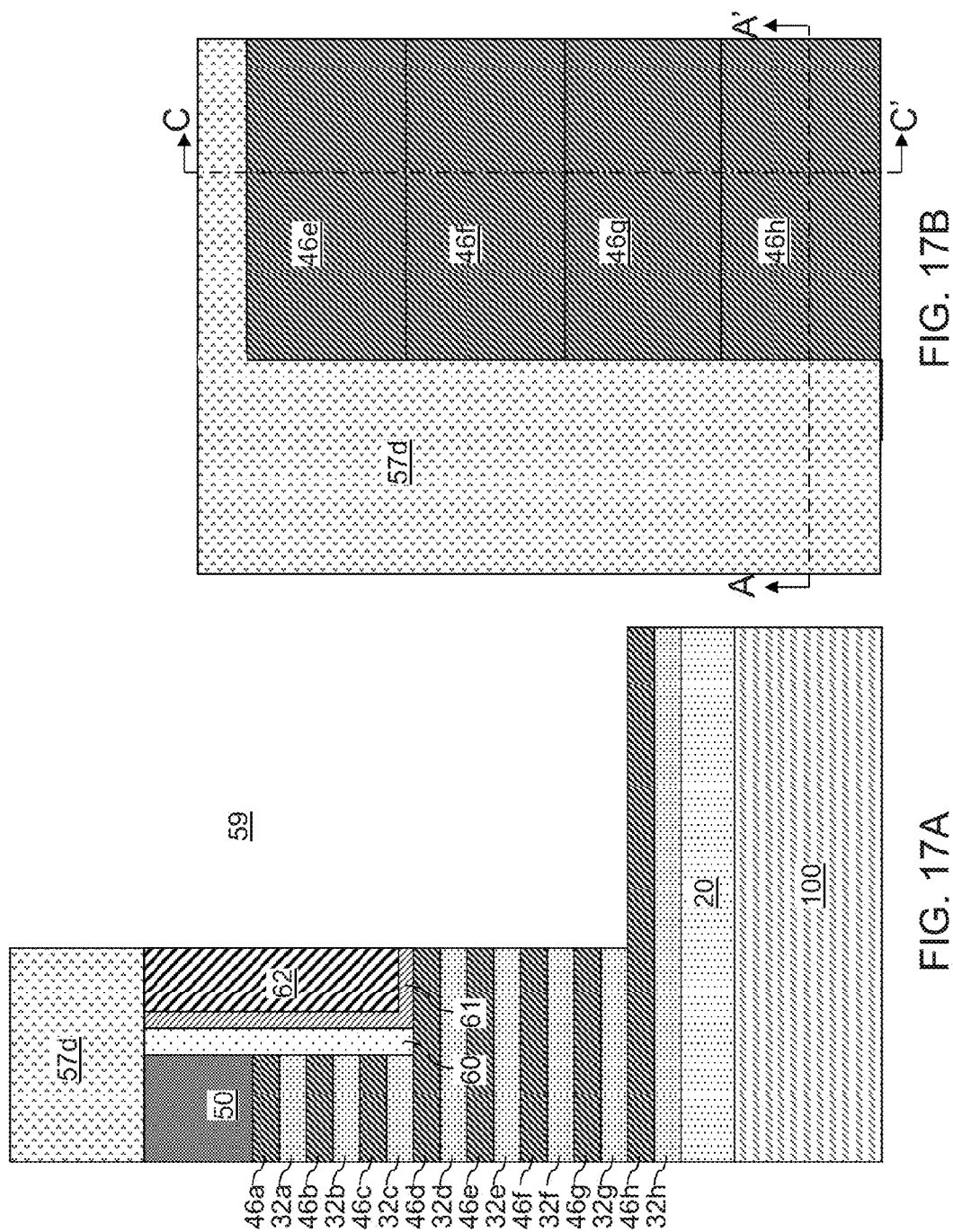
FIG. 17A is a vertical cross-sectional view of the exemplary structure after application and patterning of a fourth photoresist layer, and etching P1 number of electrically conductive layers and P1 number of electrically insulating layer in regions not covered by the third photoresist layer according to an embodiment of the present disclosure.
FIG. 17B is a top-down view of the exemplar structure of FIG. 17A. The vertical plane A-A' corresponds to the plane of the vertical cross-sectional view of FIG. 17A.
Figure 17C:
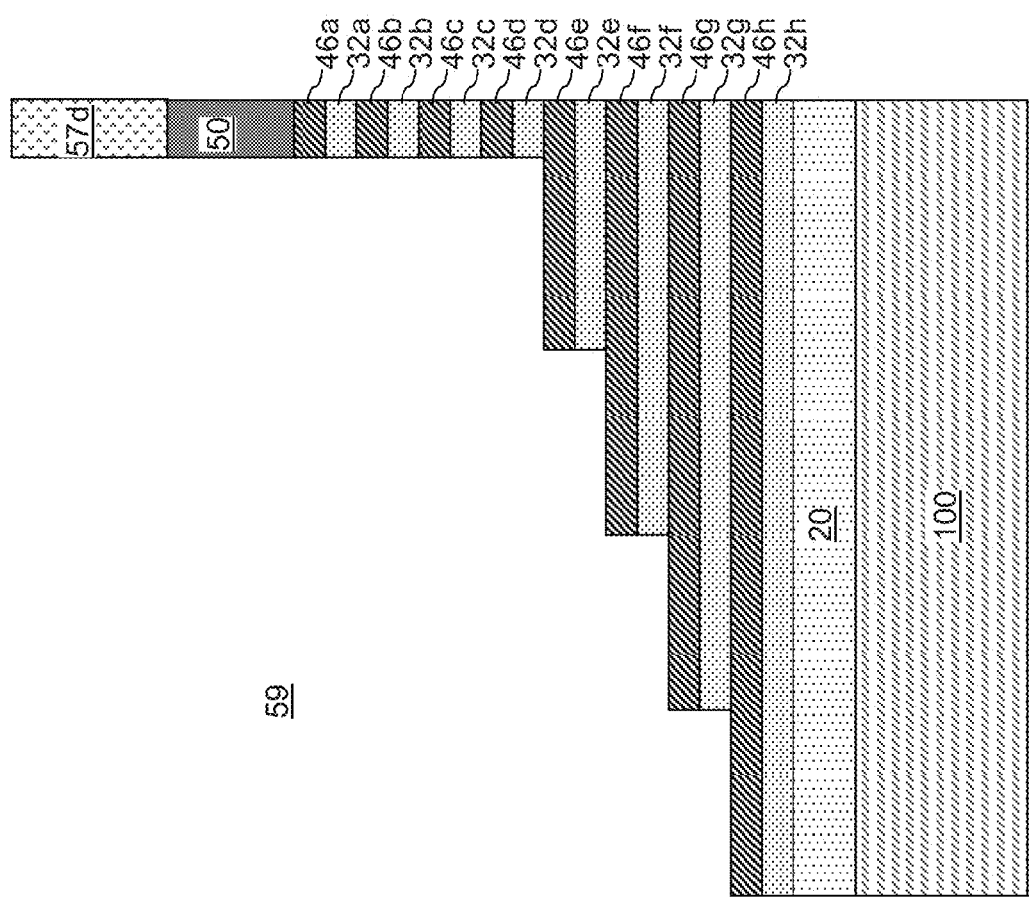
FIG. 17C is a vertical cross-sectional view of the exemplary structure along the vertical plane C-C' of FIG. 17B.

Referring to FIGS. 17A-17C, a fourth photoresist layer 57d can be applied over the exemplary structure, and can be lithographically patterned to cover the hard mask layer 50 and a contiguous portion of the first electrically conductive spacer (61, 62) that straddles multiple top surfaces of the first set of electrically conductive layers (46a-46d). An anisotropic etch is performed to remove unmasked portions of the first electrically conductive spacer (61, 62) that is not masked by the fourth photoresist layer 57e.

Subsequently, the anisotropic etch can further recess the recessed region 59 by P1 number of electrically conductive layers (e.g., 46d-46g) and P1 number of electrically insulating layers (e.g., 32d-32g) in regions not covered by the fourth photoresist layer 57d. P1 is a positive integer.

In one embodiment, P1 can be $2^{Q1}$, in which Q1 is a non-negative integer. In this case, $2^{Q1}$ number of electrically conductive layers and $2^{Q1}$ number of electrically insulating layers can be etched in regions not covered by the fourth photoresist layer 57d. In one embodiment, P1 can be a positive integer that is greater than M1, M2, and any of the number of electrically conductive layers that are etched employing a same photoresist layer prior to formation of the at least one first conductive material layer (61L, 62L). In one embodiment, M1 and M2 can be a number that is a non-negative integer power of 2 such as 1, 2, 4, 8, etc.

In one embodiment, two electrically conductive spacers (including the first electrically conductive spacer (61, 62) and a second electrically conductive spacer to be subsequently formed) can be formed during the processing sequence of the present disclosure, and P1 can be an integer derived by dividing the smallest even number not less than the total number of electrically conductive layers (46a-46h) within the alternating stack (32a-32h, 46h-46h) by 2. In another embodiment, three electrically conductive spacers (including the first electrically conductive spacer (61, 62) and second and third electrically conductive spacers to be subsequently formed) can be formed during the processing sequence of the present disclosure, and P1 can be an integer derived by dividing the smallest multiple of 3 that is not less than the total number of electrically conductive layers (46a-46h) within the alternating stack (32a-32h, 46h-46h) by 3. In yet another embodiment, k electrically conductive spacers (including the first electrically conductive spacer (61, 62) and (k−1) electrically conductive spacers to be subsequently formed) can be formed during the processing sequence of the present disclosure, and P1 can be an integer derived by dividing the smallest multiple of k that is not less than the total number of electrically conductive layers (46a-46h) within the alternating stack (32a-32h, 46h-46h) by k. The number k can be an integer greater than 3. In general, P1 can be an integer derived by dividing the smallest multiple of integer m that does not exceed the total number of electrically conductive layers (46a-46h) by the integer m, in which the integer m is the total number of electrically conductive spacers (such as the first electrically conductive spacer (61, 62)) to be formed.

Each recessed region 59 can be a cavity within the remaining portions of the alternating plurality of electrically conductive layers (46a-46h) and electrically insulating layers (32a-32h). An upper sidewall of the recessed region 59 is a sidewall of the first electrically conductive spacer (61, 62). Top surfaces of electrically conductive layers (46e-46h) located at different levels can be physically exposed within the recessed regions 59. The fourth photoresist layer 57d can be subsequently removed, for example, by ashing. While the present disclosure is illustrated for an embodiment in which P1 is 4, embodiments in which P1 is a positive integer different from 4 are expressly contemplated herein.

Portions of the first set of stepped surfaces (i.e., the stepped surfaces of the electrically conductive layers (46a-46d)) that do not underlie the first electrically conductive spacer (61, 62) are vertically recessed by P1 levels. The set of electrically conductive layers (46e-46h) having top surfaces that are physically exposed to the recessed region 59 is herein referred to as a second set of electrically conductive layers (46e-46h). The second set of electrically conductive layers (46e-46h) forms a second set of stepped surfaces. The second set of stepped surfaces include top surfaces and sidewalls of the second set of electrically conductive layers (46e-46h), which underlies the first set of electrically conductive layers (46a-46d).

Figure 18C:
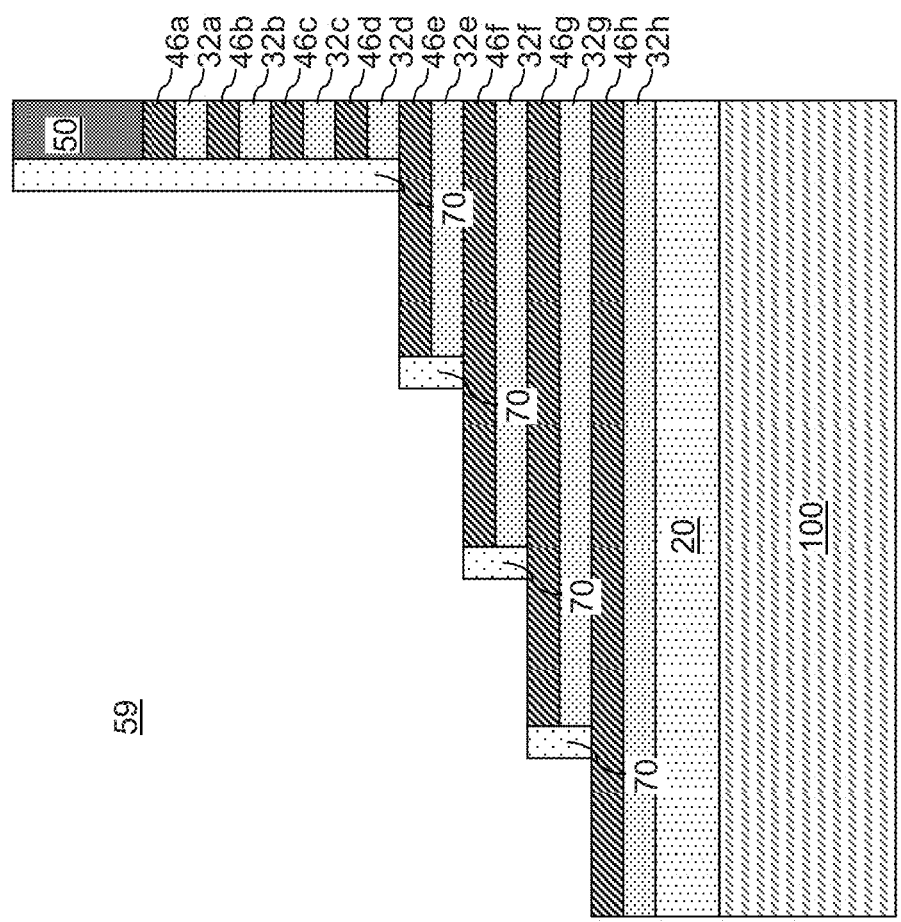
FIG. 18C is a vertical cross-sectional view of the exemplary structure along the vertical plane C-C' of FIG. 18B.

Referring to FIGS. 18A-18C, a second stepped dielectric spacer 70 can be formed on top surfaces of the second set of electrically conductive layers (46e-46h) located at different levels that are present below the bottommost surface of the first stepped dielectric spacer 60, and on sidewalls of the first electrically conductive spacer (61, 62). Specifically, a second dielectric material layer can be conformally deposited on the physically exposed surfaces of the second set of electrically conductive layers (46e-46h), on physically exposed sidewalls of electrically insulating layers (32d-32g), on surfaces of the first electrically conductive spacer (61, 62), and over the hard mask layer 50. The second dielectric material layer includes a dielectric material, which can be silicon oxide, silicon nitride, organosilicate glass, or a dielectric metal oxide. The second dielectric material layer may have the same composition as, or may have a different composition from, the first dielectric spacer 60. Subsequently, the second dielectric material layer can be anisotropically etched to remove horizontal portions. The anisotropic etch can be selective to the material of the electrically conductive layers (46a-46h). The remaining vertical portions of the second dielectric material layer can form a single contiguous structure, which is herein referred to as a second stepped dielectric spacer 70.

The second stepped dielectric spacer 70 includes a plurality of stepped surfaces that are vertically offset among one another. The second stepped dielectric spacer 70 is formed on the top surface and sidewalls of the second set of electrically conductive layers (46e-46h) and on a surface of the first electrically conductive spacer (61, 62). The second stepped dielectric spacer has a plurality of top surfaces that are vertically offset among one another. The lateral thickness of the second stepped dielectric spacer 70 can be in a range from 2 nm to 60 nm, although lesser and greater thicknesses can also be employed.

Various portions of the second stepped dielectric spacer 70 can have different vertical extents. For example, a first portion 70a of the second stepped dielectric spacer 70 contacts a sidewall of the first electrically conductive spacer (61, 62), and includes a first bottom surface contacting a top surface of the bottommost electrically conductive layer 46h among the second set of electrically conductive layers (46e-46h), a second bottom surface contacting a top surface of another electrically conductive layer 46g, a third bottom surface contacting a top surface of yet another electrically conductive layer 46f, and a fourth bottom surface contacting a top surface of a topmost electrically conductive layer 46e among the second set of electrically conductive layers (46e-46h). A second portion 70b of the second stepped dielectric spacer 70 contacts a sidewall of an electrically conductive layer 46g and a top surface of the bottommost electrically conductive layer 46h among the second set of electrically conductive layers (46e-46h). A third portion 70c of the second stepped dielectric spacer 70 contacts a sidewall of an electrically conductive layer 46f and a top surface of another electrically conductive layer 46g. A fourth portion 70d of the second stepped dielectric spacer 70 contacts a sidewall of an electrically conductive layer 46e and a top surface of another electrically conductive layer 46f. A fifth portion 70e of the second stepped dielectric spacer 70 contacts a sidewall of the hard mask layer 50, sidewalls of the first set of electrically conductive layers (46a-46d), and a top surface of the topmost electrically conductive layer 46e among the second set of electrically conductive layers (46e-46h).

Figure 19C:
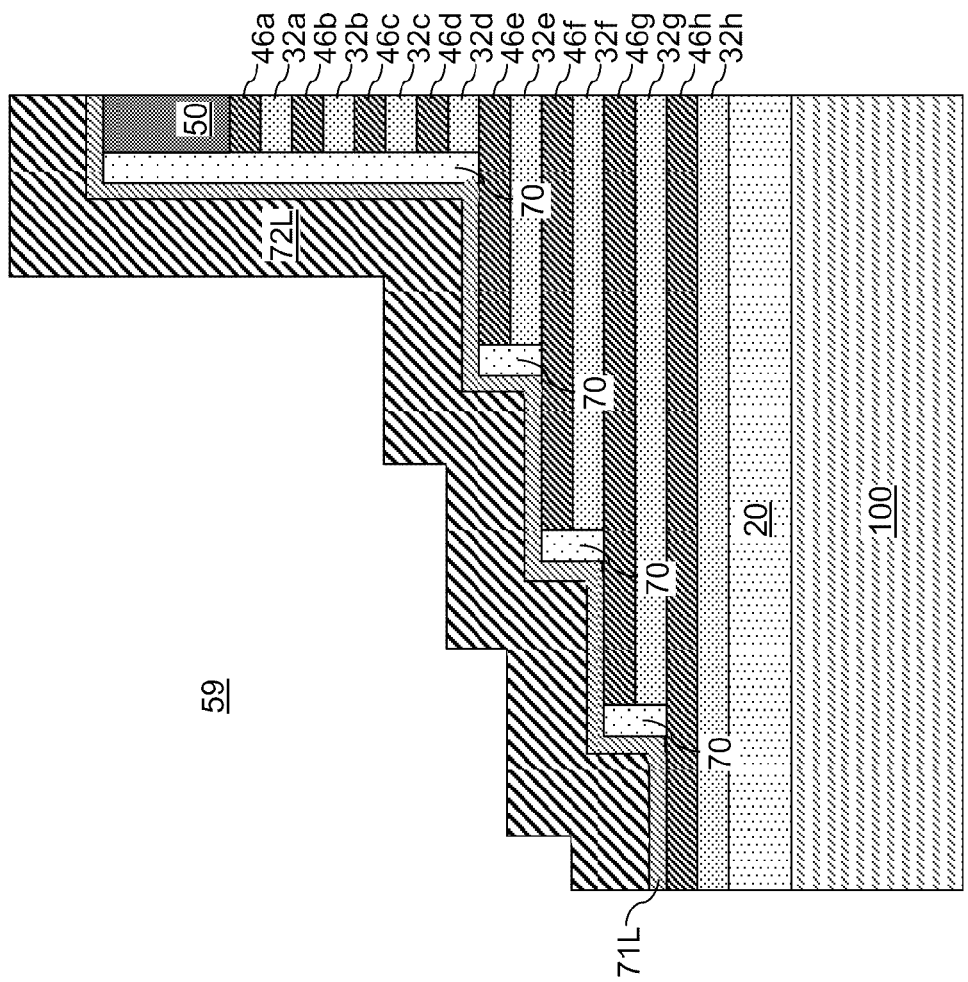
FIG. 19C is a vertical cross-sectional view of the exemplary structure along the vertical plane C-C' of FIG. 19B.

Referring to FIGS. 19A-19C, at least one second conductive material layer (71L, 72L) can be deposited in the recessed region 59, over the hard mask layer 50, and over the first electrically conductive spacer (61, 62). The at least one second conductive material layer (71L, 72L) can be deposited directly on the surfaces of the second stepped dielectric spacer 70. In one embodiment, each of the at least one second conductive material layer (71L, 72L) can be deposited by a conformal deposition process and/or a non-conformal deposition process.

In one embodiment, the at least one second conductive material layer (71L, 72L) can include a second conductive liner 71L and a second metallic material layer 72L. The second conductive liner 71L can comprise a conductive metallic nitride such as TiN, TaN, WN, or a combination thereof. The second metallic material layer 72L can comprise W, Al, Cu, or a combination thereof. Each of the at least one second conductive material layer (71L, 72L) can be deposited by chemical vapor deposition (CVD), physical vapor deposition (PVD), electroplating, electroless plating, or a combination thereof. The thickness of the second conductive liner 71L can be in a range from 1 nm to 15 nm, and the thickness of the second metallic material layer 72L can be in a range from 3 nm to 300 nm, although lesser and greater thicknesses can also be employed. In one embodiment, the second metallic material layer 72L can be deposited by a conformal deposition method such as chemical vapor deposition, electroplating, or electroless plating.

Figure 20B:
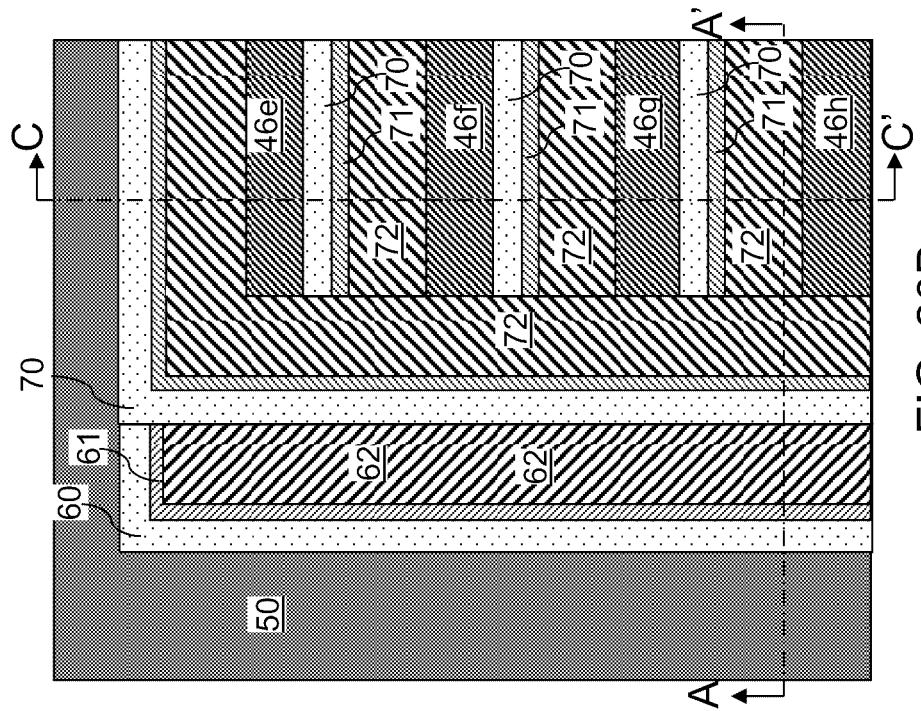
FIG. 20B is a top-down view of the exemplar structure of FIG. 20A. The vertical plane A-A' corresponds to the plane of the vertical cross-sectional view of FIG. 20A.
Figure 20A:
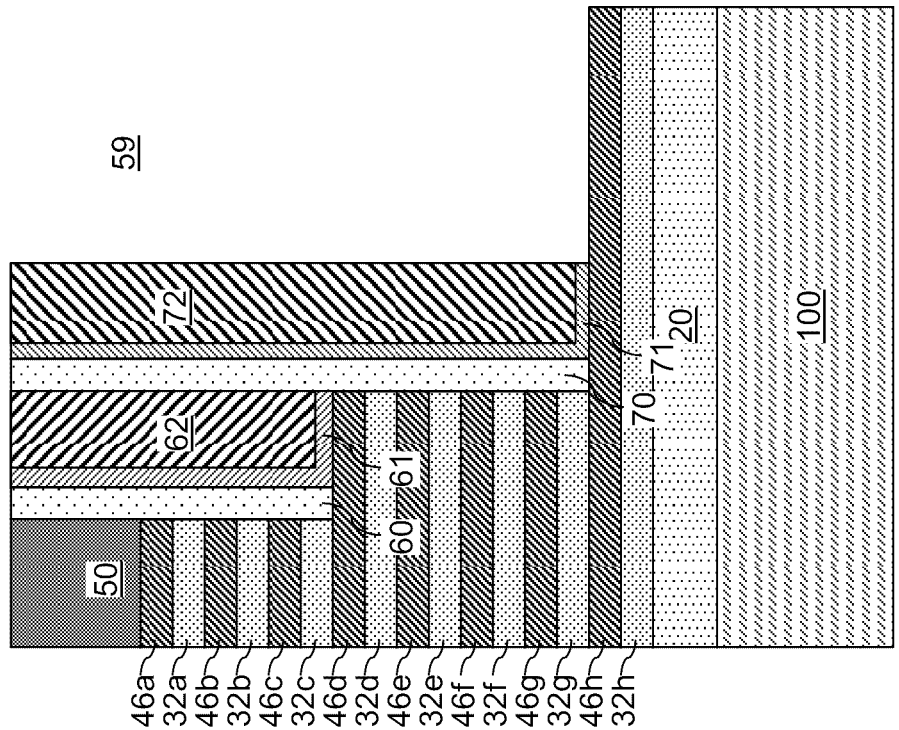
FIG. 20A is a vertical cross-sectional view of the exemplary structure after deposition of a second electrically conductive spacer according to an embodiment of the present disclosure.
Figure 20C:
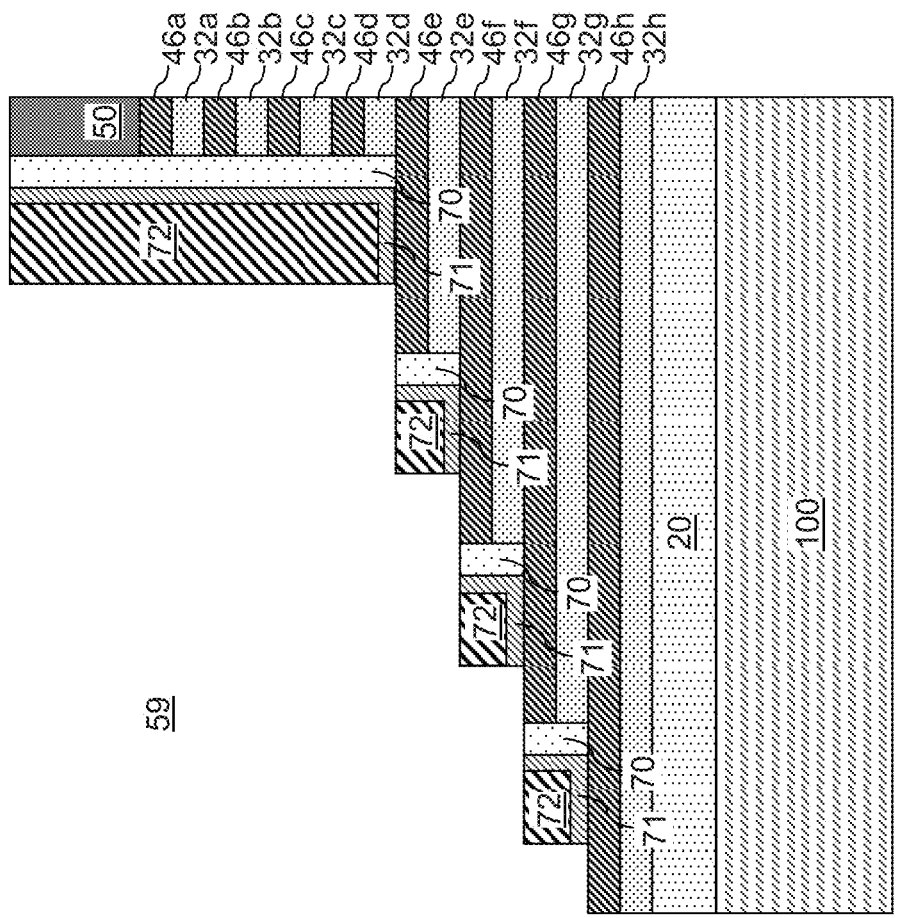
FIG. 20C is a vertical cross-sectional view of the exemplary structure along the vertical plane C-C' of FIG. 20B.

Referring to FIGS. 20A-20C, horizontal portions of the at least one second conductive material layer (71L, 72L) can be removed by an anisotropic etch process. A first step of the anisotropic etch process can etch the material of the second metallic material layer 72L, and a second step of the anisotropic etch can etch the material of the second conductive liner 71L. In one embodiment, the etch chemistry for the second step of the anisotropic etch process can be selective to the material of the electrically conductive layers (47a-47h). The remaining portions of the at least one second conductive material layer (71L, 72L) constitute a second electrically conductive spacer (71, 72). The second electrically conductive spacer (71, 72) can be formed on an outer sidewall of the second stepped dielectric spacer 70. In one embodiment, the second electrically conductive spacer (71, 72) can include a second conductive liner spacer portion 71 and a second metallic material spacer portion 72. The second conductive liner spacer portion 71 is a remaining portion of the second conductive liner 71L, and the second metallic material spacer portion 72 is a remaining portion of the second metallic material layer 72L. The second conductive liner spacer portion 71 can be an L-shaped structure including a vertical portion and a horizontal portion that is adjoined to the vertical portion. The second metallic material spacer portion 72 can be laterally spaced from the second stepped dielectric spacer 70 by a vertical portion of the second conductive liner spacer portion 71. The second electrically conductive spacer (71, 72) can be formed on the top surfaces of the second set of electrically conductive layers (47a-47d) within the recessed region 59.

In case the bottommost electrically conductive layer 46h within the second set of electrically conductive layers (46e-46h) is not the bottommost electrically conductive layer within the alternating stack (32a-32h, 46a-46h), at least one additional set of processing steps corresponding to the set of processing steps 17A-17C, 18A-18C, 19A-19C, and 20A-20C can be iteratively performed. The at least one additional set of processing steps can be performed until m number of stepped dielectric spacers and m number of electrically conductive spacers are formed. After performing the at least one additional set of processing steps, the bottommost electrically conductive layer within the alternating stack (32a-32h, 46a-46h) becomes physically exposed, and a last set of stepped surfaces is formed, which includes the top surface of the bottommost electrically conductive layer within the alternating stack (32a-32h, 46a-46h).

Figure 21A:
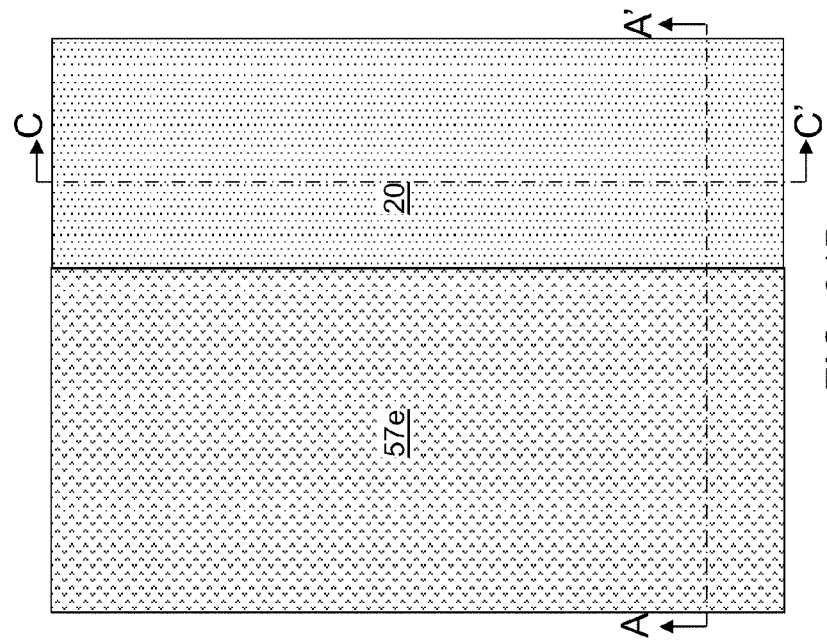
FIG. 21A is a vertical cross-sectional view of the exemplary structure after application and patterning of a fifth photoresist layer, and an anisotropic etch of unmasked portions of the second electrically conductive spacer and the stack of the electrically insulating layers and the electrically conductive layers according to an embodiment of the present disclosure.
Figure 21B:
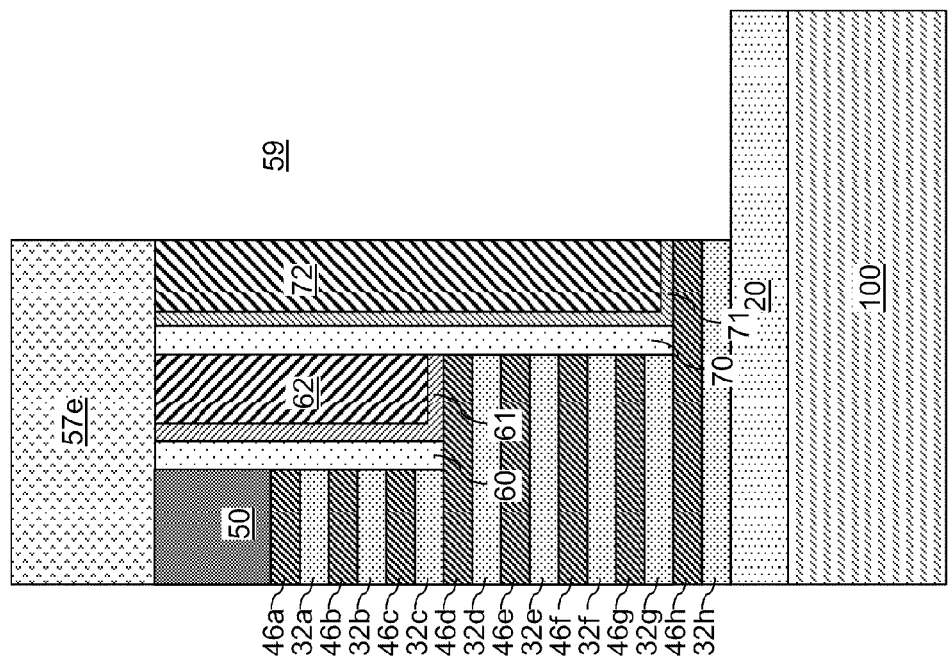
FIG. 21B is a top-down view of the exemplar structure of FIG. 21A. The vertical plane A-A' corresponds to the plane of the vertical cross-sectional view of FIG. 21A.
Figure 22C:
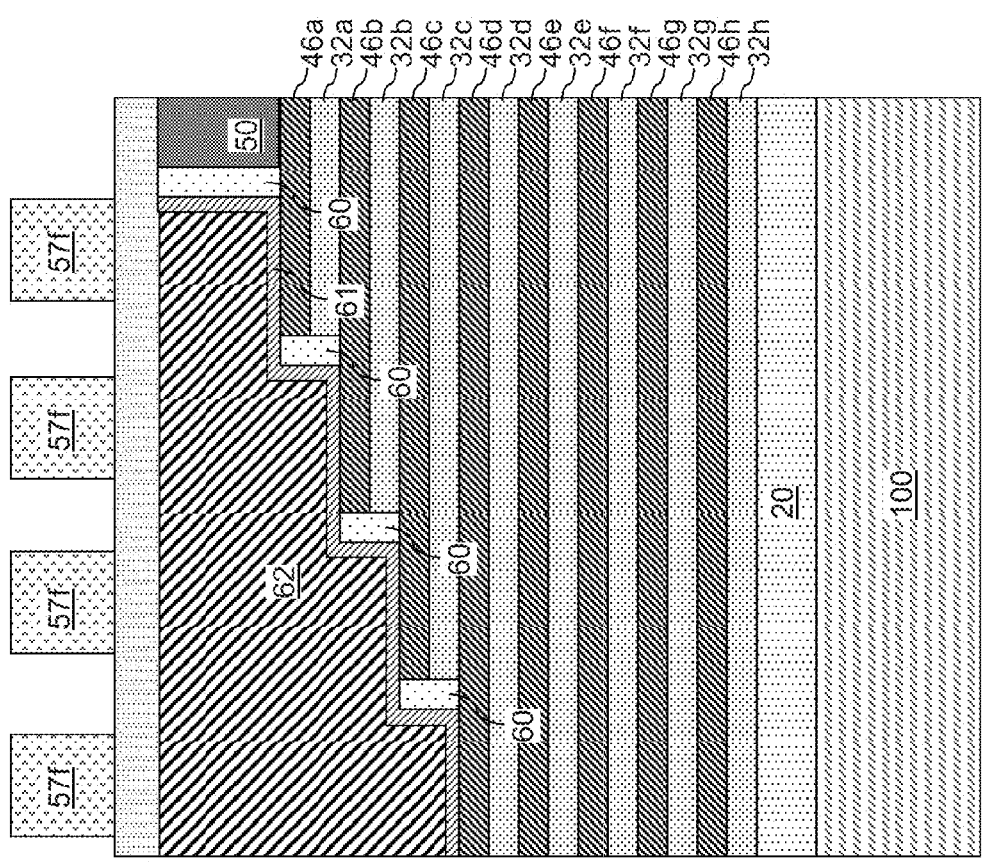
FIG. 22C is a vertical cross-sectional view of the exemplary structure along the vertical plane C-C' of FIG. 22B.
Figure 22D:
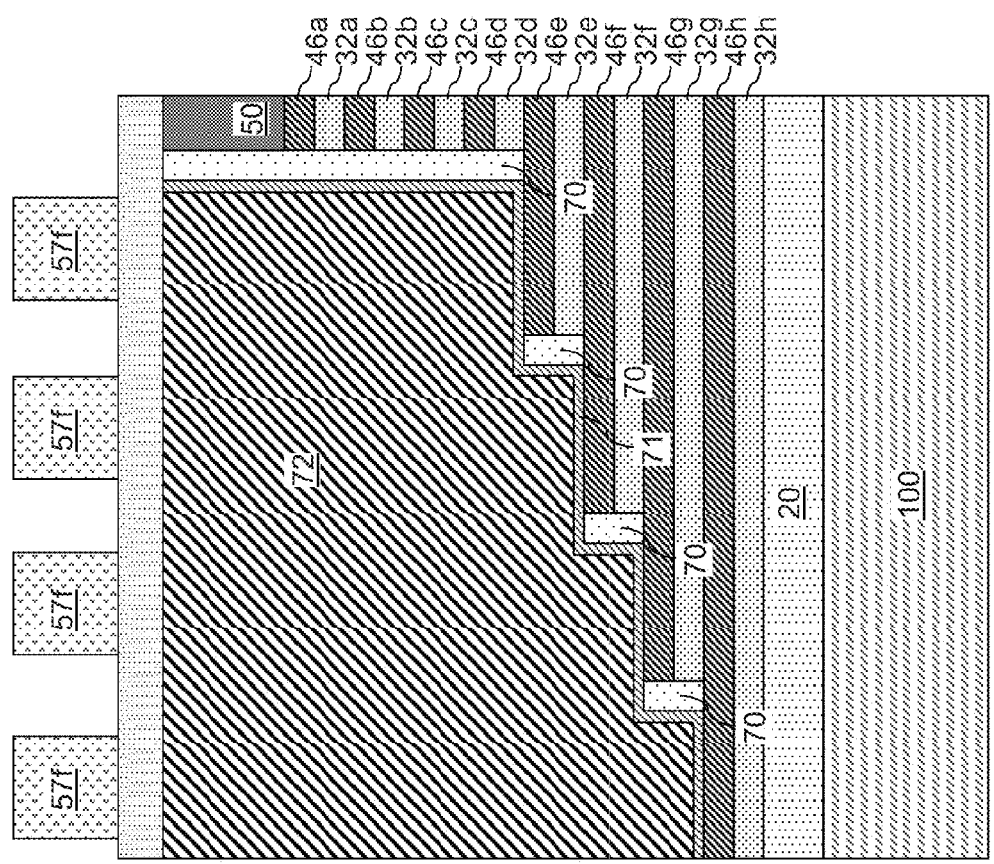
FIG. 22D is a vertical cross-sectional view of the exemplary structure along the vertical plane D-D' of FIG. 22B.
Figure 22E:
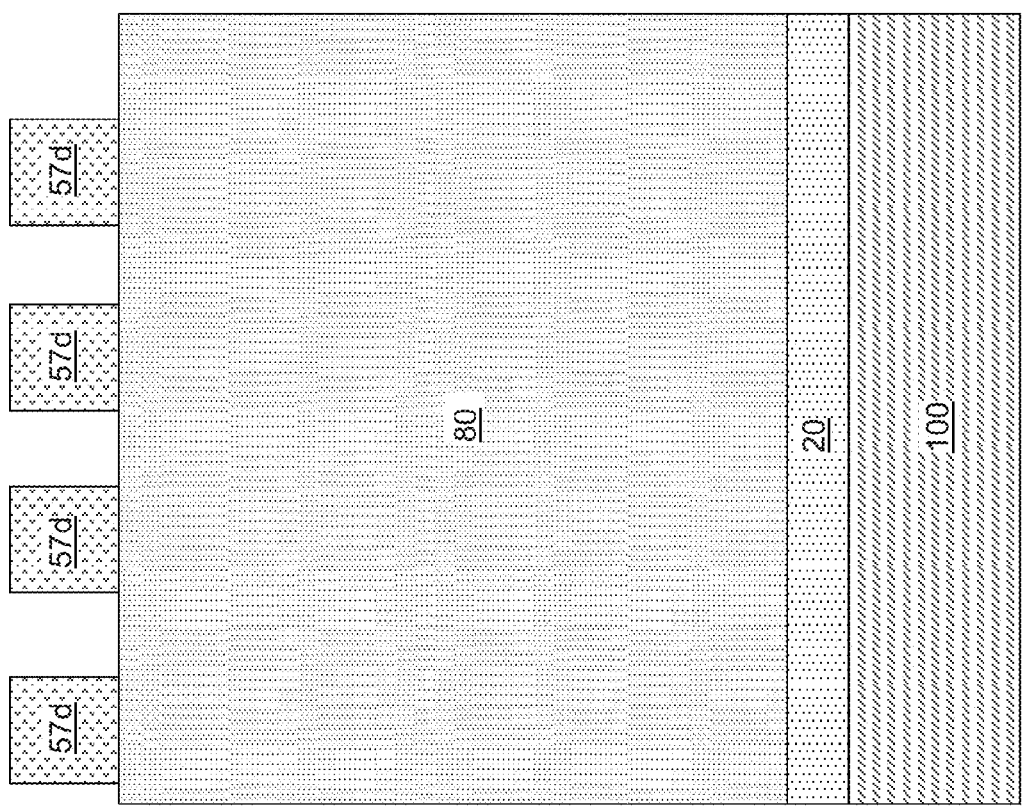
FIG. 22E is a vertical cross-sectional view of the exemplary structure along the vertical plane E-E' of FIG. 22B.
Figure 23C:
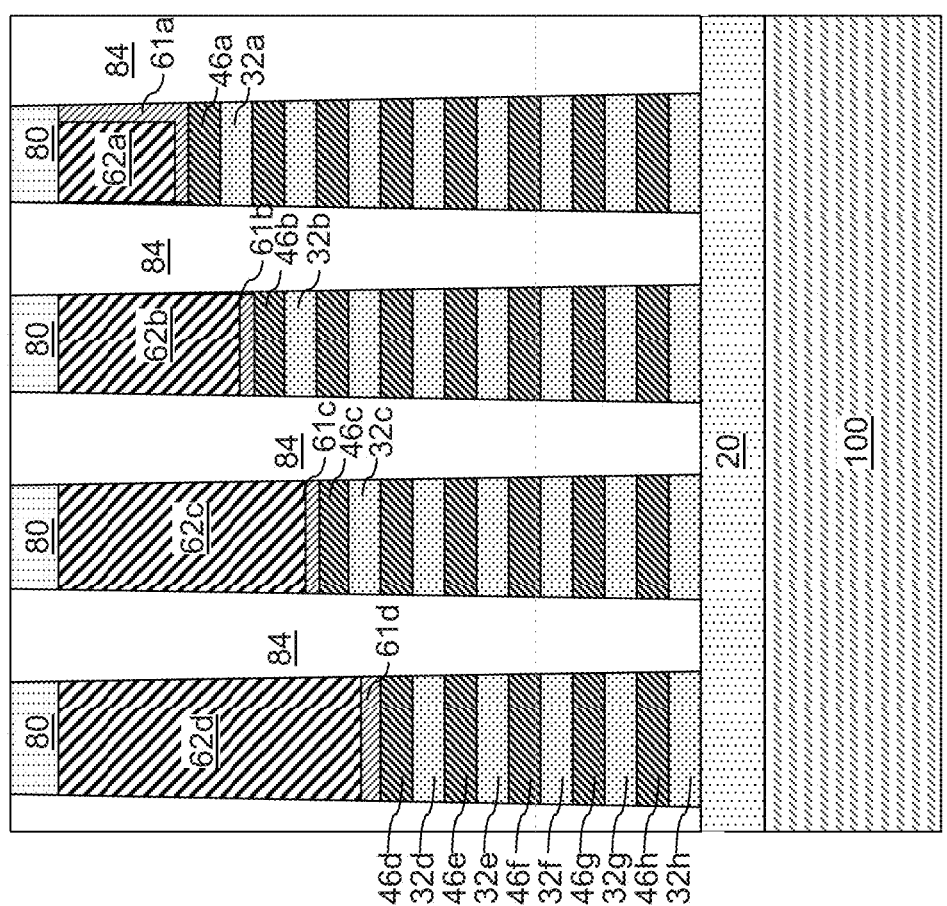
FIG. 23C is a vertical cross-sectional view of the exemplary structure along the vertical plane C-C' of FIG. 23B.
Figure 23D:
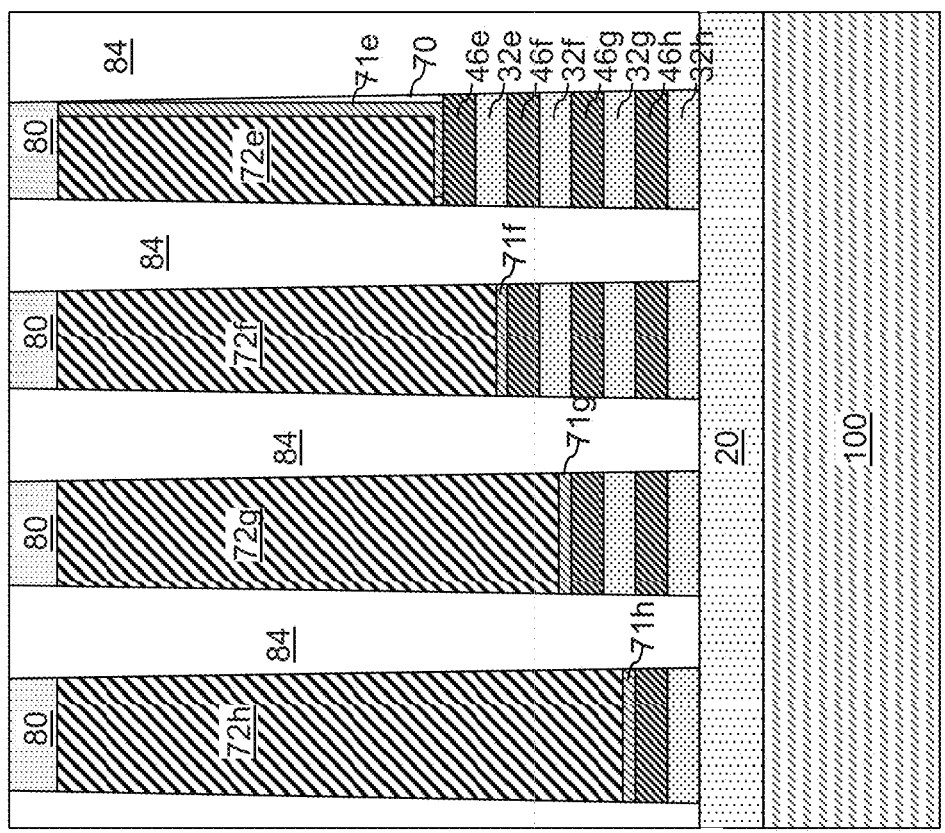
FIG. 23D is a vertical cross-sectional view of the exemplary structure along the vertical plane D-D' of FIG. 23B.
Figure 24C:
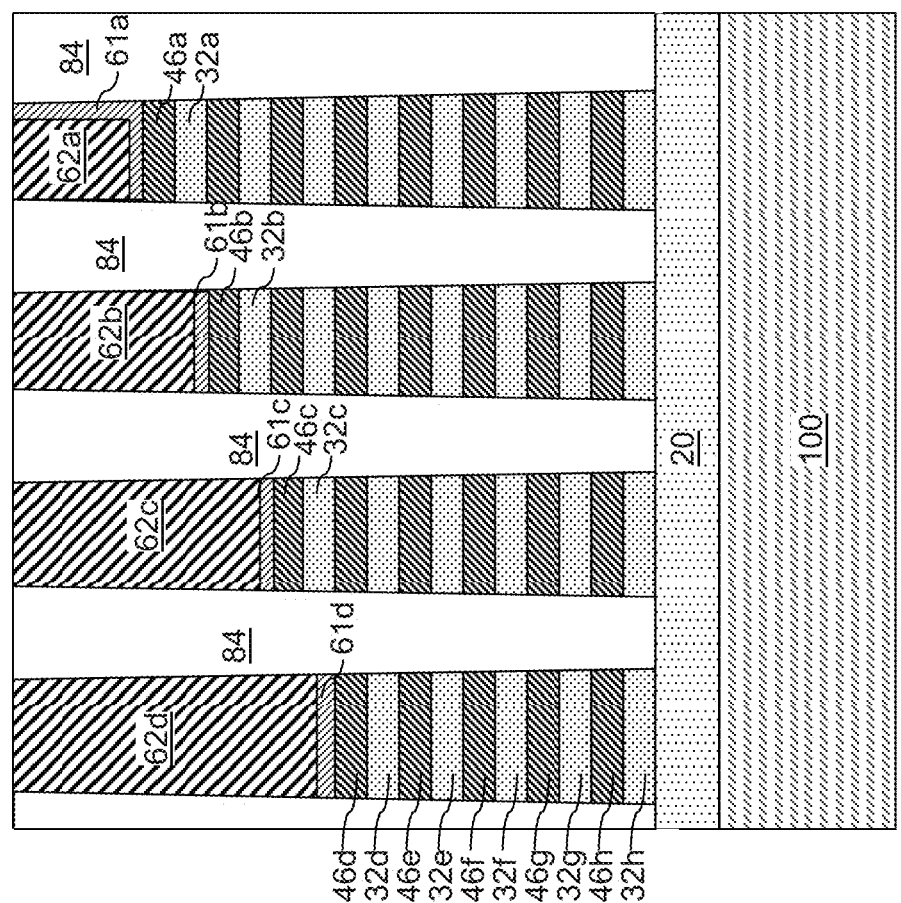
FIG. 24C is a vertical cross-sectional view of the exemplary structure along the vertical plane C-C' of FIG. 24B.
Figure 24D:
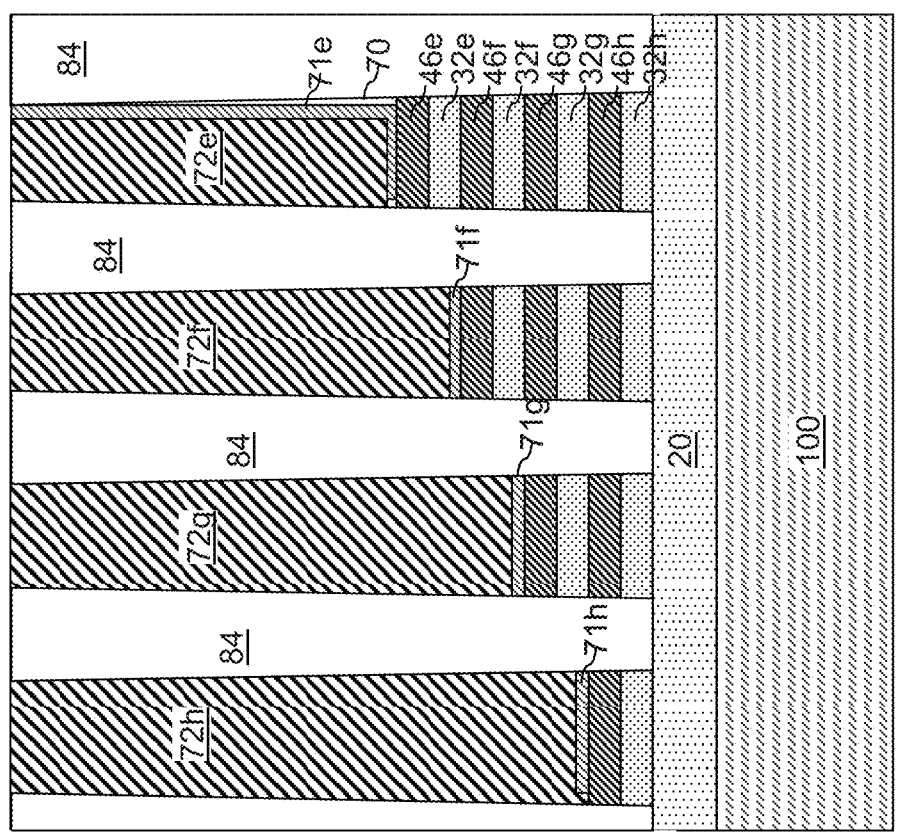
FIG. 24D is a vertical cross-sectional view of the exemplary structure along the vertical plane D-D' of FIG. 24B.

If the bottommost electrically conductive layer 46h within the second set of electrically conductive layers (46e-46h) is the bottommost electrically conductive layer within the alternating stack (32a-32h, 46a-46h), the second electrically conductive spacer (71, 72) can be patterned, and the top surface of the intervening layer 20 can be physically exposed within an area. Referring to FIGS. 21A-21C, a fifth photoresist layer 57e can be applied over the exemplary structure, and can be lithographically patterned to cover the hard mask layer 50, the first electrically conductive spacer (61, 62), and a contiguous portion of the second electrically conductive spacer (71, 72) that straddles multiple top surfaces of the second set of electrically conductive layers (46e-46h). An anisotropic etch is performed to remove unmasked portions of the second electrically conductive spacer (71, 72) that is not masked by the fifth photoresist layer 57e.

Subsequently, the anisotropic etch can further recess the recessed region 59 by etching through any remaining electrically conductive layers (e.g., 46e-46h) and any remaining electrically insulating layers (e.g., 32e-32h) in regions not covered by the fifth photoresist layer 57d. Optionally, the anisotropic etch can be selective to the material of the intermediate layer 20. Alternatively, the anisotropic etch can remove the intermediate layer 20 and stop on the substrate 100. The top surface of the intermediate layer 20, or the top surface of the substrate 100, is physically exposed at the bottom of the recessed region 59.

Referring to FIGS. 22A-22E, a dielectric material is deposited within the recessed region 59 to form a dielectric material portion 80. Optionally, the dielectric material can be planarized so that the top surface of the dielectric material portion 80 becomes a planar top surface located within a horizontal plane. The planarization of the deposited dielectric material can be performed by chemical mechanical planarization (CMP) or a recess etch. In one embodiment, the planar top surface of the dielectric material portion 80 can be located above the top surfaces of the hard mask layer 50, the first electrically conductive spacer (61, 62), and the second electrically conductive spacer (71, 72). In another embodiment, the hard mask layer 50 can be employed as a stopping layer during the planarization process, and the planar top surface of the dielectric material portion 80 can be coplanar with the top surfaces of the hard mask layer 50, the first electrically conductive spacer (61, 62), and the second electrically conductive spacer (71, 72).

A sixth photoresist layer 57f can be applied over the top surface of the dielectric material portion 80, and can be lithographically patterned into strips that are laterally spaced along the lengthwise direction of the first electrically conductive spacer (61, 62) and the second electrically conductive spacer (71, 72). As used herein, a lengthwise direction of an element is a horizontal direction along which the element extends the most, and a widthwise direction of an element is a horizontal direction along which the element extends the least. Thus, the lateral widths, or the thicknesses, of the first electrically conductive spacer (61, 62), and the second electrically conductive spacer (71, 72) are measured along the widthwise direction of the first electrically conductive spacer (61, 62), and the second electrically conductive spacer (71, 72). The strips of the patterned sixth photoresist layer 57f extend along the widthwise direction of the first electrically conductive spacer (61, 62) and the second electrically conductive spacer (71, 72). The width of each strip of the patterned sixth photoresist layer 57f can be invariant under translation along the widthwise direction of the first electrically conductive spacer (61, 62), and the second electrically conductive spacer (71, 72). Further, the spacing between a neighboring pair of strips of the patterned sixth photoresist layer 57f can be invariant under translation along the widthwise direction of the first electrically conductive spacer (61, 62), and the second electrically conductive spacer (71, 72).

The locations of the strips of the patterned sixth photoresist layer 57f can be selected such that each gap between a neighboring pair of strips of the patterned sixth photoresist layer 57*f* overlies a portion of the first stepped dielectric spacer 60 that extends along the widthwise direction of the first and second electrically conductive spacer (61, 62, 71, 72), and overlies a portion of the second stepped dielectric spacer 70 that extends along the widthwise direction of the first and second electrically conductive spacer (61, 62, 71, 72), and, in case any additional stepped dielectric spacer is present, overlies a portion of such an additional stepped dielectric spacer that extends along the widthwise direction of the first and second electrically conductive spacers (61, 62, 71, 72). In one embodiment, each strip of the patterned sixth photoresist layer 57*f* can be located between a pair of vertical sidewalls that are adjoined to a top surface of an electrically conducive layer (one of 46*a*-46*h*).

Referring to FIGS. 23A-23D, trenches are formed through the first stepped dielectric spacer 60, the first electrically conductive spacer (61, 62), the second stepped dielectric spacer 70, the second electrically conductive spacer (71, 72), any additional stepped dielectric spacer (if present), and any additional electrically conductive spacer (if present), and optionally through the dielectric material portion 80 and/or the hard mask layer 50 and/or the alternating stack (32*a*-32*h*, 46*a*-46*h*) by performing an anisotropic etch process that employs the patterned sixth photoresist layer 57*f* as an etch mask. In one embodiment, the trenches can extend at least to the horizontal plane including the bottom surface of the bottommost electrically conductive layer 46*h*. In one embodiment, the trenches can extend to the top surface of the intermediate layer 20 and/or to the top surface of the substrate 100.

Subsequently, a dielectric material (such as silicon oxide, silicon nitride, or a dielectric metal oxide) can be deposited within the trenches to form trench isolation structures 84. Excess portions of the deposited dielectric material can be removed from above the top surface of the dielectric material portion 80. The material of the trench isolation structure 84 may be the same as, or different from, the material of the dielectric material portion 80. The removal of the deposited dielectric material may be performed selective to the dielectric material of the dielectric material portion 80, or may be performed without selectivity to the dielectric material of the dielectric material portion 80. Each trench isolation structure 84 can be formed through a portion of the dielectric material portion 80.

The trench isolation structures 84 divides the first electrically conductive spacer (61, 62) into a plurality of disjoined remaining portions, which are herein referred to as first electrically conductive via connections (61*a*-61*d*, 62*a*-62*d*). As used herein, a plurality of "disjoined" elements refer to a plurality of elements that are not in physical contact among one another. The first electrically conductive via connections (61*a*-61*d*, 62*a*-62*d*) are via contact structures that provide vertical electrically conductive paths between the first set of electrically conductive layers (46*a*-46*d*) and conductive line structures (not shown) that can be subsequently formed above the first electrically conductive via connections (61*a*-61*d*, 62*a*-62*d*). Each of the first electrically conductive via connections (61*a*-61*d*, 62*a*-62*d*) can include a remaining portion (61*a*, 61*b*, 61*c*, or 61*d*) of the first conductive liner spacer portion 61 and a remaining portion (62*a*, 62*b*, 62*c*, or 62*d*) of the first metallic material spacer portion 62.

The first electrically conductive via connections (61*a*-61*d*, 62*a*-62*d*) can include n electrically conductive via connections having different heights. Each of the n electrically conductive via connections can be labeled as i-th electrically conductive via connection in the order of the increasing height, in which i is an integer from 1 to n. In an illustrative example, in case the number n is 4, the first electrically conductive via connections (61*a*-61*d*, 62*a*-62*d*) can include a first-height electrically conductive via connection (61*a*, 62*a*), a second-height electrically conductive via connection (61*b*, 62*b*), a third-height electrically conductive via connection (61*c*, 62*c*), and a fourth-height electrically conductive via connection (61*d*, 62*d*). In one embodiment, the number n can be the same as the total number of steps within the first set of stepped surfaces that are present within the first set of electrically conductive layers (46*a*-46*d*).

The trench isolation structures 84 divides the second electrically conductive spacer (71, 72) into a plurality of disjoined remaining portions, which are herein referred to as second electrically conductive via connections (71*e*-71*h*, 72*e*-72*h*). The second electrically conductive via connections (71*e*-71*h*, 72*e*-72*h*) are via contact structures that provide vertical electrically conductive paths between the second set of electrically conductive layers (46*e*-46*h*) and conductive line structures (not shown) that can be subsequently formed above the second electrically conductive via connections (71*e*-71*h*, 72*e*-72*h*). Each of the second electrically conductive via connections (71*e*-71*h*, 72*e*-72*h*) can include a remaining portion (71*e*, 71*f*, 71*g*, or 71*h*) of the second conductive liner spacer portion 71 and a remaining portion (72*e*, 72*f*, 72*g*, or 72*h*) of the second metallic material spacer portion 72.

The second electrically conductive via connections (71*e*-71*h*, 72*e*-72*h*) can include n electrically conductive via connections having different heights. Each of the second electrically conductive via connections (71*e*-71*h*, 72*e*-72*h*) can be taller than any of the first electrically conductive via connections (61*a*-61*d*, 62*a*-62*d*). Each of the n electrically conductive via connections can be labeled as (n+i)-th n electrically conductive via connection in the order of the increasing height, in which i is an integer from 1 to n. In an illustrative example, in case the number n is 4, the second electrically conductive via connections (71*e*-71*h*, 72*e*-72*h*) can include a fifth-height electrically conductive via connection (71*e*, 72*e*), a sixth-height electrically conductive via connection (71*f*, 72*f*), a seventh-height electrically conductive via connection (71*g*, 72*g*), and an eighth-height electrically conductive via connection (71*h*, 72*h*). In one embodiment, the number n can be the same as the total number of steps within the second set of stepped surfaces that are present within the second set of electrically conductive layers (46*e*-46*h*).

The trench isolation structures 84 each of the first stepped dielectric spacer 60 and the second stepped dielectric spacer 70 into a plurality of disjoined dielectric material portions. Each remaining portion of the first stepped dielectric spacer 60 constitutes a first set of dielectric spacers that are referred to as upper level dielectric spacers 60' Each remaining portion of the second stepped dielectric spacer 70 constitutes a second set of dielectric spacers that are herein referred to as lower level dielectric spacers 70'. Each of the upper level dielectric spacers 60' contacts a top surface of an electrically conductive layer within the first set of electrically conductive layers (46*a*-46*d*). Each of the lower level dielectric spacers 70' contacts a top surface of an electrically conductive layer within the second set of electrically conductive layers (46*e*-46*h*). Each upper level dielectric spacer 60' can have a height that is different from the heights of the other upper level dielectric spacers 60' Each lower level dielectric spacer 70' can have a height that is different from the height of the other lower level dielectric spacers 70' The upper level dielectric spacers 60' have heights that are lesser than the heights of the lower level dielectric spacers 70'.

In general, if m number of stepped dielectric spacers and m number of electrically conductive spacers are provided, the m number of stepped dielectric spacers can be divided into m×n remaining dielectric material portions by the trench isolation structures 84, which collectively form an m×n array of dielectric spacers that are disjoined from one another. Likewise, the m number of electrically conductive spacers can be divided into m×n remaining conductive material portions, which collectively form an m×n array of electrically conductive via connections. In one embodiment, the number mn (i.e., the product of m and n) can be the same as the total number of levels for the electrically conductive layers (46a-46h), or can be greater than the total number of levels for the electrically conductive layers (46a-46h).

Referring to FIGS. 24A-24D, the portions of the trench isolation structures 84 and the dielectric material portion 80 that are located above a horizontal plane including the topmost surfaces of the various electrically conductive via connections (61a-61d, 62a-62d, 71e-71h, 72e-72h) can be removed, for example, by chemical mechanical planarization. The top surface of the hard mask layer 50 may be employed as a stopping layer during the planarization process. Subsequently, electrically conductive lines (not shown) and/or dielectric material layers (not shown) can be formed above the top surfaces of the various electrically conductive via connections (61a-61d, 62a-62d, 71e-71h, 72e-72h) to form an overlying metal interconnect structure.

The exemplary structure is a multilevel structure that includes a stack (32a-32h, 46a-46h) of an alternating plurality of electrically conductive layers (46a-46h) and electrically insulating layers (32a-32h) located over a substrate 100, a plurality of electrically conductive via connections (61a-61d, 62a-62d, 71e-71h, 72e-72h) having top surfaces within a same horizontal plane and having bottom surfaces contacting a respective electrically conductive layer (46a-46h) located at different levels, and at least one a trench isolation structure 84 extending through the stack (32a-32h, 46a-46h) and including first and second sidewalls located on opposite sides. The first sidewall of the trench isolation structure contacts a first subset S1 of at least two electrically conductive via connections (e.g., 61a, 62a, 71e, 72e), and the second sidewall of the trench isolation structure 84 contact a second subset S2 of at least two electrically conductive via connections (e.g., 61b, 62b, 71f, 72f) that is different from the first subset S1.

Each electrically conductive via connection (e.g., 61a, 62a, 71e, 72e, 61b, 62b, 71f, 72f) within the first and second subsets (S1, S2) contact electrically conductive layers (e.g., 46a, 46e, 46b, 46f) located at different levels within the stack (32a-32h, 46a-46h). In one embodiment, the first sidewall and the second sidewall of the trench isolation structure 84 can extend along a same horizontal direction.

In one embodiment, each electrically conductive via connection (e.g., 61a, 62a, 71e, 72e) within the first subset S1 of at least two electrically conductive via connections (e.g., 61a, 62a, 71e, 72e) has a first sidewall contacting the trench isolation structure 84, and a second sidewall contacting a second trench isolation structure 84. In one embodiment, the trench isolation structure 84 and the second trench isolation structure 84 extend along a same horizontal direction. In one embodiment, the second trench isolation structure 84 contacts each of the first subset S1 of at least two electrically conductive via connections. (e.g., 61a, 62a, 71e, 72e).

In one embodiment, the sidewalls of the trench isolation structures 84 can have a non-zero taper angle, and at least some of the plurality of electrically conductive via connections (61a-61d, 62a-62d, 71e-71h, 72e-72h) has a width that decreases with a vertical distance from the substrate 100. In this case, the lateral distance between the first sidewall and the second sidewall of the trench isolation structure 80 can increase with a vertical distance from the substrate 100.

A first upper level dielectric spacer 60' can contact a first sidewall of a first electrically conductive via connection (e.g., 61a, 62a) among the first subset S1 of electrically conductive via connections (e.g., 61a, 62a, 71e, 72e), and a second upper level dielectric spacer 60' can contact a first sidewall of a second electrically conductive via connection (e.g., 61b, 62b) among the second subset S2 of electrically conductive via connections (e.g., 61b, 62b, 71f, 72f). In one embodiment, the first sidewall of the first electrically conductive via connection (e.g., 61a, 62a) and the first sidewall of the second electrically conductive via connection (e.g., 61b, 62b) can be within a same vertical plane. In one embodiment, the first and second upper level dielectric spacers 60' can have top surfaces located at a same height, and have bottom surfaces contacting electrically conductive layers (e.g., 46a, 46b) located at different levels.

Further, a first lower level dielectric spacer 70' can contact a second sidewall of the first electrically conductive via connection (e.g., 61a, 62a) among the first subset S1 of electrically conductive via connections (e.g., 61a, 62a, 71e, 72e), and a second lower level dielectric spacer 70' can contact a second sidewall of the second electrically conductive via connection (e.g., 61b, 62b) among the second subset S2 of electrically conductive via connections (e.g., 61b, 62b, 71f, 72f). The first and second lower level dielectric spacers 70' have top surfaces located at a same height, and have bottom surfaces contacting electrically conductive layers (e.g., 46e, 46f) located at different levels. The first and second upper level dielectric spacers 60' have top surfaces located at the same height as the top surfaces of the first and second lower level dielectric spacers 70', and have bottom surfaces located above the bottom surfaces of the first and second lower level dielectric spacers 70'.

In one embodiment, the first and second lower dielectric spacers 70' can have a same composition and a same thickness. In one embodiment, the first and second upper dielectric spacers 60' can differ from the first and second lower dielectric spacers 70' in at least one of thickness and composition. Alternatively, the first and second upper dielectric spacers 60' and the first and second lower dielectric spacers 70' can have the same thickness and composition.

In one embodiment, each of the plurality of electrically conductive via connections (61a-61d, 62a-61d, 71e-71h, 72e-72h) can comprise a conductive liner portion (one of 61a-61d and 71e-71h), which is a remaining portion of conductive liner spacer portion (61 or 71), and a conductive material portion (one of 62a-61d and 72e-72h), which is a remaining portion of a conductive material spacer portion (62 or 72). In one embodiment, the first sidewall of the trench isolation structure 84 can contact a conductive material portion 62a of a first electrically conductive via connection (61a, 62a) among the first subset S1 of electrically conductive via connections (61a, 62a, 71e, 72e). A first upper level dielectric spacer 60' can be in contact with, and can be laterally spaced from the conductive material portion 62a of the first electrically conductive via connection (61a, 62a) by, a conductive liner portion 61a of the first electrically conductive via connection (61a, 62a).

In one embodiment, the second sidewall of the trench isolation structure 84 can contact a conductive material portion 62b of a second electrically conductive via connection (61b, 62b) among the second subset S2 of electrically conductive via connections (61b, 62b, 71f, 72f). A second upper level dielectric spacer 60' can be in contact with, and is laterally spaced from the conductive material portion 62b of the second electrically conductive via connection (61b, 62b) by, a conductive liner portion 61b of the second electrically conductive via connection (61b, 62b). A second trench isolation structure 84 can be in contact with, and can be laterally spaced from the conductive material portion 62a of the first electrically conductive via connection (61a, 62a) by, the conductive liner portion 61a of the first electrically conductive via connection (61a, 62a).

In one embodiment, the plurality of electrically conductive via connections (61a-61d, 62a-62d, 71e-71h, 72e-72h) can include a m×n two-dimensional array of electrically conductive via connections that are spaced from one another by a plurality of trench isolation structures 84 along one horizontal direction and by a set of dielectric spacers (60', 70') having a same composition and a same thickness along another direction. The number m can be in integer greater than 1, and the number n can be an integer greater than 2. In one embodiment, each electrically conductive via connection (61a-61d, 62a-62d, 71e-71h, 72e-72h) within the m×n two-dimensional array of electrically conductive via connections contacts a top surface of a respective electrically conductive layer (46a-46h) located at levels that are different from one another.

In one embodiment, the device located on the semiconductor substrate can include a vertical NAND device located in the device region, and at least one of the electrically conductive layers (46a-46h) in the stack (32a-32h, 46a-46h) can comprise, or can be electrically connected to, a word line of the NAND device. The device region can include a plurality of semiconductor channels 9 See FIGS. 1A, 1B, 2A, and 2B). At least one end portion of each of the plurality of semiconductor channels extends substantially perpendicular to a top surface of the semiconductor substrate. The device region further includes a plurality of charge storage regions located within each memory layer. Each charge storage region is located adjacent to a respective one of the plurality of semiconductor channels. The device region further includes a plurality of control gate electrodes having a strip shape extending substantially parallel to the top surface of the substrate 100. The plurality of control gate electrodes comprise at least a first control gate electrode located in the first device level and a second control gate electrode located in the second device level. The plurality of electrically conductive layers (46a-46h) in the stack (32a-32h, 46a-46h) can be in electrical contact with, or can comprise, the plurality of control gate electrodes, and extends from the device region to a contact region including a plurality of electrically conductive contact via structures.

In case the exemplary structure includes a three-dimensional NAND device, a stack (32a-32h, 46a-46h) of an alternating plurality of word lines (46a-46h) and insulating layers (32a-32h) can be located over a semiconductor substrate. Each of the word lines (46a-46h) and insulating layers (32a-32h) is located at different levels that are vertically spaced from a top surface of the semiconductor substrate by different distances.

In a non-limiting illustrative example, the insulating layers (32a-32h) can comprise silicon oxide layers, the plurality of word lines (46a-46h) can comprise tungsten or a combination of titanium nitride and tungsten, the at least one charge storage region can comprises a tunneling dielectric, a blocking dielectric layer, and either a plurality of floating gates or a charge trapping layer located between the tunneling dielectric layer and the blocking dielectric layer. An end portion of each of the plurality of word lines (46a-46h) in a device region can comprise a control gate electrode located adjacent to the at least one charge storage region. A plurality of contact via structures contacting the word lines (46a-46h) can be located in a contact region. The plurality of word lines (46a-46h) extends from the device region to the contact region. A backside contact via structure can be provided, which can be a source line that extends through a dielectric insulated trench, i.e., the backside contact trench filled with a dielectric spacer and the backside contact via structure, in the stack to electrically contact a source region located in the substrate 100. The source region can be in contact with the horizontal portion of the semiconductor channel in an upper portion of a substrate semiconductor layer. A drain line, as embodied as a conductive line structure that contacts a drain contact via structure, electrically contacts an upper portion of the semiconductor channel. As used herein, a first element "electrically contacts" a second element if the first element is electrically shorted to the second element.

In one embodiment, the exemplary structure can include a three-dimensional resistive random access memory (ReRAM) device, and at least one of the electrically conductive layers (46a-56h) in the stack (32a-32h, 46a-46h) can comprise, or can be electrically connected to, an electrode of the ReRAM device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A method of fabricating a multilevel structure, comprising:
   forming a stack including an alternating plurality of electrically conductive layers and electrically insulating layers over a substrate;
   forming a recessed region through the stack, wherein top surfaces of a first set of electrically conductive layers located at different levels are physically exposed within the recessed region;
   forming a first electrically conductive spacer directly on the top surfaces of the first set of electrically conductive layers within the recessed region; and
   forming at least one trench isolation structure extending through the stack, wherein the at least one trench isolation structure divides the first electrically conductive spacer into a plurality of electrically conductive via connections.

2. The method of claim 1, wherein the plurality of electrically conducive via connections is formed with top surfaces located within a same horizontal plane, and with bottom surfaces contacting a respective electrically conductive layer located at different levels.

3. The method of claim 1, wherein the recessed region is formed by sequentially performing multiple combinations of a lithographic patterning process and an etch process employing different patterns for opening in each respective photoresist layer, wherein a depth of recess in the recessed region differs depending on different overlap patterns among the openings of different photoresist layers.

4. The method of claim 3, wherein each etch process within the multiple combinations through a different number of electrically insulating layers.

5. The method of claim 4, wherein numbers of electrically insulating layers that are etched through per etch process within the multiple combinations include at least 1, 2, and 4.

6. The method of claim 1, further comprising forming a first stepped dielectric spacer on the top surfaces of the first set of electrically conductive layers and on a sidewall of the recessed region, wherein the first electrically conductive spacer is formed on an outer sidewall of the first stepped dielectric spacer.

7. The method of claim 6, wherein the first stepped dielectric spacer is formed by:
forming a first conformal dielectric layer over the stack and on a sidewall of the recessed region; and
removing horizontal portions of the first conformal dielectric layer by an anisotropic etch, wherein a remaining portion of the first conformal dielectric layer constitutes the first stepped dielectric spacer.

8. The method of claim 7, wherein the first stepped dielectric spacer has a plurality of top surfaces that are vertically offset among one another.

9. The method of claim 6, further comprising forming a second stepped dielectric spacer on top surfaces of a second set of electrically conductive layers located at different levels that are present below the bottommost surface of the first stepped dielectric spacer, and on sidewalls of the first electrically conductive spacer.

10. The method of claim 9, further comprising forming a second electrically conductive spacer on the top surfaces of the second set of electrically conductive layers, and on sidewalls of the second stepped dielectric spacer.

11. The method of claim 1, wherein physically exposed surfaces of the first set of electrically conductive layers form a set of stepped surfaces prior to formation of the first electrically conductive spacer.

12. The method of claim 11, further comprising recessing portions of the set of stepped surfaces that do not underlie the first electrically conductive spacer to form another set of stepped surfaces including top surfaces of a second set of electrically conductive layers that underlie the first set of electrically conductive layers.

13. The method of claim 12, further comprising forming a first stepped dielectric spacer on top surfaces of the first set of electrically conductive layers and on a sidewall of the recessed region, wherein the first electrically conductive spacer is formed on an outer sidewall of the first stepped dielectric spacer.

14. The method of claim 13, further comprising forming a second electrically conductive spacer on the top surfaces of the second set of electrically conductive layers.

15. The method of claim 1, further comprising forming a dielectric material portion over the first electrically conductive spacer, wherein each of the at least one trench isolation structure is formed through a portion of the dielectric material portion.

16. The method of claim 1, wherein the plurality of electrically conductive via connections includes an m ×n two-dimensional array of electrically conductive via connections that are spaced from one another by a plurality of trench isolation structures along one horizontal direction and by a set of dielectric spacers having a same composition and a same thickness along another direction, wherein m is an integer greater than 1, and n is an integer greater than 2.

17. The method of claim 16, wherein each electrically conductive via connection within the m ×n two-dimensional array of electrically conductive via connections contacts a top surface of a respective electrically conductive layer located at levels that are different from one another.

18. The method of claim 1, further comprising forming a device on the substrate, wherein:
the device comprises a vertical NAND device; and
at least one of the plurality electrically conductive layers in the stack comprises or is electrically connected to a word line of the NAND device.

19. The method of claim 18, wherein:
the device region comprises:
a plurality of semiconductor channels, wherein at least one end portion of each of the plurality of semiconductor channels extends substantially perpendicular to a top surface of the substrate;
a plurality of charge storage regions, each charge storage region located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in a first device level and a second control gate electrode located in a second device level; and
a plurality of electrically conductive layers in the stack comprises, or is in electrical contact with, the plurality of control gate electrode and extends from the device region to a contact region including the plurality of electrically conductive via connections.

20. The method of claim 18, wherein:
the device comprises a three-dimensional ReRAM device; and
at least one of the electrically conductive layers in the stack comprises, or is electrically connected to, an electrode of the ReRAM device.

21. The method of claim 1, wherein:
bottom surfaces of the first electrically conductive spacer physically contact the top surfaces of the first set of electrically conductive layers; and
the bottom surfaces of the first electrically conductive spacer are vertically spaced from a top surface of the substrate by different distances.

22. The method of claim 1, wherein the at least one trench isolation structure physically contacts remaining portions of the first electrically conductive spacer upon formation of the at least one trench isolation structure.

23. The method of claim 1, further comprising forming at least one trench through the first electrically conductive spacer and through a portion of the stack employing an anisotropic etch process that etches materials of the first electrically conductive spacer and the stack.

24. The method of claim 23, further comprising depositing a dielectric material directly on sidewalls of the electrically conductive layers and sidewalls of remaining portions of the first electrically conductive spacer, wherein each of the at least one trench isolation structure comprises a portion of the deposited dielectric material.

25. The method of claim 1, further comprising anisotropically etching portions of the first electrically conductive spacer, wherein each remaining portion of the first electrically conductive spacer after the anisotropic etch constitutes the plurality of electrically conductive via connections.

26. The method of claim 1, wherein each of the plurality electrically conductive via connections extends vertically from a horizontal plane located above a topmost electrically conductive layer within the stack to a top surface of a respective electrically conductive layer within the stack.

27. The method of claim 1, wherein the first electrically conductive spacer has multiple bottom surfaces located at different levels and contacting respective top surfaces of a subset of the electrically conductive layers within the stack.

28. A method of fabricating a multilevel structure, comprising:
  forming a stack including an alternating plurality of electrically conductive layers and electrically insulating layers over a substrate;
  forming a recessed region through the stack, wherein top surfaces of a first set of electrically conductive layers located at different levels are physically exposed within the recessed region;
  forming a first conformal layer of electrically conductive material directly on a first sidewall of a first electrically insulating layer and directly on an exposed portion of a first electrically conductive layer that underlies the first electrically insulating layer;
  etching horizontal portions of the first conformal layer to form a first electrically conductive spacer adjacent to the first sidewall and to physically expose a portion of a second electrically insulating layer located under the first electrically conductive layer, wherein the exposed portion extends laterally past the first electrically conductive spacer;
  forming a first conformal insulating layer of an electrically insulating material over the first electrically conductive spacer and the exposed portion of the second electrically insulating layer; and
  etching horizontal portions of the first conformal insulating layer to form a first electrically insulating sidewall spacer adjacent to the first electrically conductive spacer, and to expose a portion of a second electrically conductive layer underlying the second electrically insulating layer.

29. The method of claim 28, wherein:
  bottom surfaces of the first electrically conductive spacer physically contact the top surfaces of the first set of electrically conductive layers; and
  the bottom surfaces of the first electrically conductive spacer are vertically spaced from a top surface of the substrate by different distances.

30. The method of claim 28, wherein the at least one trench isolation structure physically contacts remaining portions of the first electrically conductive spacer upon formation of the at least one trench isolation structure.

31. The method of claim 28, further comprising further comprising forming at least one trench through the first electrically conductive spacer and through a portion of the stack employing an anisotropic etch process that etches materials of the first electrically conductive spacer and the stack.

32. The method of claim 31, further comprising depositing a dielectric material directly on sidewalls of the electrically conductive layers and sidewalls of remaining portions of the first electrically conductive spacer, wherein each of the at least one trench isolation structure comprises a portion of the deposited dielectric material.

33. The method of claim 28, further comprising anisotropically etching portions of the first electrically conductive spacer, wherein each remaining portion of the first electrically conductive spacer after the anisotropic etch constitutes the plurality of electrically conductive via connections.

34. The method of claim 28, wherein each of the plurality electrically conductive via connections extends vertically from a horizontal plane located above a topmost electrically conductive layer within the stack to a top surface of a respective electrically conductive layer within the stack.

35. The method of claim 28, wherein the first electrically conductive spacer has multiple bottom surfaces located at different levels and contacting respective top surfaces of a subset of the electrically conductive layers within the stack.

* * * * *